(12) United States Patent
Kitayama et al.

(10) Patent No.: US 9,196,206 B2
(45) Date of Patent: Nov. 24, 2015

(54) LIQUID CRYSTAL DISPLAY

(75) Inventors: Masae Kitayama, Osaka (JP); Fumikazu Shimoshikiryoh, Osaka (JP); Kentaroh Irie, Osaka (JP); Toshihide Tsubata, Osaka (JP); Naoshi Yamada, Osaka (JP); Hidetoshi Nakagawa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 804 days.

(21) Appl. No.: 12/451,074

(22) PCT Filed: Apr. 22, 2008

(86) PCT No.: PCT/JP2008/001048
§ 371 (c)(1),
(2), (4) Date: Oct. 26, 2009

(87) PCT Pub. No.: WO2008/139693
PCT Pub. Date: Nov. 20, 2008

(65) Prior Publication Data
US 2010/0097366 A1    Apr. 22, 2010

(30) Foreign Application Priority Data

Apr. 26, 2007 (JP) ................................. 2007-117606
Oct. 5, 2007 (JP) ................................. 2007-262695

(51) Int. Cl.
*G09G 3/36* (2006.01)
*G02F 1/1337* (2006.01)
*G02F 1/1362* (2006.01)

(52) U.S. Cl.
CPC ............ *G09G 3/3655* (2013.01); *G09G 3/3677* (2013.01); *G02F 1/1362* (2013.01);

(Continued)

(58) Field of Classification Search
CPC .............................................. G09G 2310/0227
See application file for complete search history.

(56) References Cited

U.S. PATENT DOCUMENTS 4,602,292 A * 7/1986 Togashi et al. ................. 348/792
5,058,994 A * 10/1991 Mihara et al. .................... 345/97

(Continued)

FOREIGN PATENT DOCUMENTS

CN     1932594         3/2007
EP     1 383 105 A2    1/2004

(Continued)

OTHER PUBLICATIONS

International Preliminary Report on Patentability dated Nov. 19, 2009.

(Continued)

*Primary Examiner* — Antonio Xavier
(74) *Attorney, Agent, or Firm* — Harness, Dickey & Pierce, P.L.C.

(57) ABSTRACT

In one embodiment of the present invention, each pixel includes first and second subpixels. CS bus lines connected to the respective storage capacitors of the first and second subpixels are electrically independent of each other. A CS voltage has a waveform that inverts its polarity at least once a frame, which includes a first subframe for sequentially scanning a series of odd rows and a second SF for sequentially scanning even rows that have been skipped during the first SF. A source signal voltage varies so as to have two frames or subframes with mutually opposite polarities. A CS voltage has a waveform that has quite opposite consequences on the effective voltage of a subpixel of a pixel connected to the $j^{th}$ scan line to be selected during the first subframe and on that of another subpixel of a pixel connected to the $(j+1)^{th}$ scan line to be selected during the second subframe. In this manner, the deterioration in display quality, which would be caused if either a source line inversion drive or a block inversion drive is applied to a multi-pixel technology, can be minimized.

14 Claims, 44 Drawing Sheets

(52) U.S. Cl.
CPC ..... *G02F1/133707* (2013.01); *G02F 2201/122* (2013.01); *G02F 2201/123* (2013.01); *G09G 3/3614* (2013.01); *G09G 3/3666* (2013.01); *G09G 2300/0443* (2013.01); *G09G 2300/0447* (2013.01); *G09G 2300/0876* (2013.01); *G09G 2310/0224* (2013.01); *G09G 2310/08* (2013.01)

(56) References Cited

U.S. PATENT DOCUMENTS

| | | | |
|---|---|---|---|
| 5,119,085 A * | 6/1992 | Yamazaki | 345/96 |
| 5,182,549 A * | 1/1993 | Taniguchi et al. | 345/97 |
| 5,325,411 A | 6/1994 | Orisaka | |
| 5,576,729 A | 11/1996 | Yamazaki | |
| 5,767,832 A * | 6/1998 | Koyama et al. | 345/103 |
| 5,929,831 A * | 7/1999 | Aratani et al. | 345/97 |
| 5,982,347 A * | 11/1999 | Shigeta et al. | 345/88 |
| 6,057,824 A * | 5/2000 | Katakura et al. | 345/100 |
| 6,172,662 B1 * | 1/2001 | Ito et al. | 345/94 |
| 6,278,423 B1 * | 8/2001 | Wald et al. | 345/76 |
| 6,327,008 B1 * | 12/2001 | Fujiyoshi | 349/106 |
| 6,380,919 B1 * | 4/2002 | Koyama et al. | 345/92 |
| 6,724,452 B1 | 4/2004 | Takeda et al. | |
| 6,958,791 B2 | 10/2005 | Shimoshikiryo | |
| 7,079,214 B2 | 7/2006 | Shimoshikiryo | |
| 7,154,464 B2 | 12/2006 | Lee et al. | |
| 7,327,345 B2 * | 2/2008 | Lefley et al. | 345/100 |
| 7,355,666 B2 | 4/2008 | Song et al. | |
| 8,362,999 B2 * | 1/2013 | Huang et al. | 345/100 |
| 2001/0017612 A1 * | 8/2001 | Holtslag et al. | 345/103 |
| 2002/0000982 A1 | 1/2002 | Takagi | |
| 2002/0021274 A1 | 2/2002 | Koyama et al. | |
| 2002/0047822 A1 | 4/2002 | Senda et al. | |
| 2002/0084959 A1 * | 7/2002 | Park et al. | 345/87 |
| 2002/0154085 A1 * | 10/2002 | Kim | 345/96 |
| 2002/0180717 A1 * | 12/2002 | Ishiyama | 345/204 |
| 2003/0006954 A1 * | 1/2003 | Iba | 345/90 |
| 2003/0169379 A1 * | 9/2003 | Tsumura et al. | 349/42 |
| 2003/0227429 A1 | 12/2003 | Shimoshikiryo | |
| 2004/0012554 A1 | 1/2004 | Song et al. | |
| 2004/0041760 A1 * | 3/2004 | Tsumura et al. | 345/87 |
| 2004/0066363 A1 * | 4/2004 | Yamano et al. | 345/98 |
| 2004/0119924 A1 | 6/2004 | Takeda et al. | |
| 2004/0160406 A1 * | 8/2004 | Yamazaki et al. | 345/100 |
| 2004/0183768 A1 | 9/2004 | Yamato et al. | |
| 2004/0207777 A1 | 10/2004 | Hiroki et al. | |
| 2005/0007329 A1 | 1/2005 | Hiroki et al. | |
| 2005/0077842 A1 | 4/2005 | Boke et al. | |
| 2005/0093796 A1 * | 5/2005 | Fergason | 345/88 |
| 2005/0122441 A1 | 6/2005 | Shimoshikiryoh | |
| 2005/0146490 A1 * | 7/2005 | Kang et al. | 345/76 |
| 2005/0166237 A1 * | 7/2005 | Kawakami | 725/50 |
| 2005/0213015 A1 | 9/2005 | Shimoshikiryo | |
| 2005/0264702 A1 * | 12/2005 | Yoshii | 348/687 |
| 2005/0280749 A1 * | 12/2005 | Jung et al. | 349/43 |
| 2006/0012555 A1 * | 1/2006 | Tokumura | 345/98 |
| 2006/0180813 A1 | 8/2006 | Kim et al. | |
| 2006/0181499 A1 * | 8/2006 | Li et al. | 345/100 |
| 2007/0018928 A1 * | 1/2007 | Ludden | 345/96 |
| 2007/0057297 A1 | 3/2007 | Kim | |
| 2007/0063952 A1 | 3/2007 | Oku et al. | |
| 2007/0085936 A1 * | 4/2007 | Callison et al. | 348/744 |
| 2007/0103425 A1 * | 5/2007 | Tanaka et al. | 345/102 |
| 2007/0120803 A1 * | 5/2007 | Nakamura et al. | 345/98 |
| 2007/0139356 A1 * | 6/2007 | Lee et al. | 345/103 |
| 2007/0164957 A1 * | 7/2007 | Hsieh et al. | 345/90 |
| 2007/0195157 A1 | 8/2007 | Kasai | |
| 2007/0201824 A1 * | 8/2007 | Masaki et al. | 386/83 |
| 2007/0201841 A1 * | 8/2007 | Miura et al. | 386/125 |
| 2007/0222733 A1 * | 9/2007 | Ju et al. | 345/98 |
| 2008/0012819 A1 * | 1/2008 | Lee et al. | 345/100 |
| 2008/0074445 A1 * | 3/2008 | Ochi et al. | 345/690 |
| 2008/0084379 A1 * | 4/2008 | Takahashi et al. | 345/92 |
| 2008/0106657 A1 * | 5/2008 | Kitayama et al. | 349/37 |
| 2008/0106660 A1 | 5/2008 | Kitayama et al. | |
| 2008/0165298 A1 | 7/2008 | Song et al. | |
| 2009/0040242 A1 * | 2/2009 | Tomizawa et al. | 345/690 |
| 2009/0046048 A1 | 2/2009 | Shimoshikiryoh | |
| 2009/0059581 A1 * | 3/2009 | Hayashi et al. | 362/234 |
| 2009/0085860 A1 * | 4/2009 | Huang et al. | 345/102 |
| 2009/0179875 A1 * | 7/2009 | Li et al. | 345/204 |

FOREIGN PATENT DOCUMENTS

| | | | |
|---|---|---|---|
| JP | 08-202317 | | 8/1996 |
| JP | 08-320674 | | 12/1996 |
| JP | 11-242225 | | 9/1999 |
| JP | 11-352938 | | 12/1999 |
| JP | 2001-051252 | | 2/2001 |
| JP | 2003-066928 | | 3/2003 |
| JP | 2004-054295 | | 2/2004 |
| JP | 2004-062146 | | 2/2004 |
| JP | 2004-287087 | | 10/2004 |
| JP | 2005-189804 | | 7/2005 |
| JP | 2006-171342 | | 6/2006 |
| JP | 2006-221182 | | 8/2006 |
| WO | WO 2006/070829 | | 7/2006 |
| WO | WO2006/098448 | * | 9/2006 ............ G02F 1/133 |

OTHER PUBLICATIONS

International Search Report dated Jul. 29, 2008.
PCT Search Reprt dated Jul. 29, 2008 for a corresponding application for co-pending U.S. Appl. No. 12/451,092.
U.S. Office Action mailed Aug. 2, 2012 for U.S. Appl. No. 12/451,092.

* cited by examiner

*FIG.9*
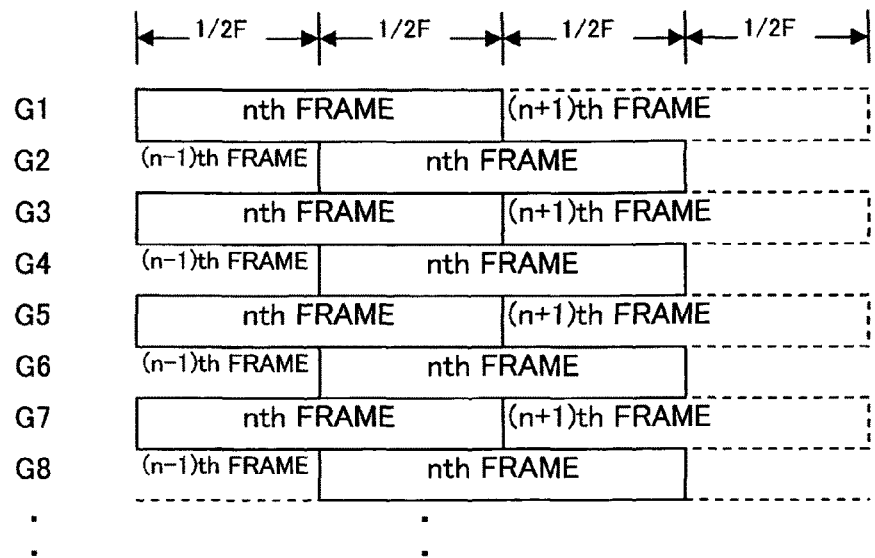
*FIG.10*
(a) STILL
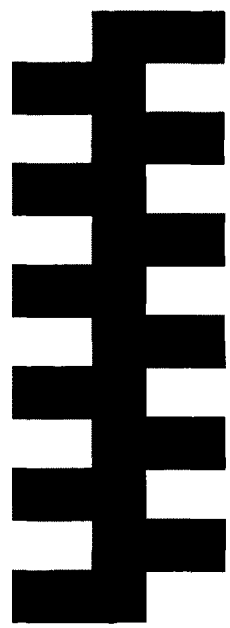
(b) MOVE HORIZONTALLY

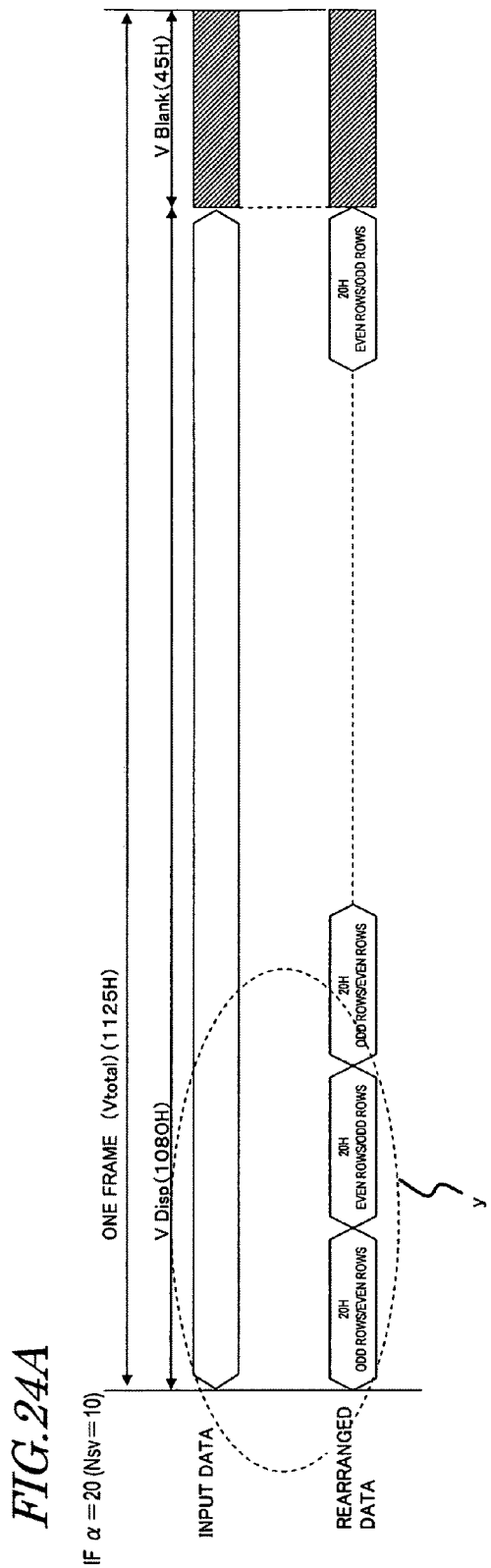

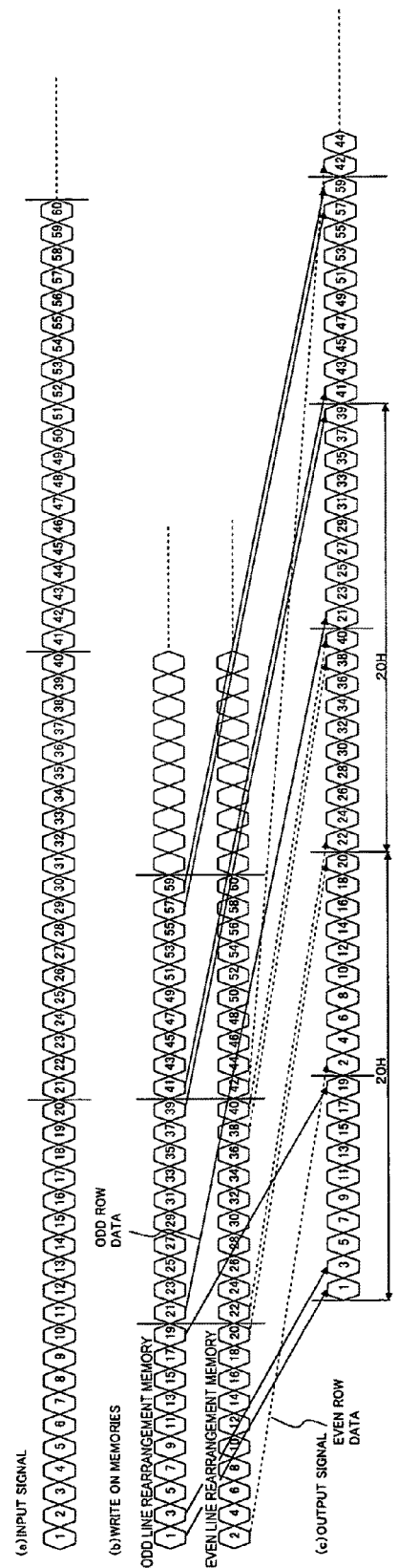

LIQUID CRYSTAL DISPLAY

TECHNICAL FIELD

The present invention relates to a liquid crystal display device and more particularly relates to a liquid crystal display device that exhibits a wide viewing angle characteristic using a multi-pixel structure.

BACKGROUND ART

Recently, a multi-domain vertical aligned (MVA) mode LCD has been developed as a liquid crystal display device with improved viewing angle characteristic and used in LCD TV sets, among other things. A VA mode LCD conducts a display operation in normally black mode by using, in combination, a vertical alignment liquid crystal layer, in which liquid crystal molecules are aligned perpendicularly to the substrate surface when no voltage is applied thereto, and two polarizers that are arranged as crossed Nicols with the liquid crystal layer interposed between them.

As disclosed in Patent Document No. 1, an MVA mode LCD defines the falling directions of liquid crystal molecules upon the application of a voltage by providing linear domain regulating means on both sides of the liquid crystal layer, thereby defining multiple domains in which the liquid crystal molecules have mutually different alignment directions (also called "directors") in a single pixel (which is a so-called "multi-domain structure"). Such a structure in which multiple domains with mutually different alignment directions are defined in a single pixel is sometimes called an "alignment division structure". Among various multi-domain structures, a four-domain structure is most popular. In that case, the four alignment directions are arranged so as to evenly split the angle defined by the respective axes of polarization of the two polarizers that are arranged as crossed Nicols. By adopting such a multi-domain structure, a wide viewing angle is realized.

A technique for reducing the viewing angle dependence of the γ characteristic of an MVA mode LCD is disclosed in Patent Document No. 2. The "γ characteristic" refers to the grayscale dependence of a display luminance. That is to say, if the γ characteristic has viewing angle dependence, it means that the display luminance will vary depending on whether an image with a certain grayscale is viewed straight or obliquely. Such a variation in display luminance corresponding to grayscale according to the viewing direction would be a problem particularly when a still picture such as a photo or a TV broadcast is presented on the LCD.

According to the technique disclosed in Patent Document No. 2, each pixel has at least first and second subpixels that can exhibit mutually different luminances at a certain grayscale. Thus, such a technique is called a "pixel division (or multi-pixel) technique" and such an LCD is termed an LCD with a "pixel division (or multi-pixel) structure".

Hereinafter, an MVA mode LCD with a conventional multi-pixel structure will be described with reference to FIG. 41, which schematically illustrates the structure of two pixels that are adjacent to each other in the column direction in a huge number of pixels that are arranged in columns and rows to define a matrix pattern. The basic configuration of the present invention is identical with this structure. And the following statement will apply to the liquid crystal display device of the present invention, too.

Each pixel P of this liquid crystal display device 900 has two subpixels (which will be referred to herein as a "first subpixel SP-1" and a "second subpixel SP-2", respectively).

The LCD 900 further includes: a plurality of source bus lines (S bus lines), each of which is associated with a particular column of pixels; a plurality of gate bus lines (G bus lines), each of which is associated with a particular row of pixels; a plurality of TFTs, each of which is associated with one of the first and second subpixels SP-1 and SP-2 in an associated one of the pixels; and a plurality of CS bus lines, each of which is associated with either the respective first subpixels SP-1 or the respective second subpixels SP-2 on a particular row of pixels.

For example, an S bus line (i) is associated with an $i^{th}$ column of pixels, a G bus line (j) is associated with a $j^{th}$ row of pixels, TFT-1 is associated with the first subpixel SP-1 and TFT-2 is associated with the second subpixel SP-2. The respective gate electrodes of TFT-1 and TFT-2 are both connected to the same G bus line in common and have their ON and OFF states controlled with the same gate signal voltage applied. The respective source electrodes of TFT-1 and TFT-2 are both connected to the same S bus line in common. And when TFT-1 and TFT-2 are turned ON, a source signal voltage is written through the same S bus line on the first and second subpixels SP-1 and SP-2. The multiple pixels that form the display area of the liquid crystal display device are scanned with the gate signal voltage supplied to each of those G bus lines.

Each of the first and second subpixels SP-1 and SP-2 that each pixel P has includes a liquid crystal capacitor and a storage capacitor. The liquid crystal capacitor is formed by a subpixel electrode, the liquid crystal layer, and a counter electrode that faces the subpixel electrode through the liquid crystal layer. The storage capacitor is formed by a storage capacitor electrode that is electrically connected to the subpixel electrode, an insulating layer (such as a gate insulating film), and a storage capacitor counter electrode that faces the storage capacitor electrode with the insulating layer interposed between them. Optionally, the storage capacitor electrode could the subpixel electrode itself. Also, the storage capacitor counter electrode could form part of a CS bus line (which will also be referred to herein as a "storage capacitor line"). In FIG. 41, each subpixel electrode is connected to the drain electrode of its associated TFT and is arranged so as to partially overlap with its associated CS bus line, thereby forming each storage capacitor.

For instance, the first subpixels SP-1 of the $j^{th}$ row of pixels are associated with a CS bus line CS-A and the second subpixels SP-2 of the $j^{th}$ row of pixels are associated with a CS bus line CS-B. These CS bus lines CS-A and CS-B are electrically independent of each other. That is why by controlling the CS voltages (which will also be referred to herein as "storage capacitor voltages") supplied through the CS bus lines CS-A and CS-B, the first and second subpixels SP-1 and SP-2 can exhibit mutually different luminances as will be described later.

As an example, a situation where a write pulse (which will be referred to herein as "gate ON pulse Pw") is applied to the G bus line (j) and a positive source signal voltage is written on a pixel at the intersection between the $j^{th}$ row and $i^{th}$ column will be described. It should be noted that in this description, the polarity of each of various kinds of voltages is defined with, respect to the counter voltage unless stated otherwise. Nevertheless, the reference voltage to determine the polarity does not have to perfectly agree with the counter voltage in a strict sense. On the other hand, the polarity of a CS voltage is determined with respect to the center value of the CS voltage. Furthermore, the "inversion of the polarity" of a CS voltage refers to not only a simple inversion of the polarity of the CS voltage into a positive or negative one but also a change of a CS voltage level toward the positive or negative side as well. The center value of a CS voltage typically agrees with, but does not always have to agree with, the counter voltage.

With TFT-1 and TFT-2 turned ON, a positive source signal voltage is written on the pixel at the intersection between the $j^{th}$ row and the $i^{th}$ column. After that, the CS voltage applied through the CS bus line CS-A to the storage capacitor of the first subpixel SP-1 is controlled such that its first change of voltage levels after TFT-1 has been turned OFF is a voltage increase. On the other hand, the CS voltage applied through the CS bus line CS-B to the storage capacitor of the second subpixel SP-2 is controlled such that its first change of voltage levels after TFT-2 has been turned OFF is a voltage decrease. That is to say, CS voltages with such waveforms are supplied through the CS bus lines CS-A and CS-B. With a positive source signal voltage written on the liquid crystal capacitor of the first subpixel SP-1, if the CS voltage supplied through the CS bus line CS-A after TFT-1 has been turned OFF increases, then the voltage at the liquid crystal capacitor of the first subpixel SP-1 is subjected to a voltage pull-up and rises. Consequently, the first subpixel SP-1 becomes a bright subpixel, of which the luminance is higher than the one associated with the source signal voltage supplied. On the other hand, if the CS voltage supplied through the CS bus line CS-B after TFT-2 has been turned OFF decreases, then the voltage at the liquid crystal capacitor of the second subpixel SP-2 is subjected to a voltage pull-down and falls. Consequently, the second subpixel SP-1 becomes a dark subpixel, of which the luminance is lower than the one associated with the source signal voltage supplied. In this manner, by displaying the luminance associated with the voltage supplied as the average of two mutually different luminances (i.e., an area average), or by superposing mutually different voltage-luminance characteristics (which will be sometimes referred to herein as "V-T characteristics") of two subpixels one upon the other, the viewing angle dependence of the γ characteristic can be reduced.

In a liquid crystal display device with such a multi-pixel structure, a voltage, of which the waveform has a period that oscillates in a constant cycle time (and which will be simply referred to herein as an "oscillating voltage") is used as the CS voltage. In that case, the bigger the size of a liquid crystal display device, the greater the load capacitance and resistance on a CS bus line. If one CS voltage cycle time is relatively short (e.g., equal to or shorter than one horizontal scanning period), then the waveform of the CS voltage will get blunted to a different degree according to the location within the display area. As a result, the display luminance will depend on the location within the display area, thus possibly making the luminances uneven. Patent Document No. 3 discloses a technique for minimizing or eliminating the occurrence of such luminance unevenness by extending one oscillation period of the CS voltage. The entire disclosures of Patent Documents Nos. 1 to 3 are hereby incorporated by reference.

If the voltages supplied to respective CS bus lines are controlled independently of each other, then the circuit configuration will get complicated but the waveforms of those CS voltages can be determined much more flexibly. That is to say, in that case, the CS voltages do not have to be oscillating voltages but may be determined so as to obtain desired effective values.

Meanwhile, a source line inversion drive method is known as a technique for cutting down the power dissipation of a driver for a liquid crystal display device (see Patent Document No. 4, for example). According to the source line inversion drive method, a source signal voltage of the same polarity is written on the same column of pixels (i.e., pixels that are connected to the same source bus line) among a plurality of pixels arranged in a matrix pattern as shown in FIG. 42. Meanwhile, to achieve uniformity on the display screen, voltages of mutually opposite polarities are supposed to be written on each pair of pixels that are adjacent to each other in the row direction. With this source line inversion drive method, the polarity of the source signal voltage needs to be inverted a much smaller number of times than a so-called "dot inversion drive method" in which source signal voltages of mutually opposite polarities are supposed to be written on every pair of pixels that are adjacent to each other in a column or row direction. As a result, the power dissipation can be cut down.

Furthermore, Patent Document No. 5 discloses a drive method in which scan lines (corresponding to gate bus lines and rows of pixels) are classified into multiple blocks, interlaced scanning is performed within each of those blocks but sequential scanning is performed between blocks, thereby supplying a data signal, which has had its order rearranged in line with the order of scanning of a scan signal, to a signal line driver (which will be referred to herein as a "block inversion drive method"). If such a block inversion drive method is adopted, the power dissipation can be reduced by lowering the polarity inversion drive frequency of the source signal voltage. On top of that, a flicker, crosstalk, vertical luminance gradient (in the column direction), interference to be caused due to interlaced scanning while a moving picture is presented (as horizontal comb contour) and other inconveniences can be eliminated. Nevertheless, if the block inversion drive is performed, the luminance may still get uneven between rows of pixels that are adjacent to each other in the column direction (i.e., along source bus lines) as will be described in detail later.

Patent Document No. 1: Japanese Patent Application Laid-Open Publication No. 11-242225
Patent Document No. 2: Japanese Patent Application Laid-Open Publication No. 2004-62146
Patent Document No. 3: Japanese Patent Application Laid-Open Publication No. 2005-189804
Patent Document No. 4: Japanese Patent Application Laid-Open Publication No. 8-202317
Patent Document No. 5: Japanese Patent Application Laid-Open Publication No. 11-352938

DISCLOSURE OF INVENTION

Problems to be Solved by the Invention

However, the present inventors discovered via experiments that when the source line inversion drive method (see Patent Document No. 2, for example) was applied to the multi-pixel technology described above, the image on the screen looked jaggy. We also discovered that when the block inversion drive technique (see Patent Document No. 5) was simply applied to the multi-pixel technology, the order of bright and dark subpixels of two pixels that were adjacent to each other vertically (i.e., in the column direction) in a boundary between blocks reversed to produce unevenness in the form of blocks.

It is therefore an object of the present invention to provide a liquid crystal display device that can minimize such deterioration in display quality even when the source line inversion drive method or the block inversion drive method is applied to the multi-pixel technology. Another object of the present invention is to provide a liquid crystal display device that can eliminate the occurrence of luminance unevenness, which would be produced on every pair of pixel rows that are adjacent to each other in the column direction (i.e., along source bus lines) when the block inversion drive method is adopted.

Means for Solving the Problems

A liquid crystal display device according to a first aspect of the present invention includes: a number of pixels that are arranged in columns and rows to form a matrix pattern, each said pixel including first and second subpixels that are able to exhibit mutually different luminances at least at a certain grayscale; a plurality of source bus lines, each of which is associated with one of the columns of pixels; a plurality of gate bus lines, each of which is associated with one of the rows of pixels; a plurality of TFTs, each of which is associated with one of the first and second subpixels of an associated one of the pixels; and a plurality of CS bus lines, each of which is associated with either the respective first subpixels or the respective second subpixels of one of the rows of pixels. Each of the first and second subpixels includes a liquid crystal capacitor and a storage capacitor. The CS bus lines connected to the respective storage capacitors of the first and second subpixels are electrically independent of each other. The pixels are scanned by supplying gate signal voltages to the respective gate bus lines. A CS voltage supplied to each said CS bus line has a waveform, of which the polarity changes at least once a vertical scanning period. Each said vertical scanning period has multiple vertical scanning sub-periods including a first vertical scanning sub-period for sequentially scanning a series of odd or even rows of pixels and a second vertical scanning sub-period, which is continuous with the first vertical scanning sub-period, for sequentially scanning even or odd rows of pixels that have been skipped during the first vertical scanning sub-period. The polarity of a source signal voltage supplied to each said source bus line changes in a predetermined sequence, which includes a series of two vertical scanning periods or sub-periods in which the source signal voltage has mutually opposite polarities. The CS voltage has a waveform that alternately performs the function of increasing or decreasing the effective voltage of one of two subpixels, which is associated with a CS bus line supplied with the CS voltage, in each of pixels that are connected to a $j^{th}$ gate bus line to be selected during the first vertical scanning sub-period, and the function of increasing or decreasing the effective voltage of one of two subpixels, which is associated with a CS bus line supplied with the CS voltage, in each of pixels that are connected to a $(j+1)^{th}$ gate bus line to be selected during the second vertical scanning sub-period.

In one preferred embodiment, the sequence of the source signal voltage includes a series of two vertical scanning periods in which the source signal voltage has mutually opposite polarities. The source signal voltage keeps the same polarity through the first and second vertical scanning sub-periods of the same vertical scanning period. The CS voltage inverts its polarity an odd number of times since a gate signal voltage supplied to the $j^{th}$ gate bus line has changed from high into low during the first vertical scanning sub-period and until a gate signal voltage supplied to the $(j+1)^{th}$ gate bus line changes from high into low during the second vertical scanning sub-period.

In another preferred embodiment, the sequence of the source signal voltage includes a series of two vertical scanning sub-periods in which the source signal voltage has mutually opposite polarities. The source signal voltage has mutually opposite polarities in the first and second vertical scanning sub-periods of the same vertical scanning period. The CS voltage inverts its polarity an even number of times since a gate signal voltage supplied to the $j^{th}$ gate bus line has changed from high into low during the first vertical scanning sub-period and until a gate signal voltage supplied to the $(j+1)^{th}$ gate bus line changes from high into low during the second vertical scanning sub-period. In this case, the polarity may change zero times. That is to say, the "even" number of times could be zero times.

In this particular preferred embodiment, the CS voltage inverts its polarity an even number of times, which is at least twice, since the gate signal voltage supplied to the $j^{th}$ gate bus line has changed from high into low during the first vertical scanning sub-period and until the gate signal voltage supplied to the $(j+1)^{th}$ gate bus line changes from high into low during the second vertical scanning sub-period. Once a predetermined voltage has been applied to the $(j+1)^{th}$ row of pixels, the CS voltage level stays at the center level thereof.

In still another preferred embodiment, every odd or even row of pixels are scanned during the first vertical scanning sub-period and the rest of the odd or even rows of pixels that have not been scanned yet are scanned during the second vertical scanning sub-period.

In yet another preferred embodiment, the CS bus lines include at least one CS bus line that is associated in common with two subpixels that belong to two different pixels and that are adjacent to each other in the column direction.

In yet another preferred embodiment, the CS voltage has a waveform, a part of which oscillates in a period that is a positive integral number of times as long as one horizontal scanning period. Each said vertical scanning sub-period is a period for scanning a series of Nsv ($=\alpha/2$) odd or even rows of pixels. If one period of the CS voltage is represented by M×H where H is one horizontal scanning period and M is a positive integer, Nsv is a positive integral number of times as large as M/2.

In this particular preferred embodiment, each said vertical scanning period includes not only the first and second vertical scanning sub-periods but also third and fourth vertical scanning sub-periods that are continuous with the second and third vertical scanning sub-periods, respectively. The third vertical scanning sub-period is a period for sequentially scanning a series of Nsv odd or even rows of pixels, beginning with an odd or even row continuously with the last odd or even row that has been scanned during the second vertical scanning sub-period, while the fourth vertical scanning sub-period is a period for sequentially scanning even or odd rows of pixels that have been skipped during the third vertical scanning sub-period. The sequence includes a sequence in which the source signal voltage has different polarities between the first and second vertical scanning sub-periods, the same polarity between the second and third vertical scanning sub-periods, and different polarities again between the third and fourth vertical scanning sub-periods.

In a specific preferred embodiment, the CS bus lines include at least one CS bus line that is associated in common with two subpixels that belong to two different pixels and that are adjacent to each other in the column direction. If one period of the CS voltage is represented by M×H where H is one horizontal scanning period and M is a positive integer, Nsv is a positive integral number of times as large as M.

In another preferred embodiment, Nsv×H (where H is one horizontal scanning period) is equal to or shorter than 1.2 ms.

In still another preferred embodiment, if the number of horizontal scanning periods included in one vertical scanning period is Nv-total, then (Nsv/Nv-total)×one vertical scanning period is equal to or shorter than 1.2 ms.

In yet another preferred embodiment, if the number of horizontal scanning periods included in one effective display period is Nv-Disp, then Nv-Disp is an integral number of times as large as Nsv×2.

In yet another preferred embodiment, in an arbitrary vertical scanning period, source signal voltages supplied to two source bus lines that are associated with mutually adjacent columns of pixels have opposite polarities.

In yet another preferred embodiment, one vertical scanning sub-period is equal or shorter than 1/120 second.

A TV receiver according to the present invention includes a liquid crystal display device according to any of the preferred embodiments of the present invention described above, and a tuner, which receives a TV broadcast and outputs a video signal to the liquid crystal display device.

A liquid crystal display device according to a second aspect of the present invention includes: a number of pixels that are arranged in columns and rows to form a matrix pattern; a plurality of source bus lines, each of which is associated with one of the columns of pixels; and a plurality of gate bus lines, each of which is associated with one of the rows of pixels. The pixels are scanned by supplying gate signal voltages to the respective gate bus lines. Each vertical scanning period has multiple vertical scanning sub-periods including a first vertical scanning sub-period for sequentially scanning a series of odd or even rows of pixels and a second vertical scanning sub-period, which is continuous with the first vertical scanning sub-period, for sequentially scanning even or odd rows of pixels that have been skipped during the first vertical scanning sub-period. The polarity of a source signal voltage supplied to each said source bus line changes in a predetermined sequence, which includes a series of two vertical scanning sub-periods in which the source signal voltage has mutually opposite polarities. Each said pixel includes first and second subpixels, and a plurality of TFTs, each of which is associated with one of the first and second subpixels of that pixel. Two pixels that are adjacent to each other along their associated one of the source bus lines are arranged such that either the respective first subpixels or the respective second subpixels are adjacent to each other along the source bus line.

In one preferred embodiment, the first and second subpixels are arranged along the source bus line, and a pixel that is adjacent to the first subpixel along the source bus line is not adjacent to the second subpixel.

In another preferred embodiment, the first and second subpixels are arranged so as to interpose between them one of the gate bus lines that is associated with the pixel including the first and second subpixels.

In still another preferred embodiment, along the source bus line, the second subpixel is interposed between two portions of the first subpixel, and each pair of pixels is arranged along the source bus line so that the first subpixels thereof are adjacent to each other along the source bus line.

In yet another preferred embodiment, the liquid crystal display device further includes a plurality of auxiliary lines, each of which is arranged between two associated pixels that are adjacent to each other along the source bus line and is controlled to have a predetermined potential level.

In this particular preferred embodiment, the auxiliary lines are a plurality of CS bus lines, each of which is associated with either the respective first subpixels or the respective second subpixels of one of the rows of pixels.

In a specific preferred embodiment, the CS bus lines include at least one CS bus line that is associated in common with two subpixels that belong to two different pixels and that are adjacent to each other in the column direction.

In yet another preferred embodiment, supposing a certain row formed by some of the pixels is an $n^{th}$ row, a storage capacitor line, to which the storage capacitor counter electrode of the first subpixel of the pixel that is located at the intersection between an arbitrary column and the $n^{th}$ row is connected, is identified by CSBL_(n)A and a storage capacitor line, to which the storage capacitor counter electrode of the second subpixel thereof is connected, is identified by CSBL_(n)B, CS bus lines that are connected to L electrically independent storage capacitor trunks satisfy $$CSBL\_(p+2\times(1-1))B, (p+2\times(1-1)+1)A,$$
$$CSBL\_(p+2\times(2-1))B, (p+2\times(2-1)+1)A,$$
$$CSBL\_(p+2\times(3-1))B, (p+2\times(3-1)+1)A,$$
$$\ldots$$
$$CSBL\_(p+2\times(K-1))B, (p+2\times(K-1)+1)A$$

and $$CSBL\_(p+2\times(1-1)+K\times L+1)B, (p+2\times(1-1)+K\times L+2)A,$$
$$CSBL\_(p+2\times(2-1)+K\times L+1)B, (p+2\times(2-1)+K\times L+2)A,$$
$$CSBL\_(p+2\times(3-1)+K\times L+1)B, (p+2\times(3-1)+K\times L+2)A,$$
$$\ldots$$
$$CSBL\_(p+2\times(K-1)+K\times L+1)B, (p+2\times(K-1)+K\times L+2)A$$

or $$CSBL\_(p+2\times(1-1)+1)B, (p+2\times(1-1)+2)A,$$
$$CSBL\_(p+2\times(2-1)+1)B, (p+2\times(2-1)+2)A,$$
$$CSBL\_(p+2\times(3-1)+1)B, (p+2\times(3-1)+2)A,$$
$$\ldots$$
$$CSBL\_(p+2\times(K-1)+1)B, (p+2\times(K-1)+2)A$$

and $$CSBL\_(p+2\times(1-1)+K\times L)B, (p+2\times(1-1)+K\times L+1)A,$$
$$CSBL\_(p+2\times(2-1)+K\times L)B, (p+2\times(2-1)+K\times L+1)A,$$
$$CSBL\_(p+2\times(3-1)+K\times L)B, (p+2\times(3-1)+K\times L+1)A,$$
$$\ldots$$
$$CSBL\_(p+2\times(K-1)+K\times L)B, (p+2\times(K-1)+K\times L+1)A$$

where p=1, 3, 5, and so on or p=0, 2, 4, and so on.

The liquid crystal display device according to the second aspect of the present invention may have the same configuration as the counterpart according to the first aspect of the present invention except that there is no need to change the luminances between subpixels.

A gate driver according to the present invention includes: a first shift register for odd stages and a second shift register for even stages, the first and second shift registers receiving clock signals and start pulses independently of each other and a control signal in common; a first AND gate that receives the output of one of the first and second shift registers and a logically inverted one of the control signal; and a second AND gate that receives the output of the other shift register and a logically inverted one of the control signal that has already had its logic inverted. The respective outputs of the first and second AND gates correspond to signals to be output to their associated gate bus lines.

In one preferred embodiment, it is determined by the control signal whether output needs to be provided from an odd stage through the first shift register or an even stage through the second shift register.

Effects of the Invention

The present invention provides a liquid crystal display device that can minimize deterioration in display quality even when the source line inversion drive method or the block inversion drive method is applied to the multi-pixel technology.

BRIEF DESCRIPTION OF DRAWINGS

FIG. 9 shows what is a problem with the source line inversion drive.

Portions (a) and (b) of FIG. 10 are schematic representations illustrating how combing occurs in the source line inversion drive scheme.

Figure 11:
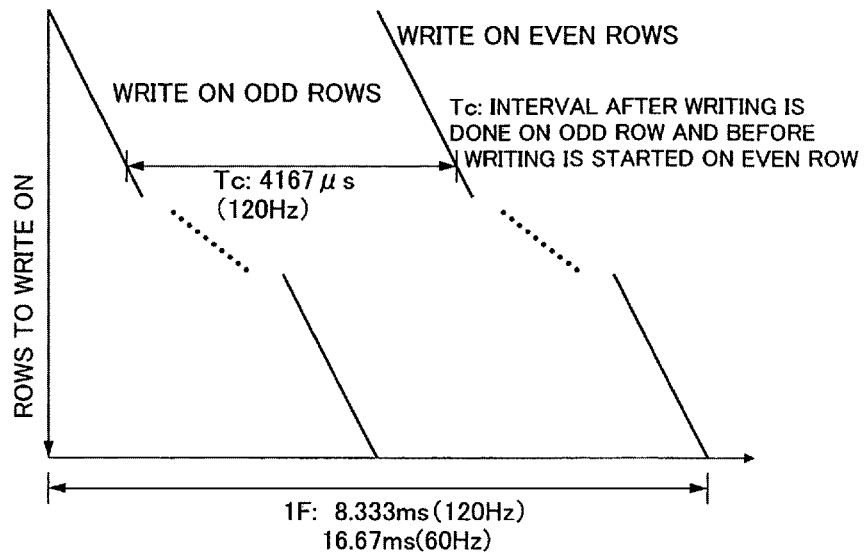

FIG. 11 illustrates why the combing phenomenon occurs.

Figure 12:
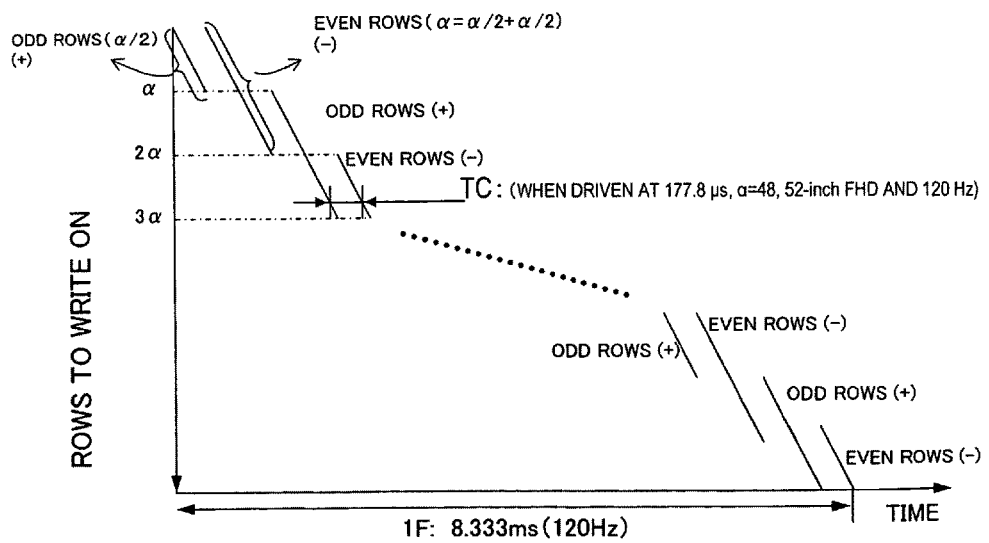

FIG. 12 schematically illustrates a driving method according to a preferred embodiment of the present invention.

Figure 13A:
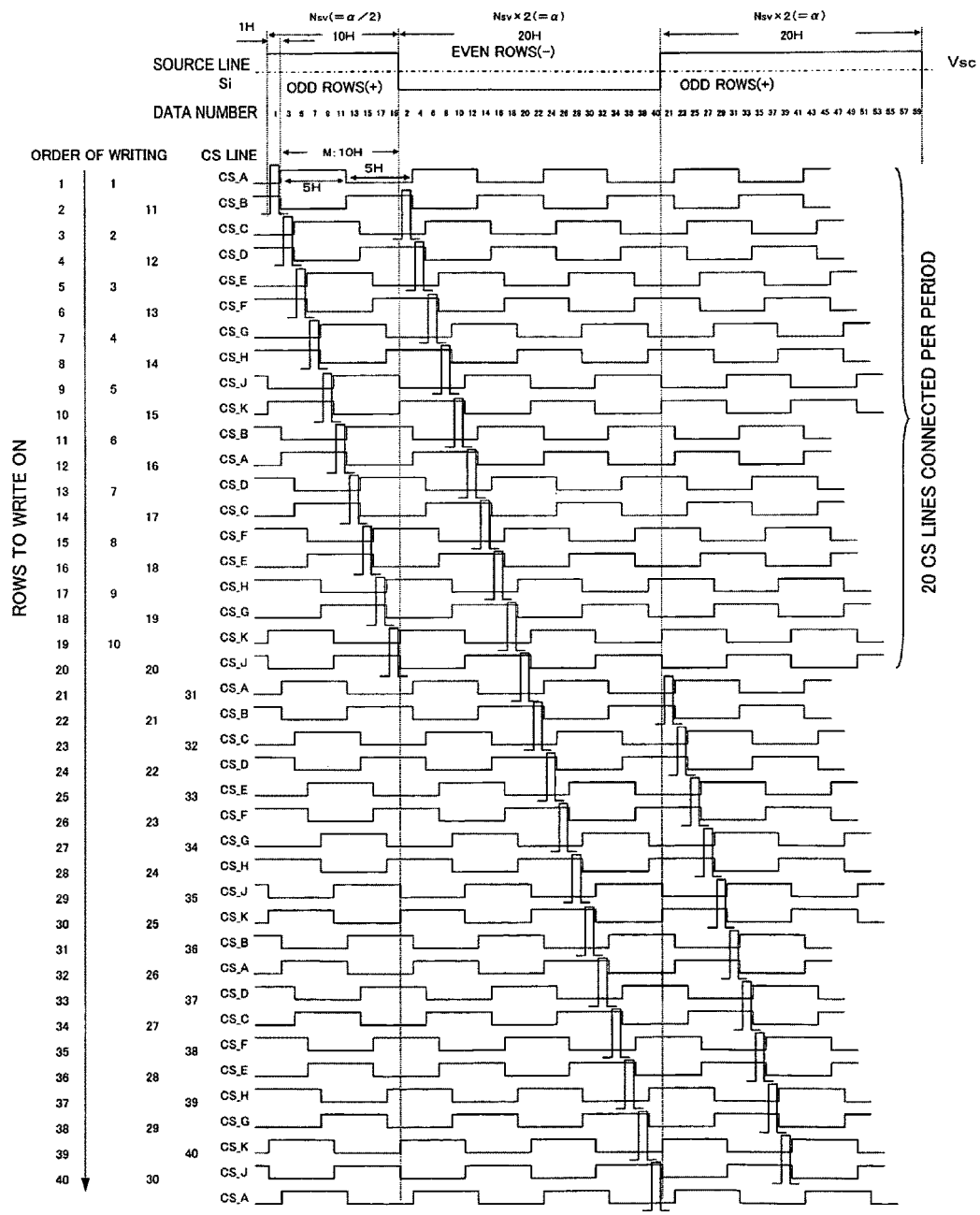

FIG. 13A illustrates the waveforms and timings of various signals for use to carry out a driving method according to a preferred embodiment of the present invention.

Figure 13B:
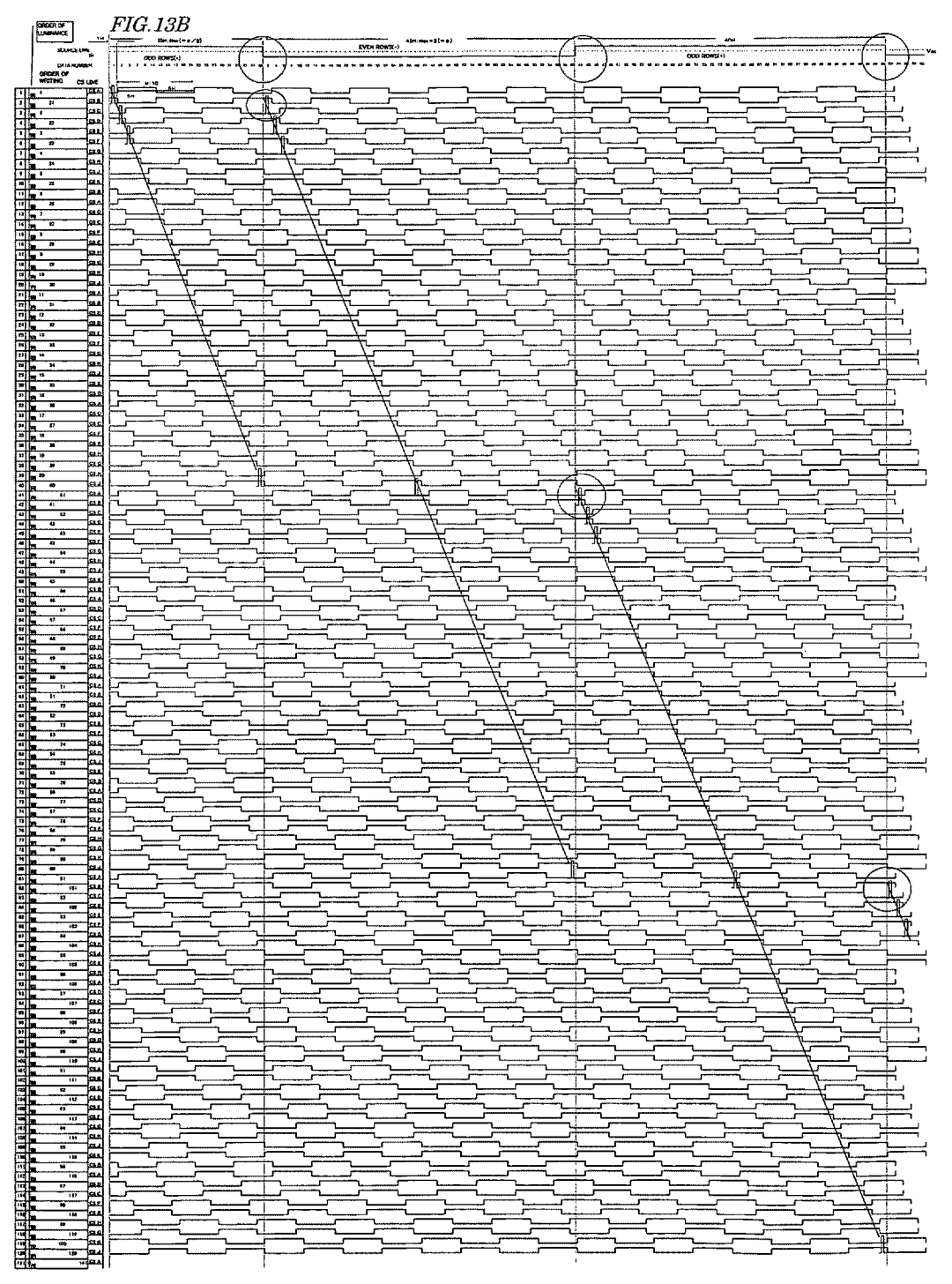

FIG. 13B illustrates the waveforms and timings of various signals for use to carry out a driving method according to another preferred embodiment of the present invention.

Figure 13C:
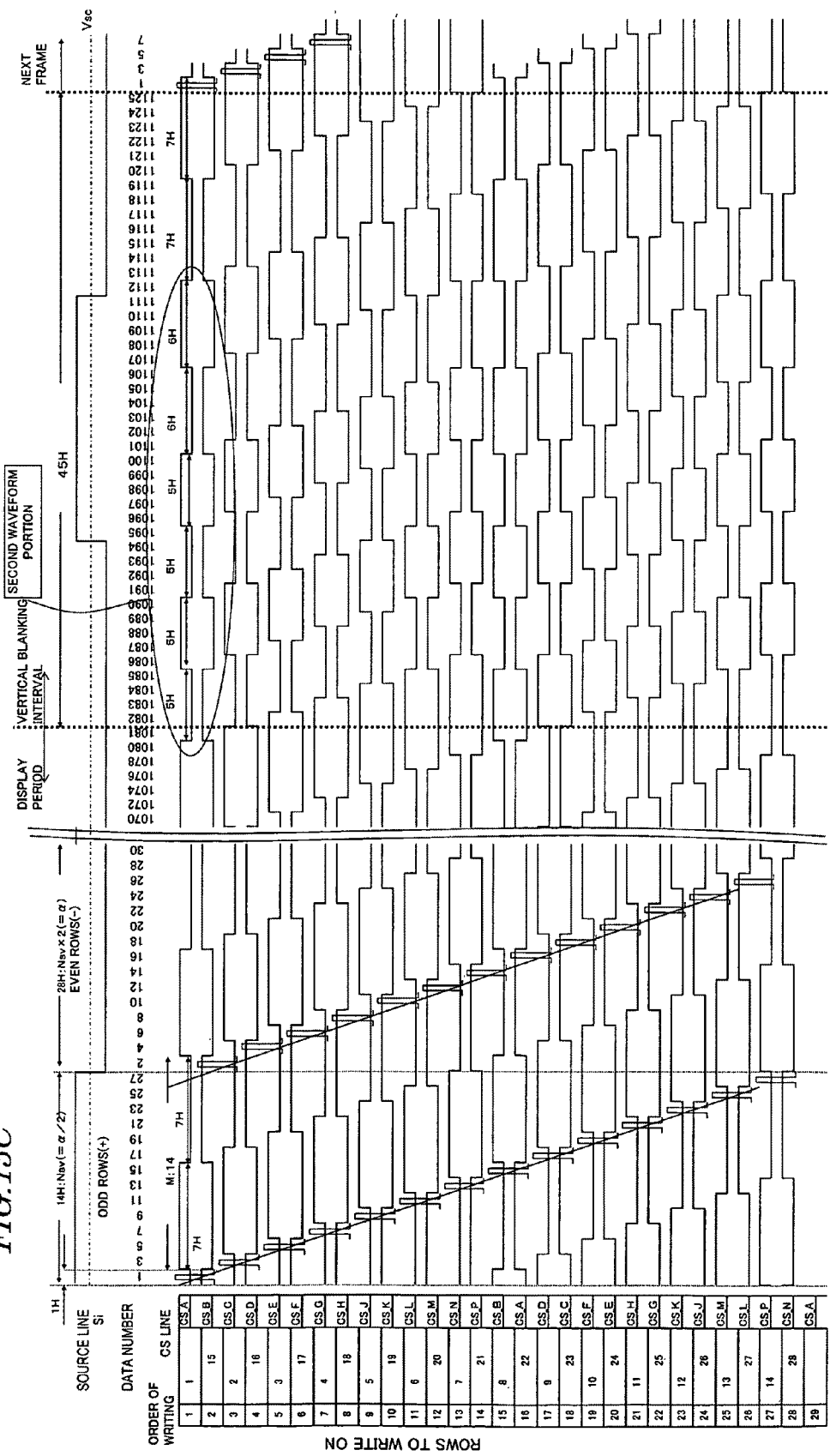

FIG. 13C illustrates the waveforms and timings of various signals for use to carry out a driving method according to still another preferred embodiment of the present invention.

Figure 14A:
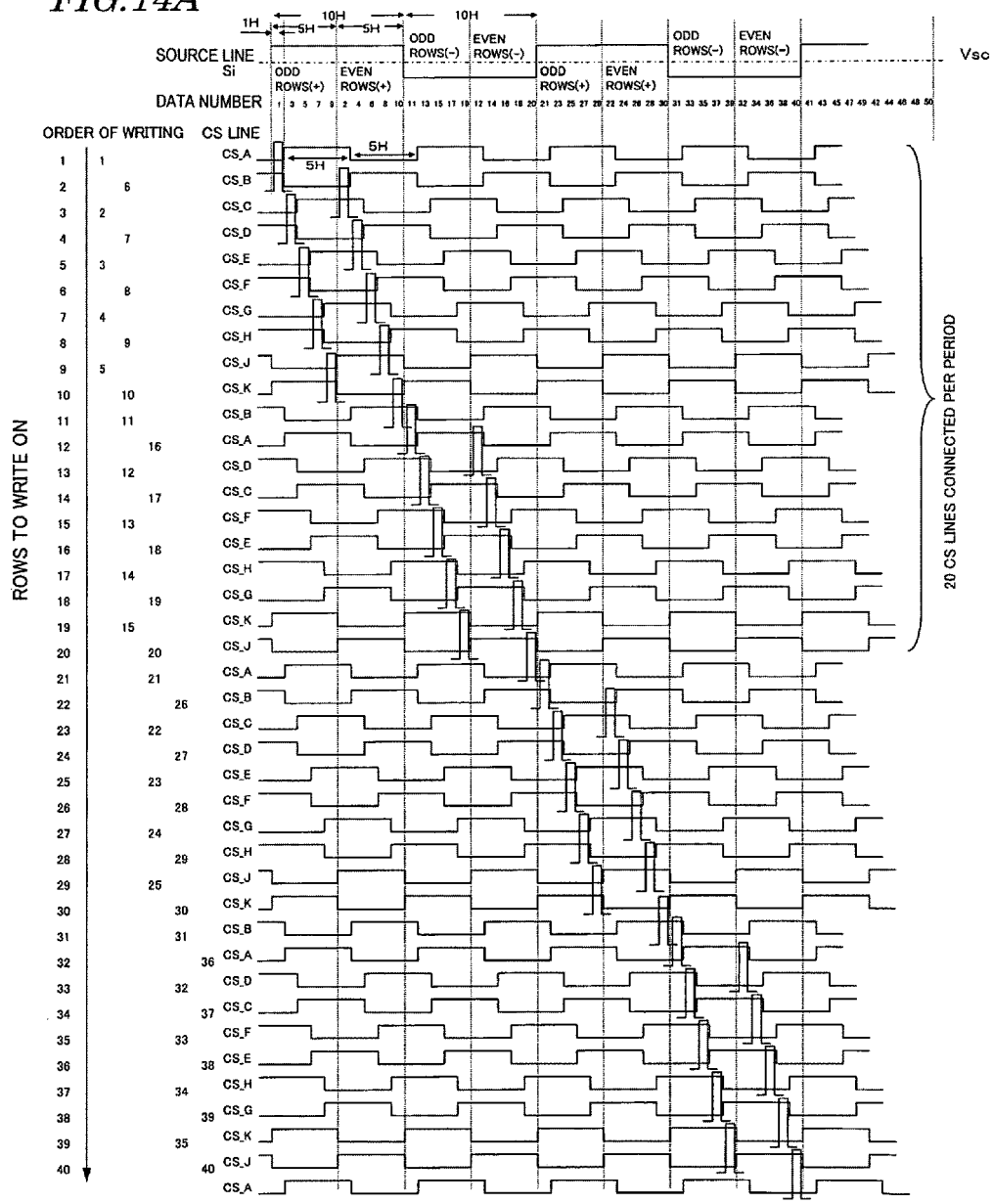

FIG. 14A illustrates the waveforms and timings of various signals for use to carry out a driving method according to yet another preferred embodiment of the present invention.

Figure 14B:
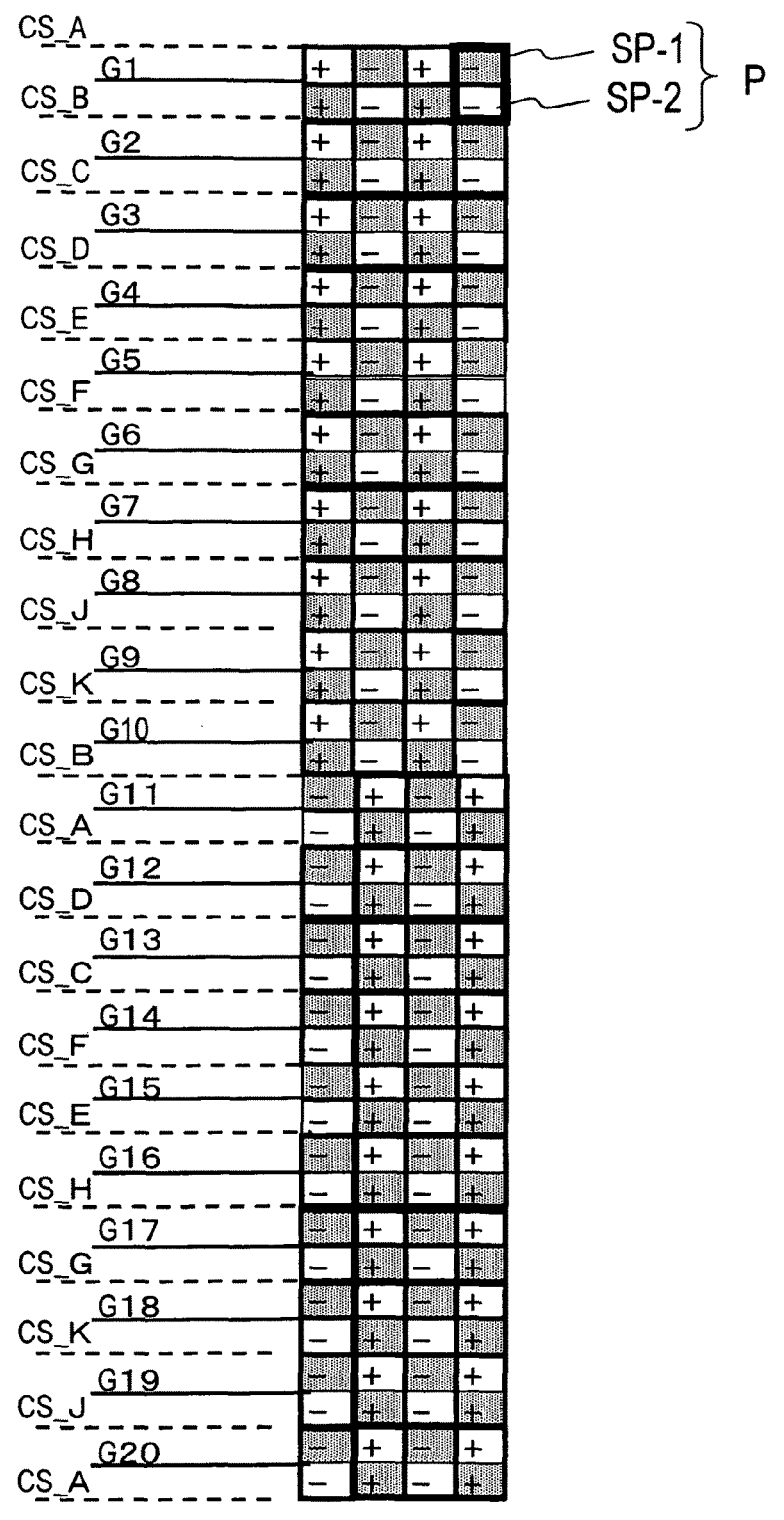

FIG. 14B schematically shows the polarities (+ or −) of the source signal voltages written and the arrangement of bright and dark subpixels (of which the shadowed ones are dark subpixels) when the liquid crystal display device is driven by the source line inversion driving method using the signals shown in FIG. 14A.

FIGS. 15(A) and 15(B) are diagrams schematically illustrating an exemplary configuration for a gate driver 130 that the liquid crystal display device 100 of the present invention has.

Figure 15:
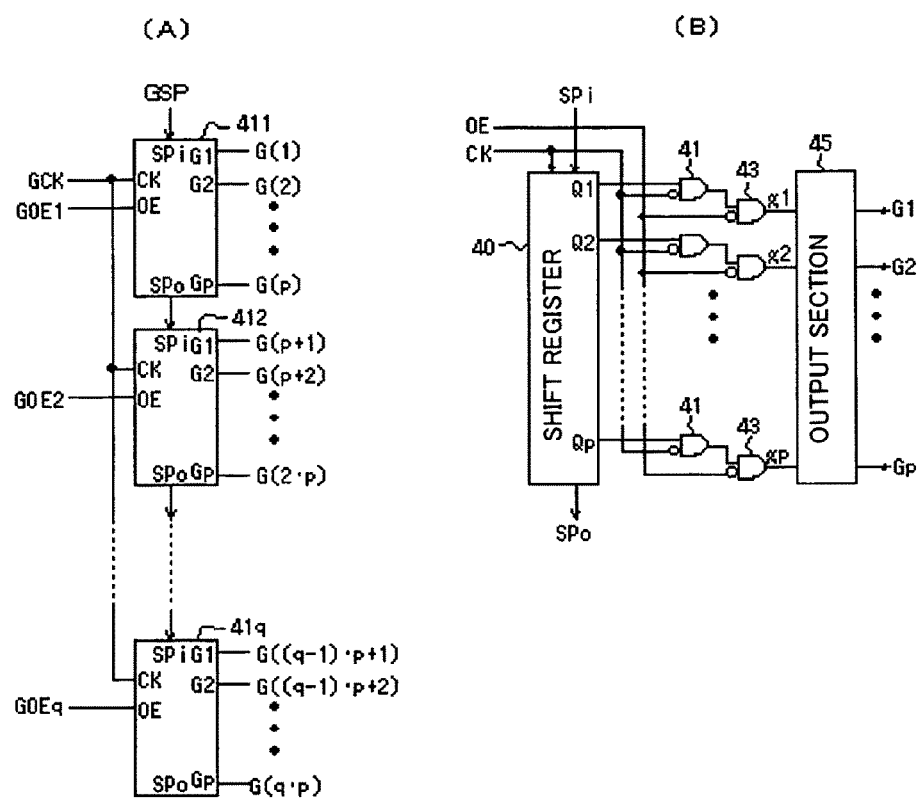
Figure 16:
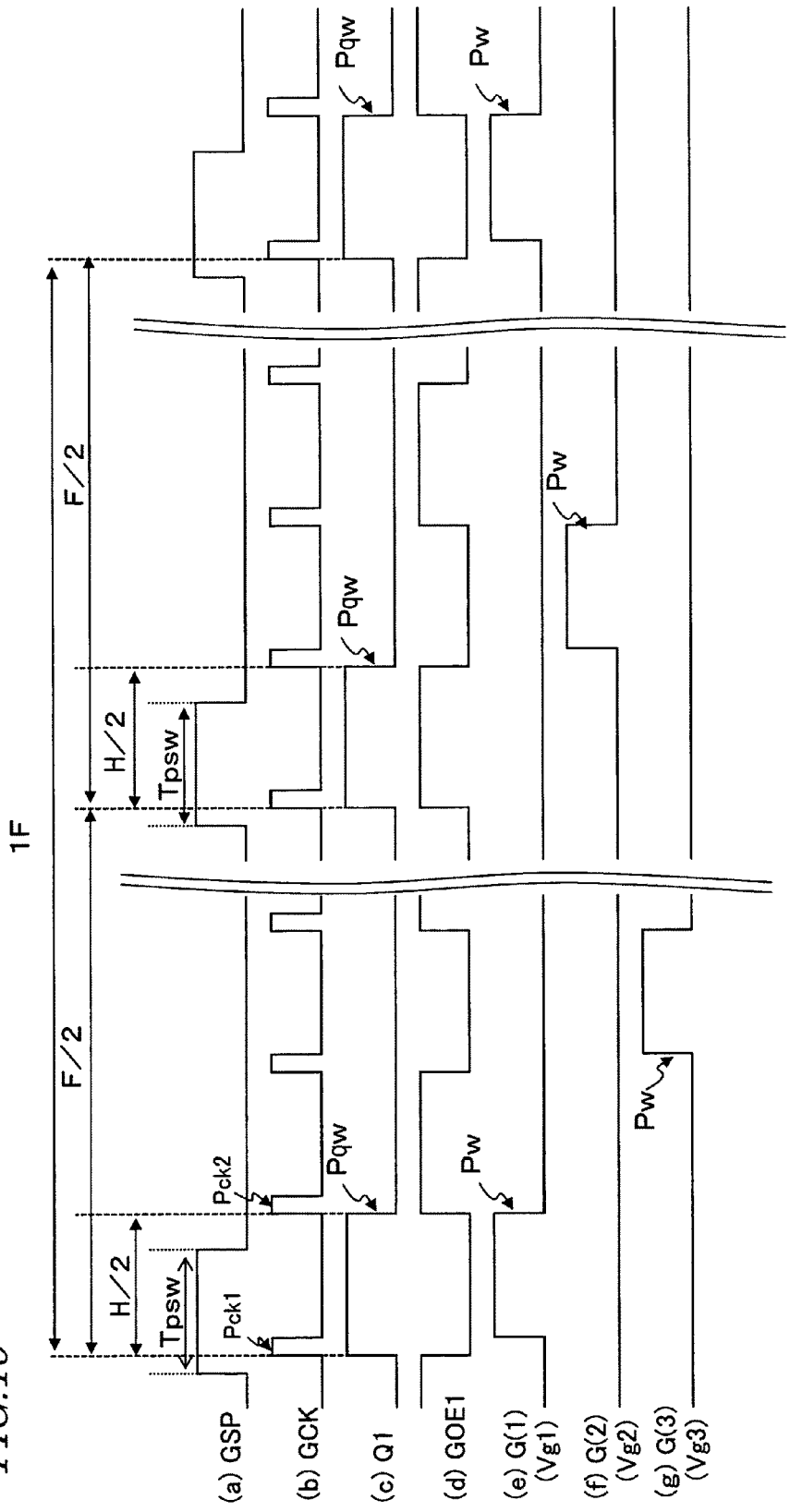

Portions (a) through (g) of FIG. 16 show exemplary waveforms for various signals to illustrate how the gate driver 130 shown in FIG. 15 may operate.

Figure 17:
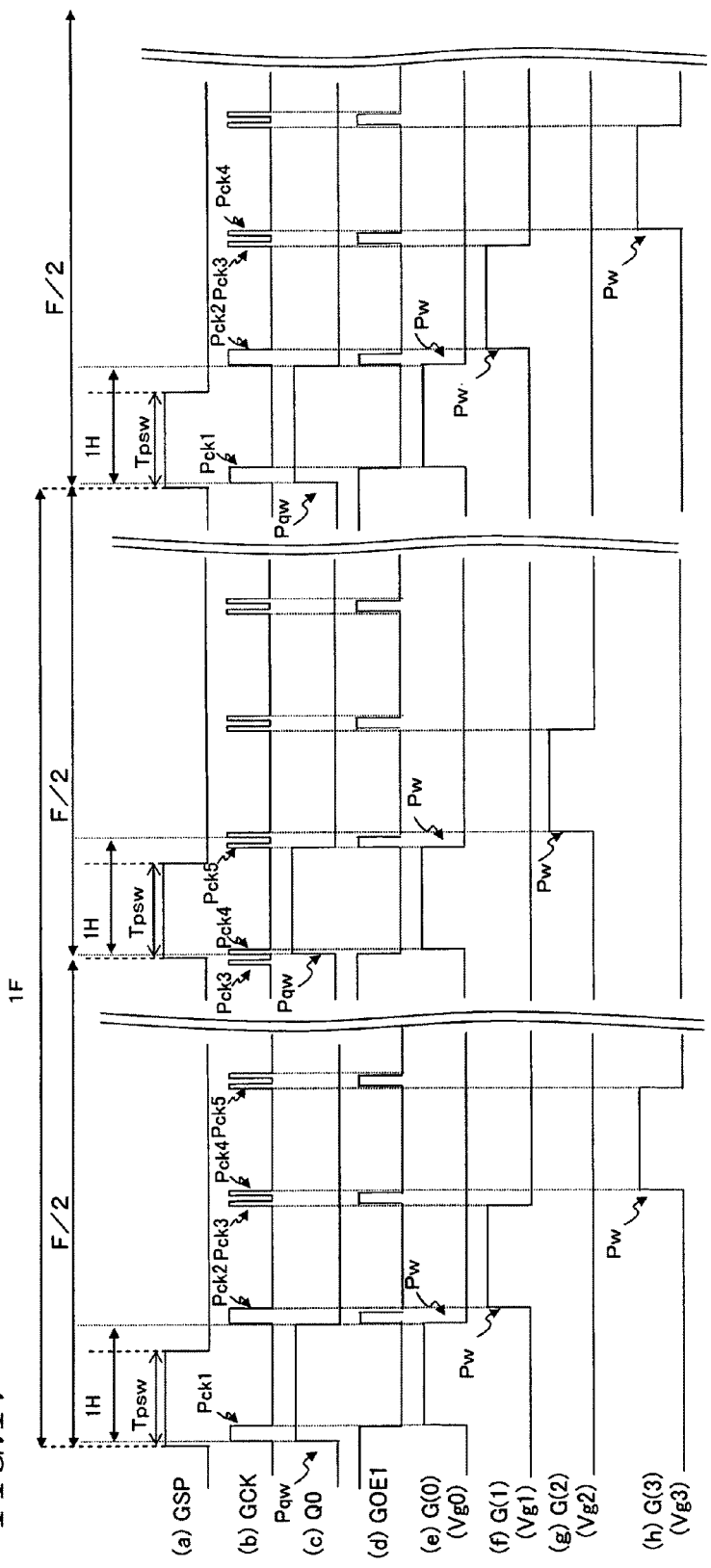

Portions (a) through (h) of FIG. 17 show another set of exemplary waveforms for various signals to illustrate how the gate driver 130 shown in FIG. 15 may operate.

Figure 18:
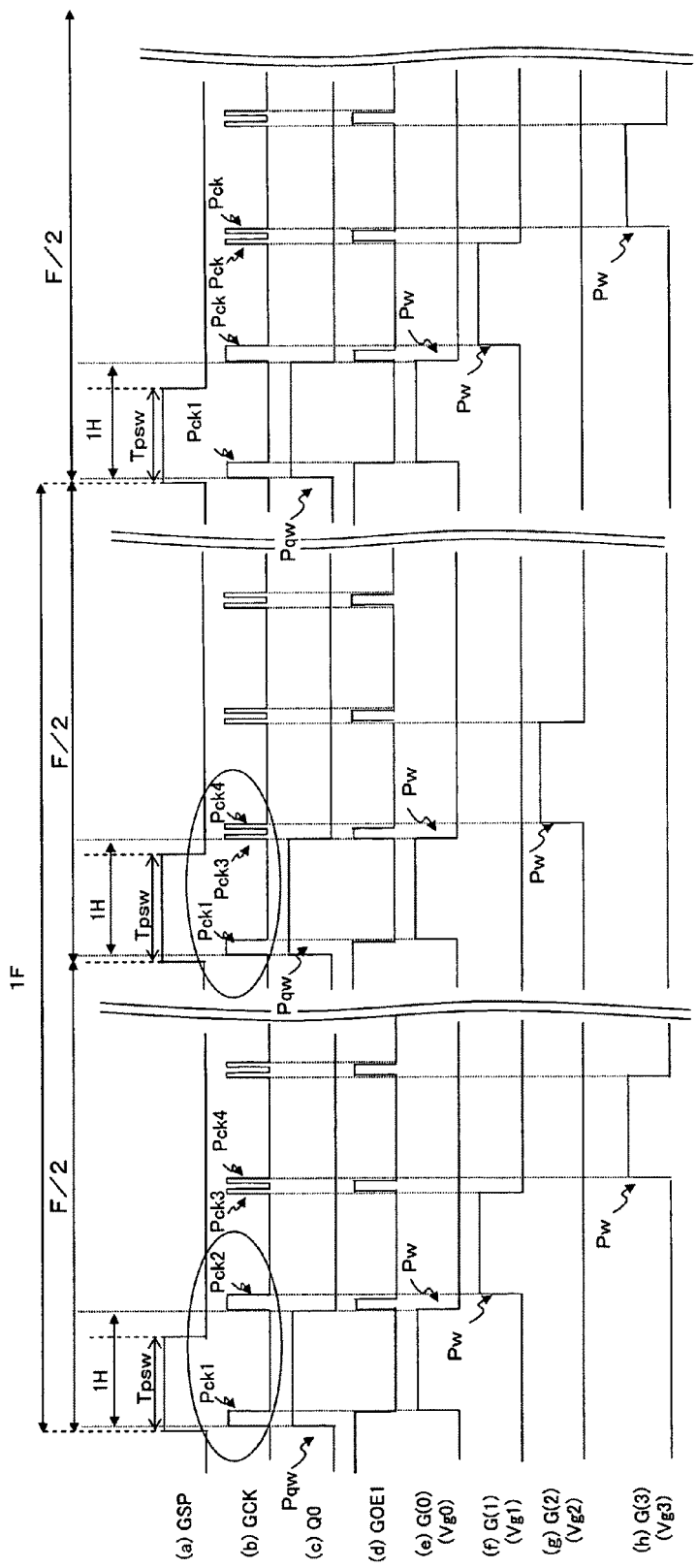

Portions (a) through (h) of FIG. 18 show still another set of exemplary waveforms for various signals to illustrate how the gate driver 130 shown in FIG. 15 may operate.

Figure 19:
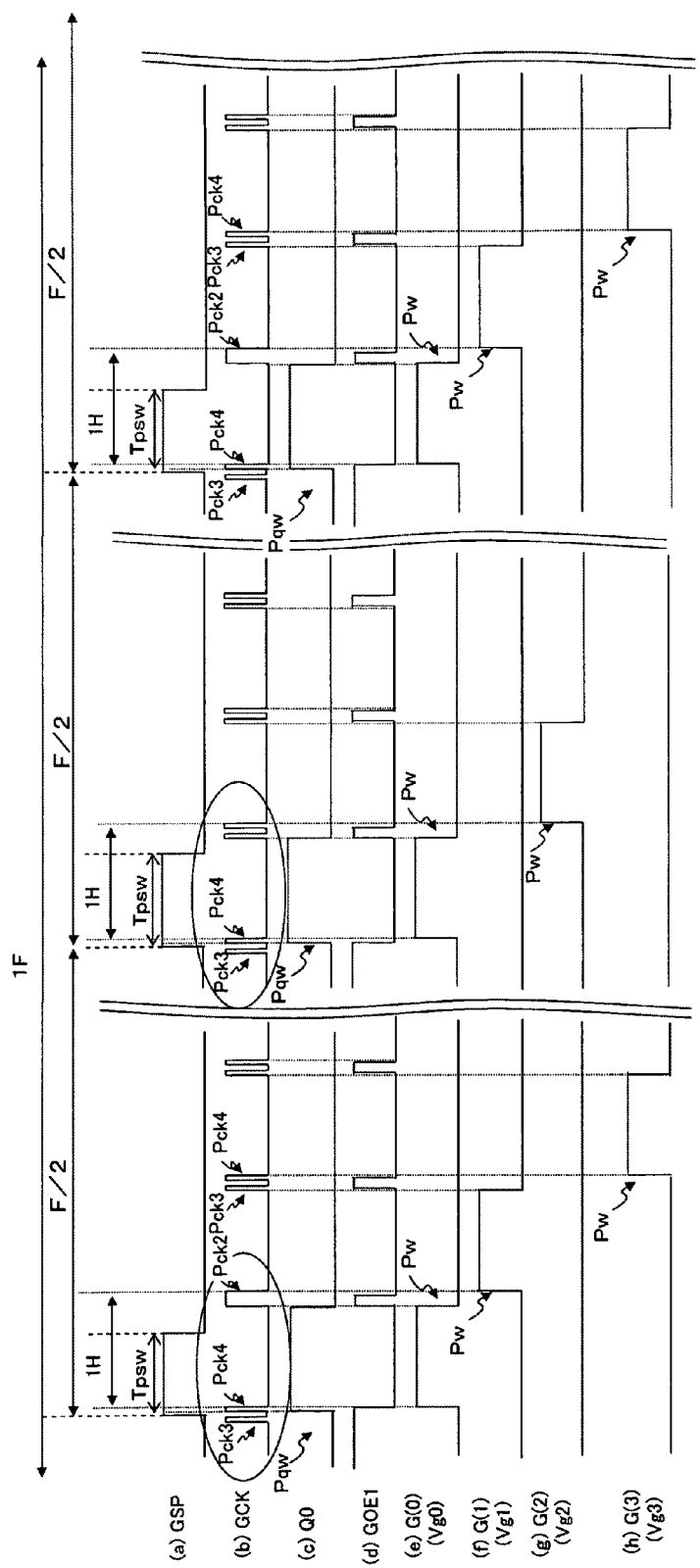

Portions (a) through (h) of FIG. 19 show yet another set of exemplary waveforms for various signals to illustrate how the gate driver 130 shown in FIG. 15 may operate.

Figure 20:
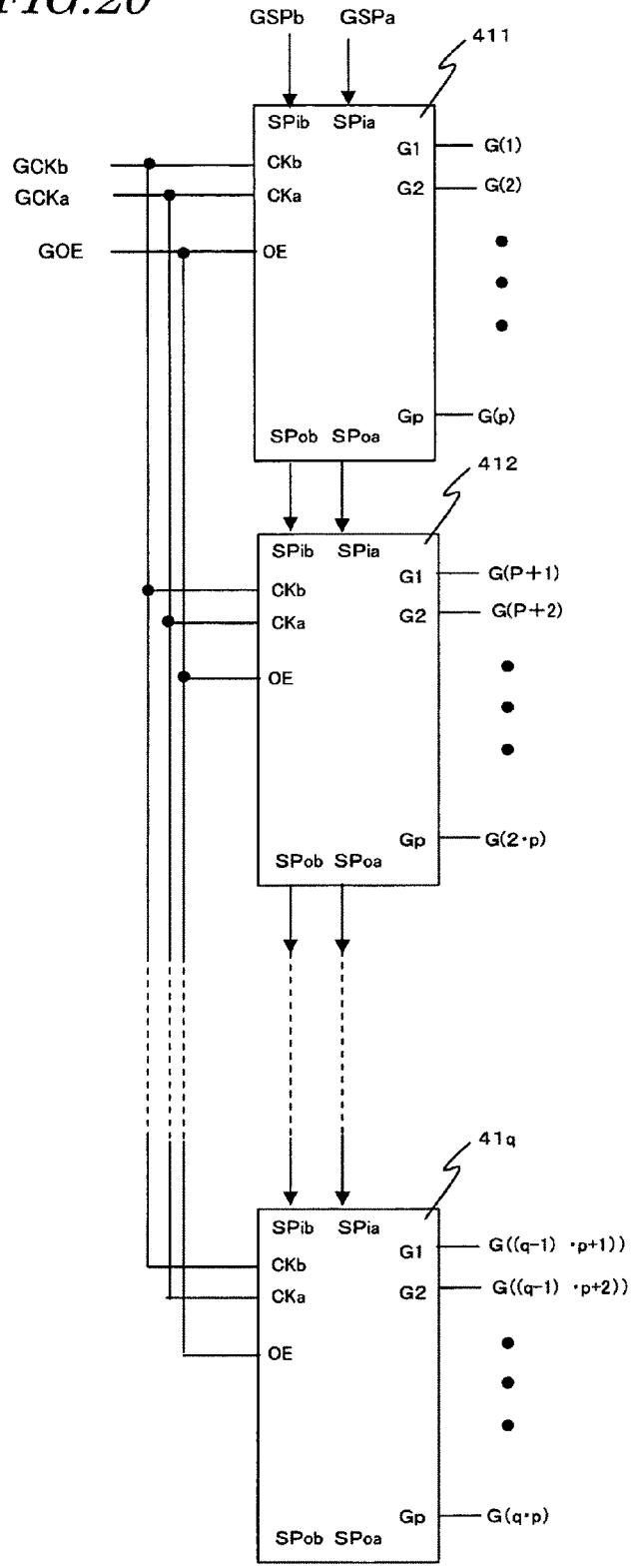

FIG. 20 is a diagram schematically illustrating an exemplary configuration for another gate driver 130 that the liquid crystal display device 100 of the present invention may have.

Figure 21:
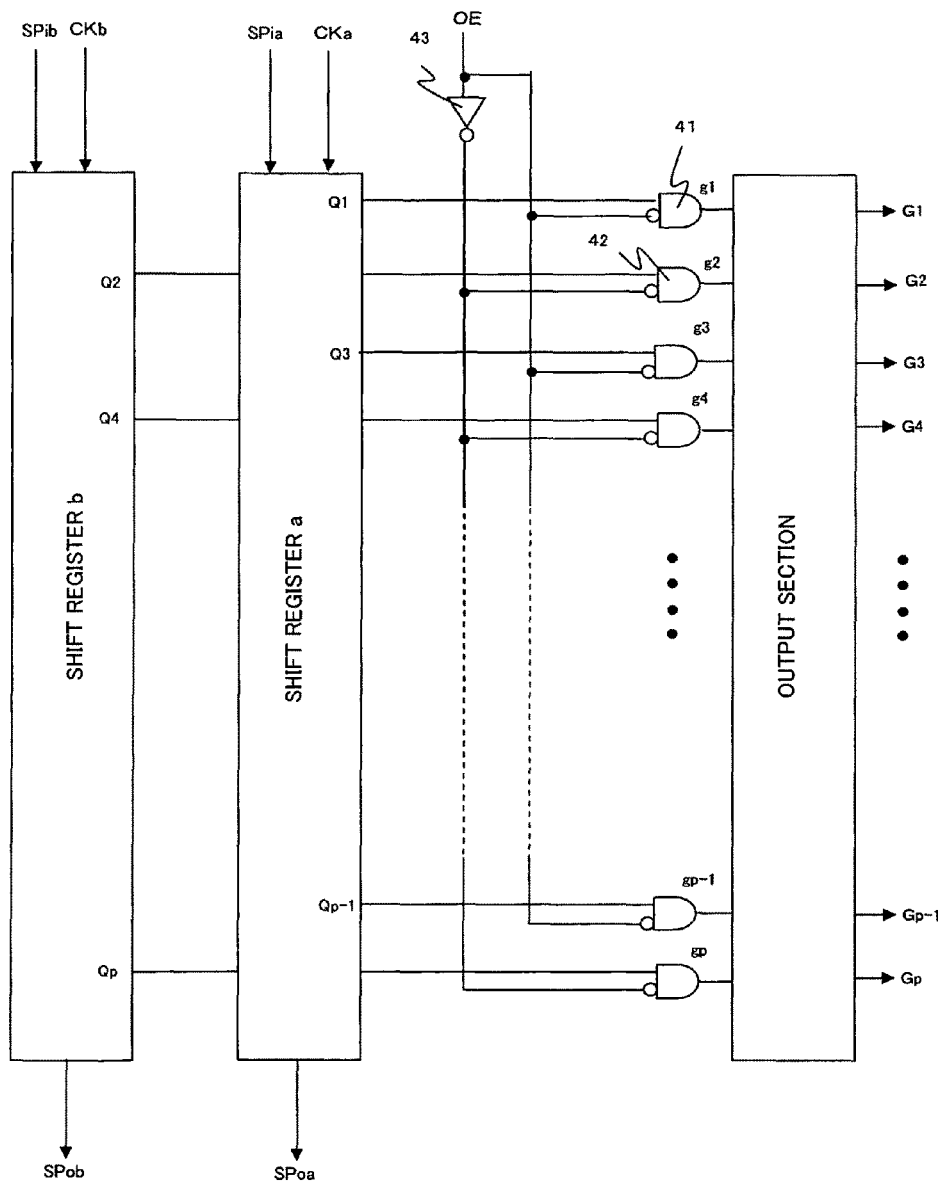

FIG. 21 is a diagram schematically illustrating a configuration for each gate driver IC chip that the gate driver shown in FIG. 20 may have.

Figure 22:
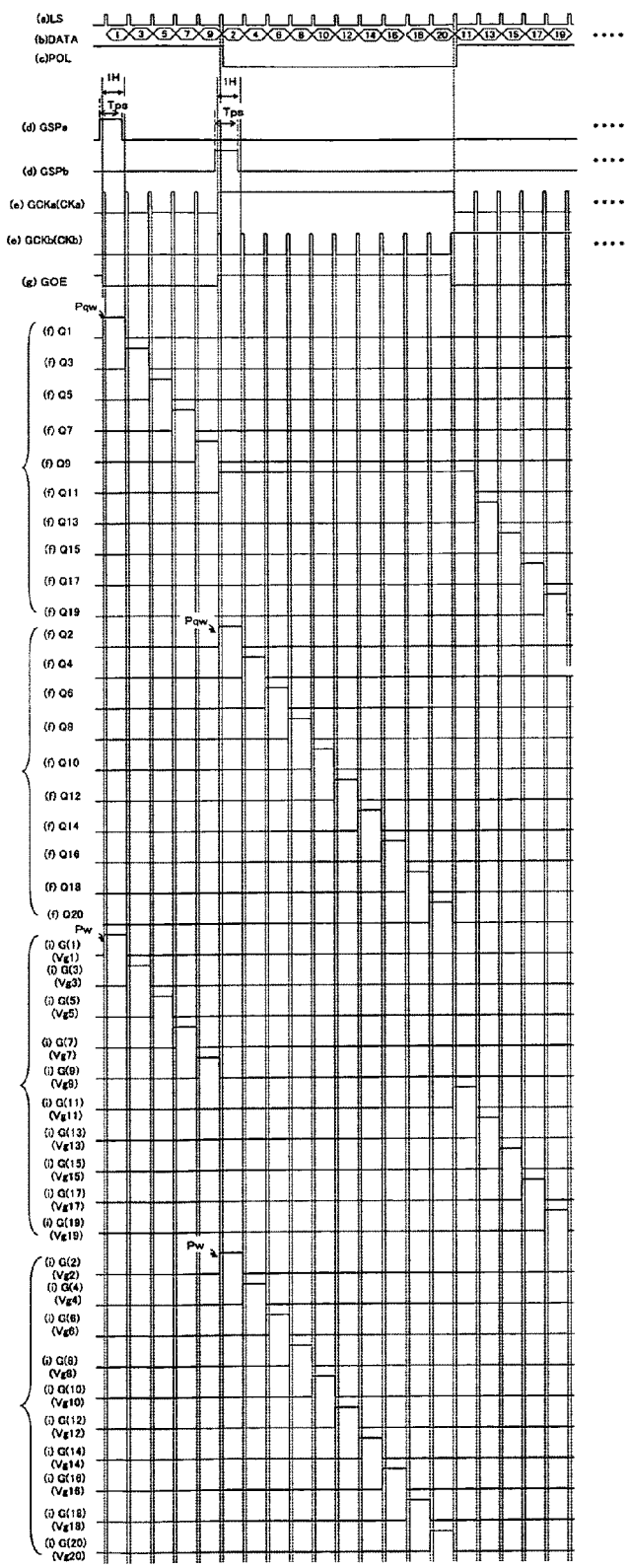

FIG. 22 shows the waveforms and timings of various signals for use in the gate driver shown in FIG. 20.

Figure 23:
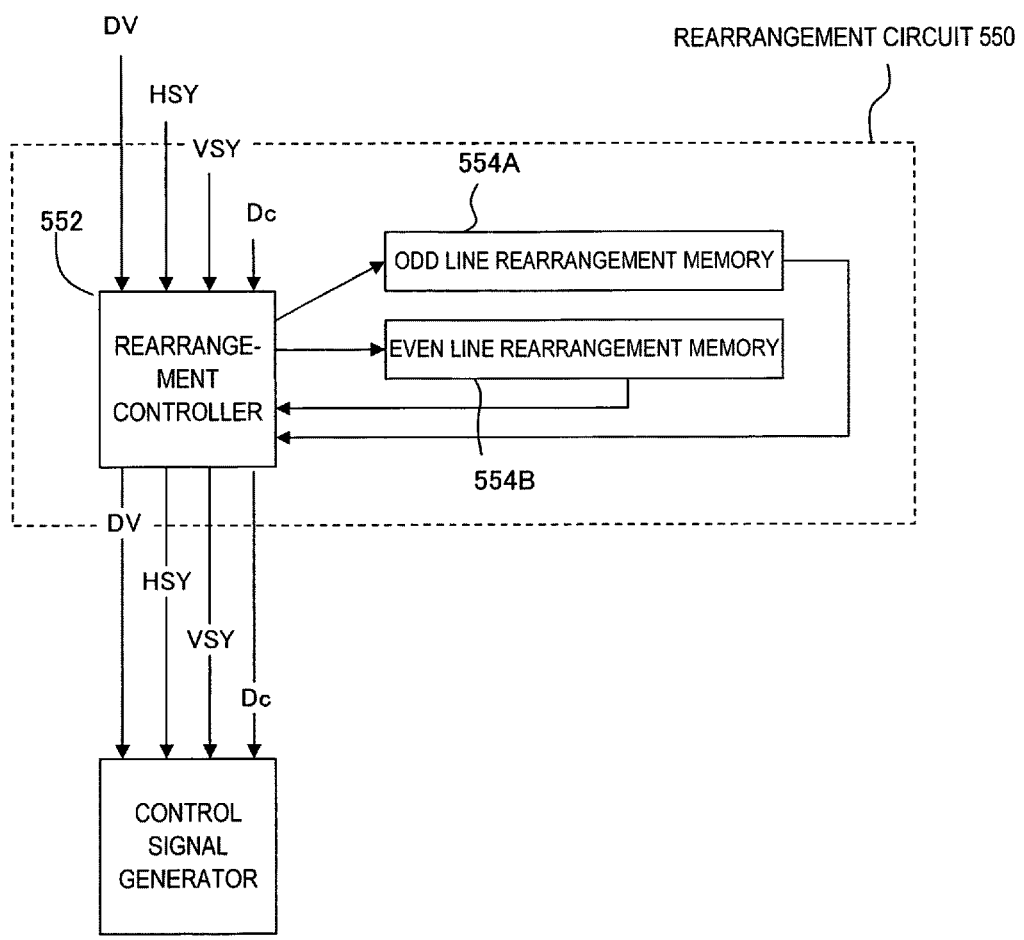

FIG. 23 is a block diagram illustrating diagrammatically an exemplary configuration for a rearrangement circuit that the liquid crystal display device 100 according to a preferred embodiment of the present invention may have.

FIG. 24A is a schematic representation illustrating how to rearrange data.

FIG. 24B illustrates, on a larger scale, the dotted encircled portion y shown in FIG. 24A.

Figure 25:
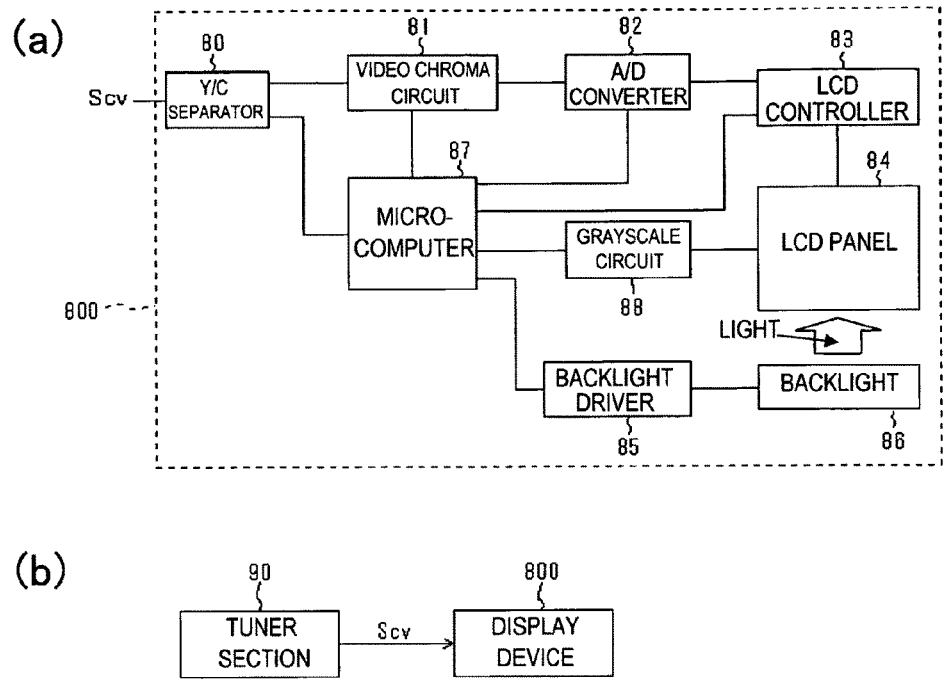

FIG. 25(a) is a block diagram illustrating a configuration for a display device 800 for a TV receiver and FIG. 25(b) illustrates how a tuner may be connected to the display device.

Figure 26:
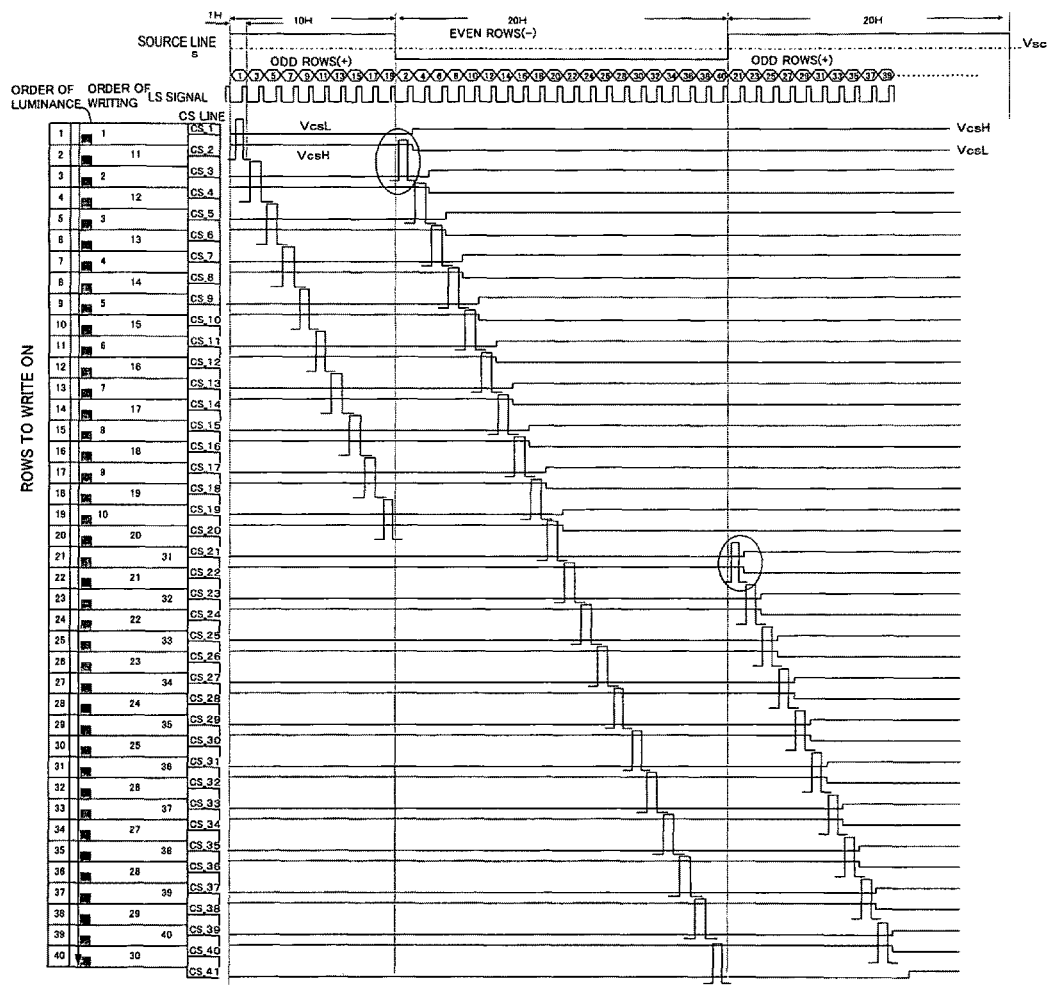

FIG. 26 illustrates the waveforms and timings of various signals for use to carry out a driving method according to yet another preferred embodiment of the present invention.

Figure 27:
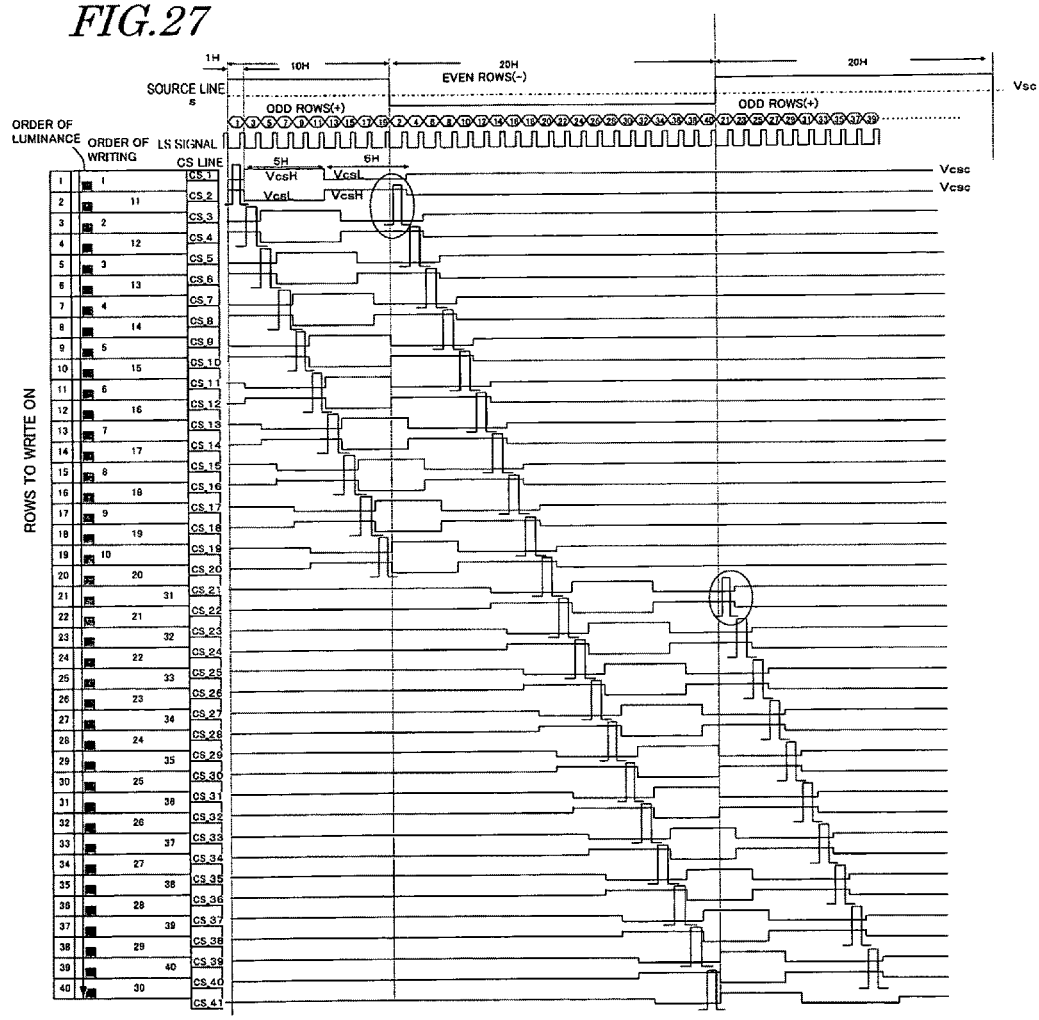

FIG. 27 illustrates the waveforms and timings of various signals for use to carry out a driving method according to yet another preferred embodiment of the present invention.

Figure 28:
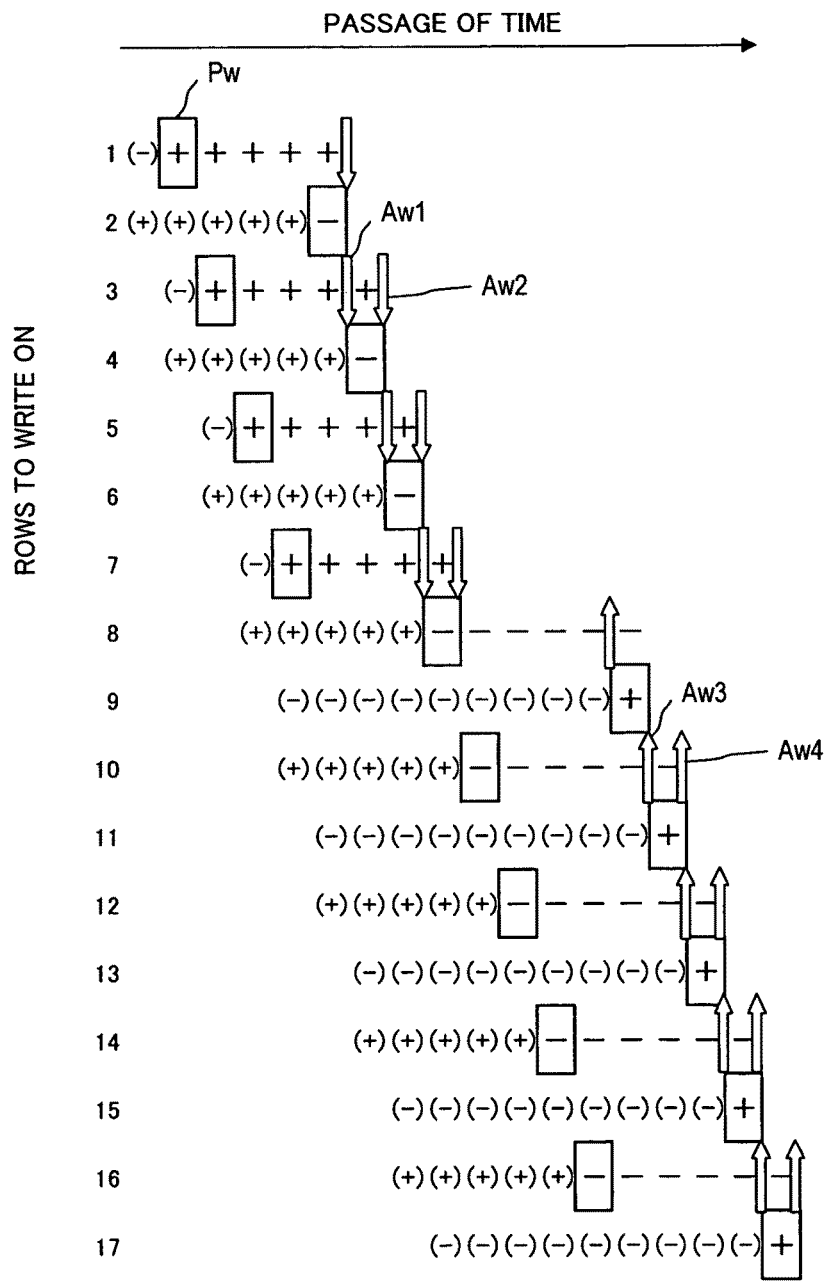

FIG. 28 shows the polarities of source signal voltages to be written on pixels and variations in voltage due to coupling between pixels that are adjacent to each other in the column direction in a situation where the block inversion drive is carried out on a conventional liquid crystal display device with no multi-pixel structure.

Figure 29:
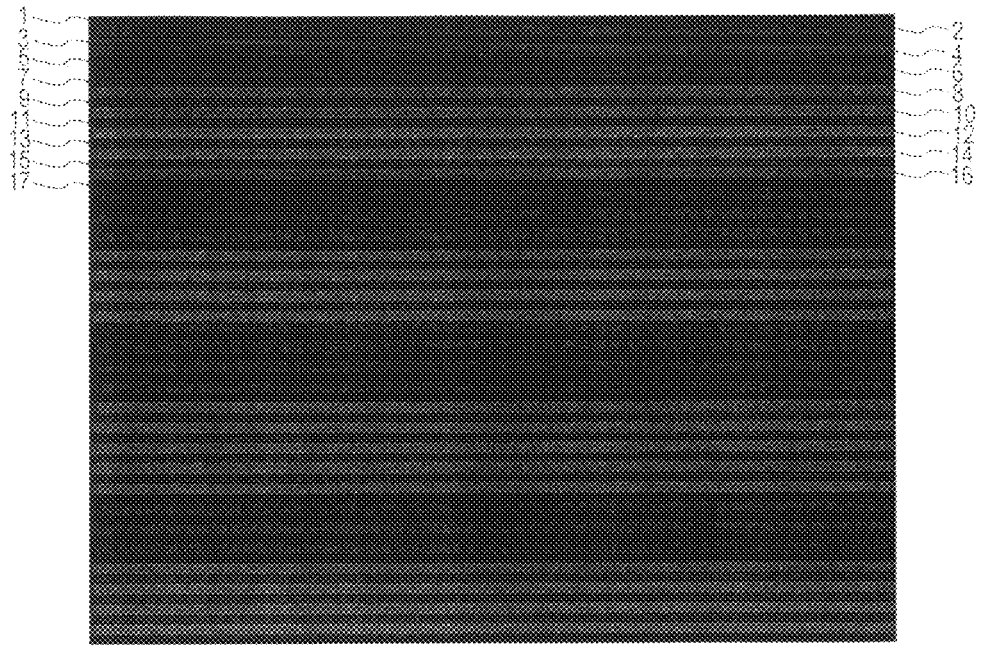

FIG. 29 schematically illustrates a display state of a certain frame when a grayscale tone is displayed over the entire screen of a conventional liquid crystal display device with no multi-pixel structure by the block inversion drive.

Figure 30:
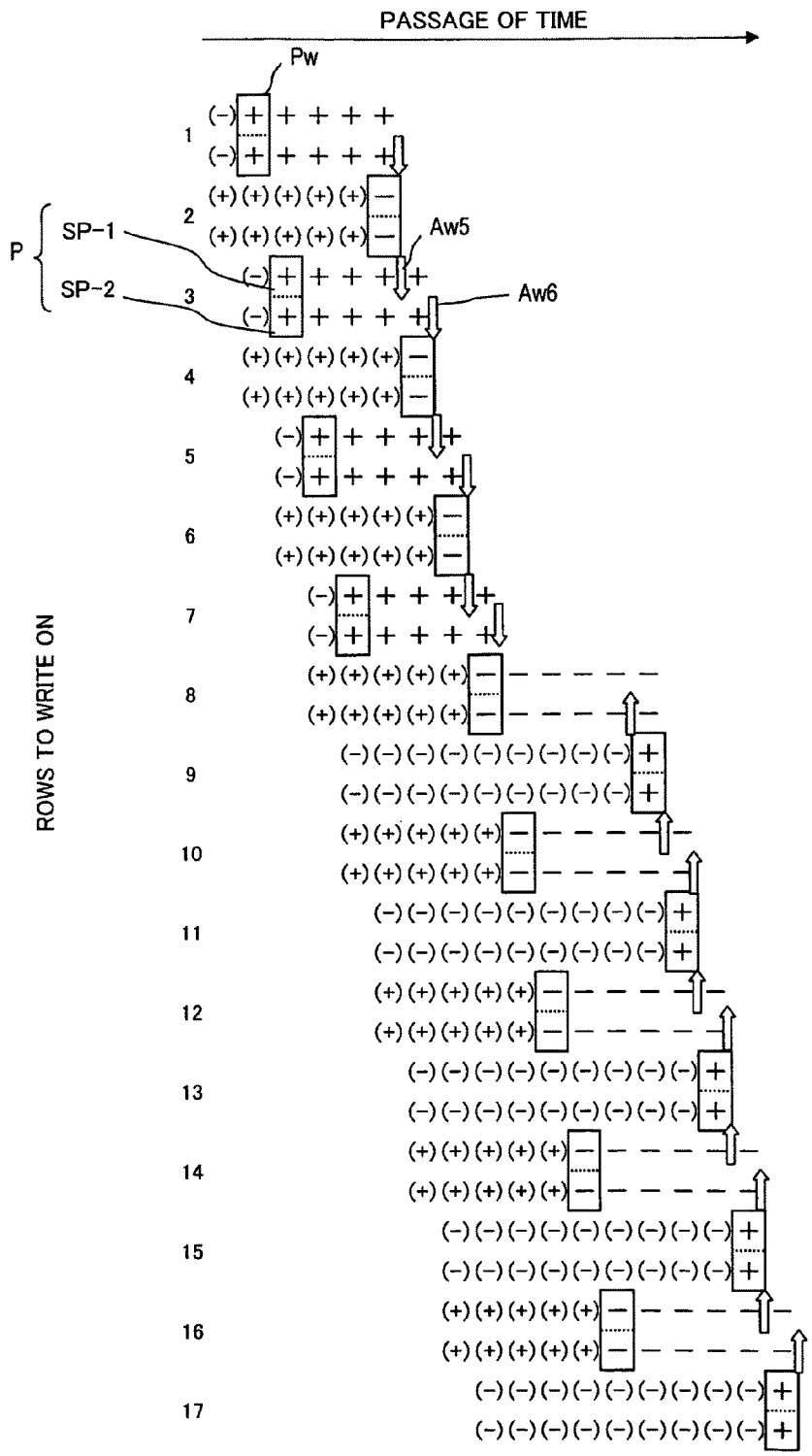

FIG. 30 shows the polarities of source signal voltages to be written on pixels and variations in voltage due to coupling between pixels that are adjacent to each other in the column direction in a situation where the block inversion drive is carried out on a liquid crystal display device with a multi-pixel structure.

Figure 31:
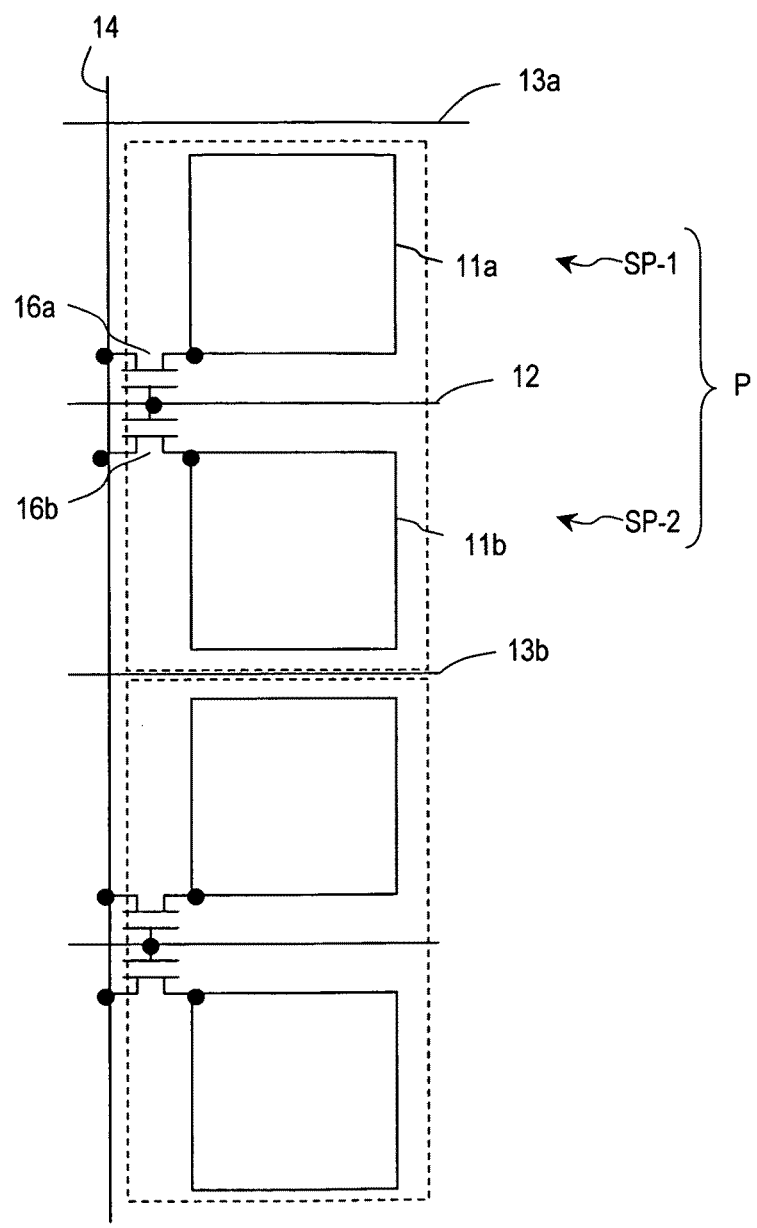

FIG. 31 is a plan view illustrating an exemplary multi-pixel structure for a liquid crystal display device as a preferred embodiment of the present invention.

Figure 32:
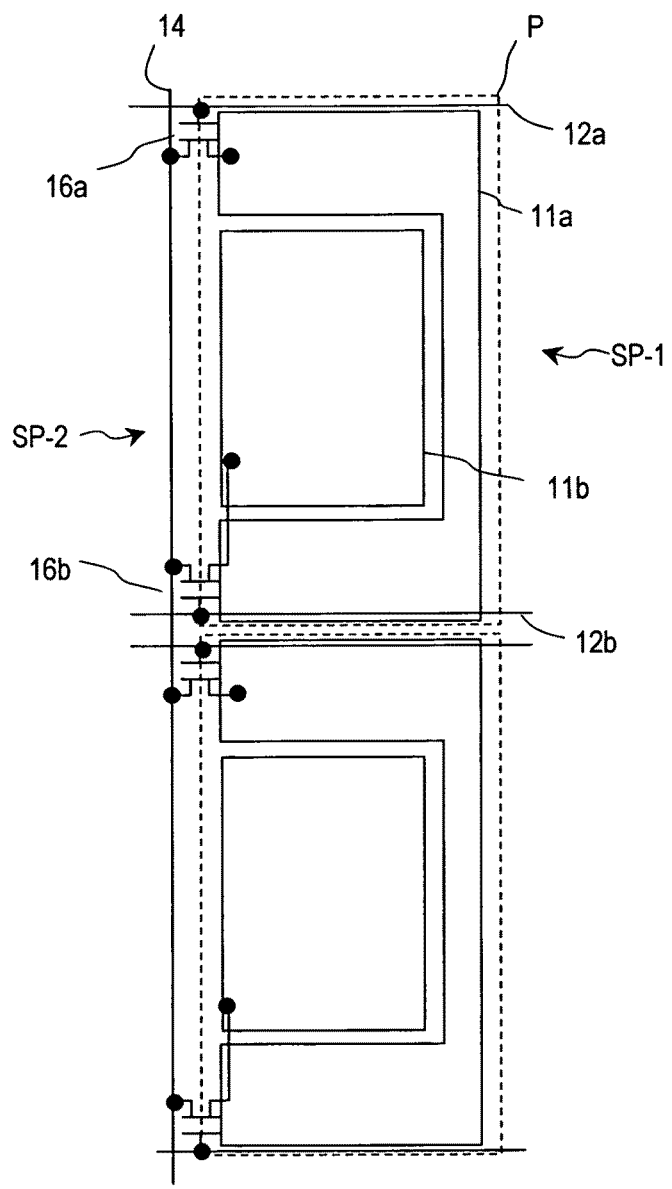

FIG. 32 is a plan view illustrating another exemplary multi-pixel structure for a liquid crystal display device as a preferred embodiment of the present invention.

Figure 33:
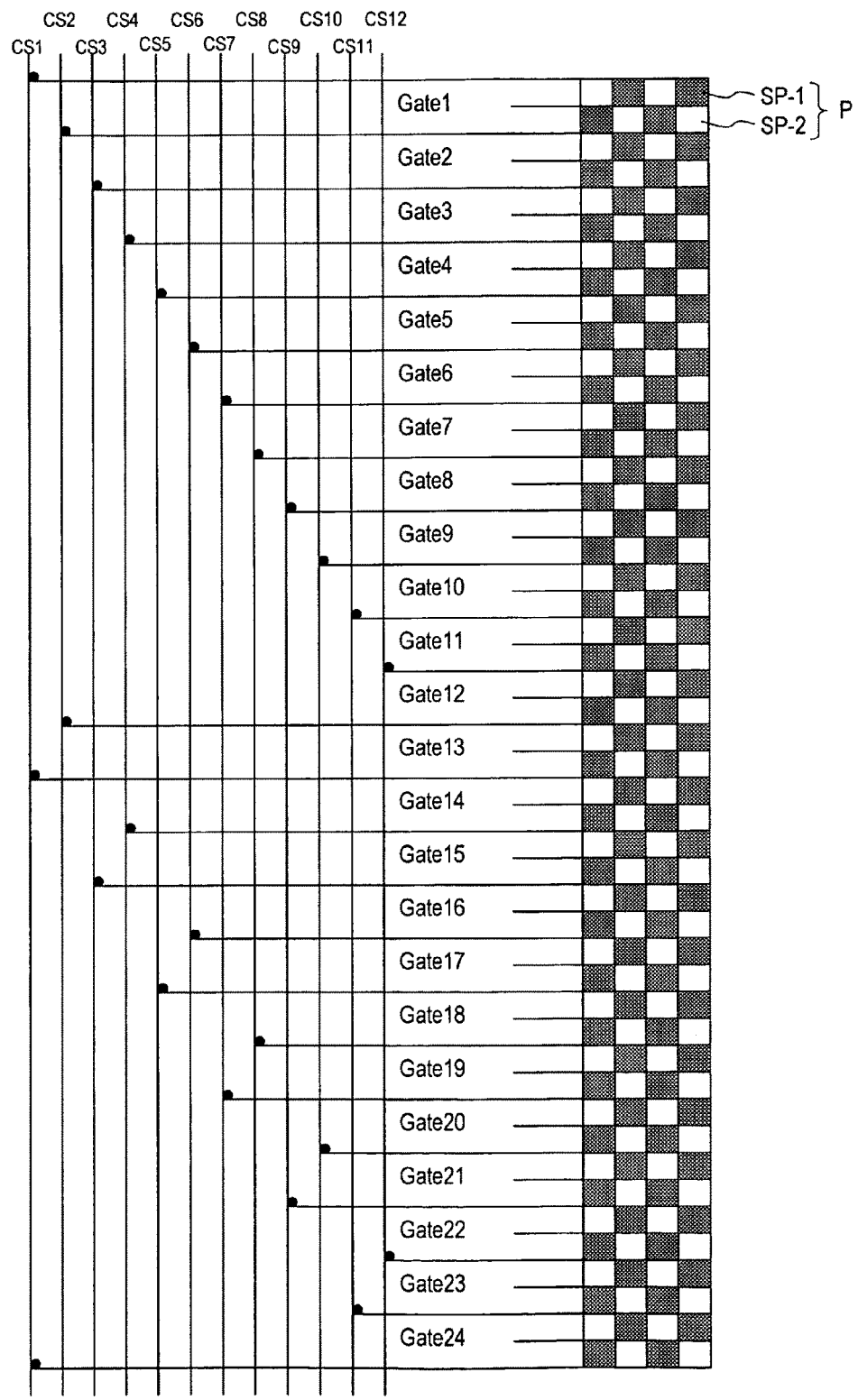

FIG. 33 is a schematic representation illustrating an exemplary connection pattern for CS trunks in a liquid crystal display device as a preferred embodiment of the present invention.

Figure 34:
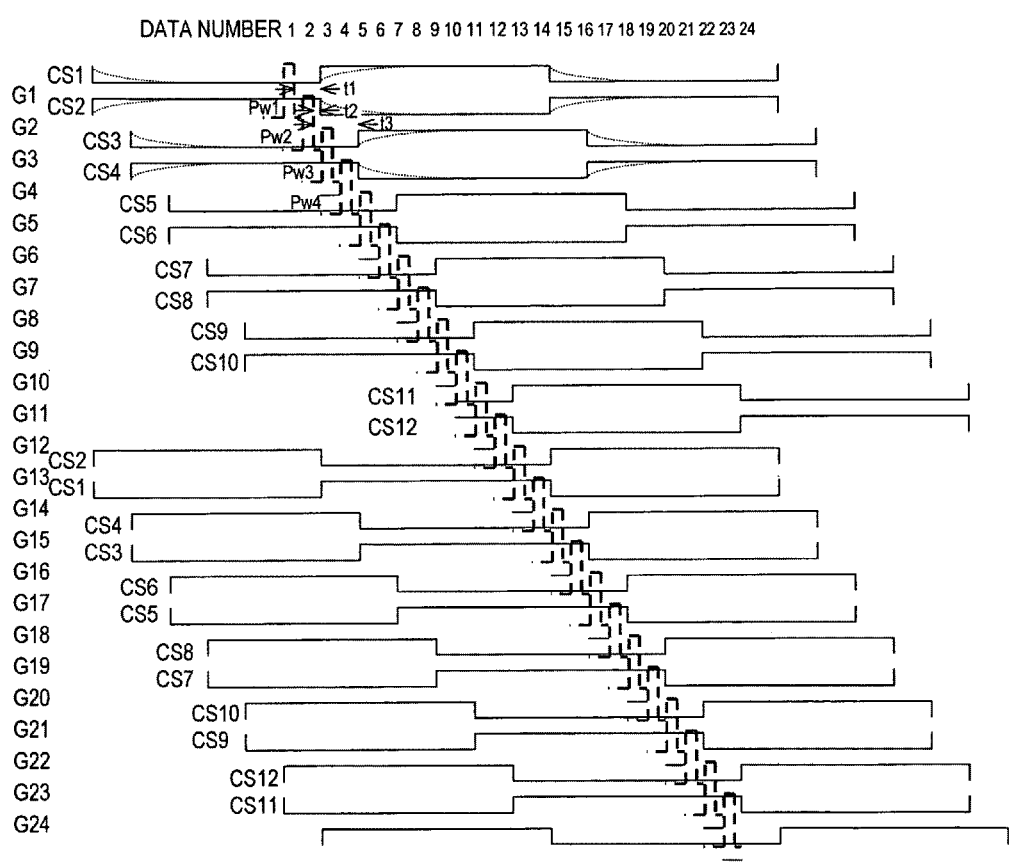

FIG. 34 schematically illustrates the phases of CS voltages and timings to turn TFTs OFF in a situation where a liquid crystal display device with the CS trunk connection pattern shown in FIG. 33 is driven by the dot inversion driving method.

Figure 35:
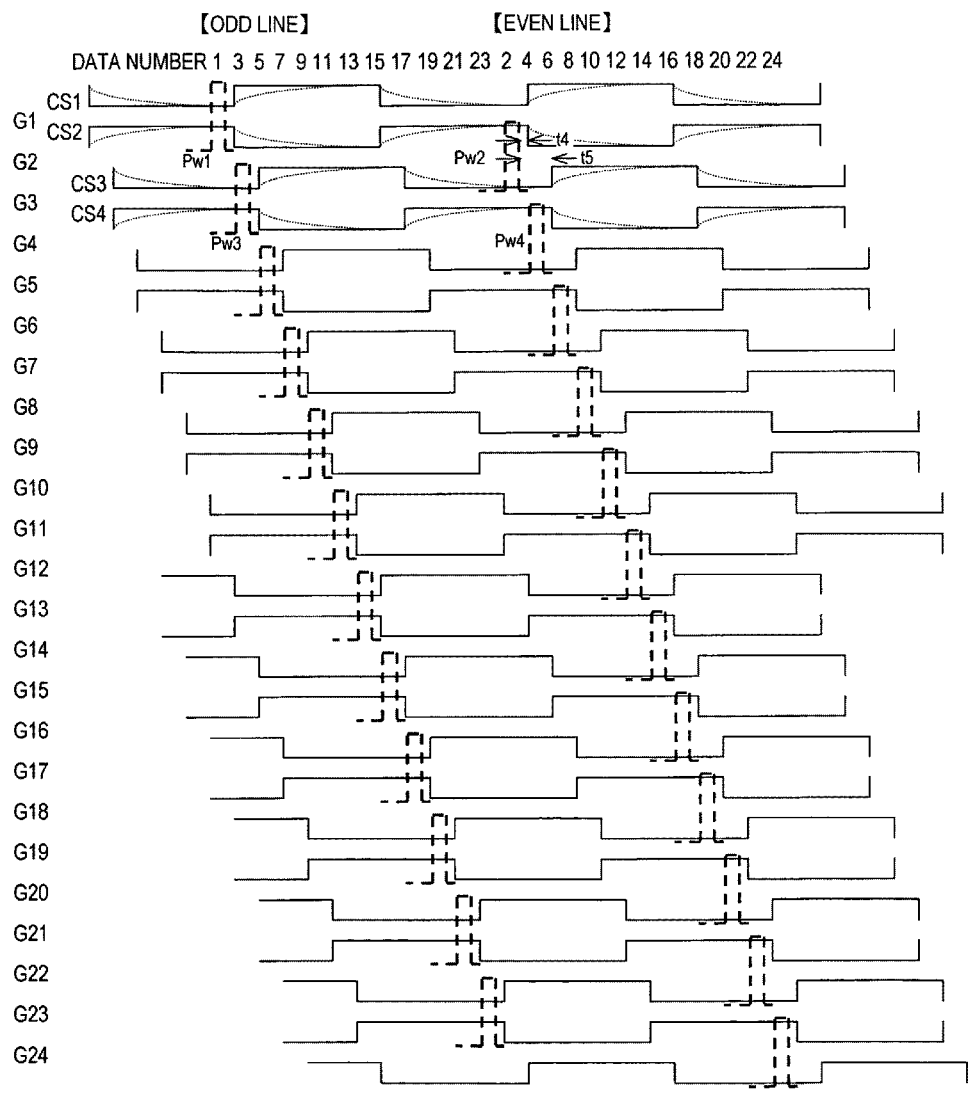

FIG. 35 schematically illustrates the phases of CS voltages and timings to turn TFTs OFF in a situation where a liquid crystal display device with the CS trunk connection pattern shown in FIG. 33 is driven by the block inversion driving method.

Figure 36:
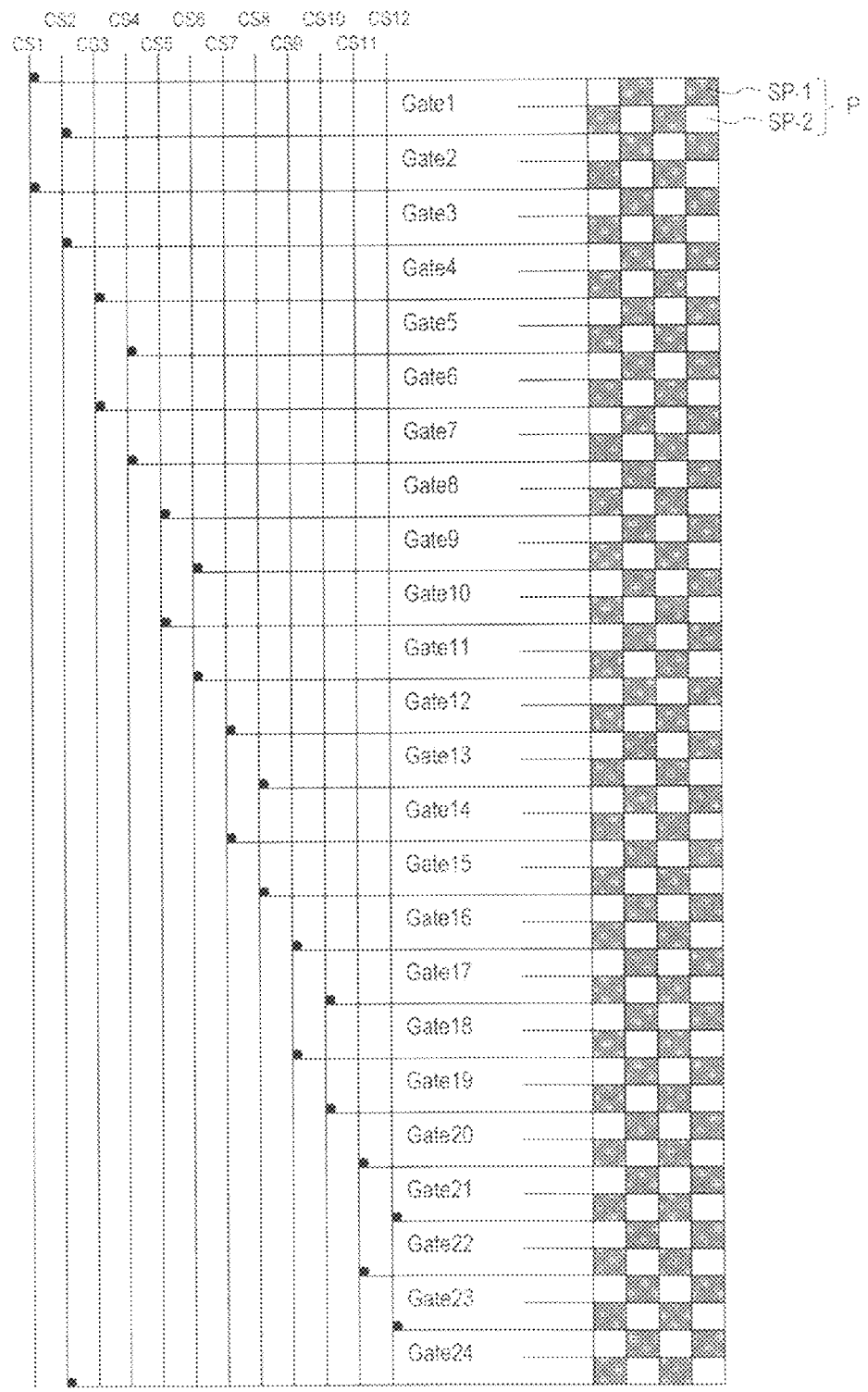

FIG. 36 is a schematic representation illustrating another exemplary connection pattern for CS trunks in a liquid crystal display device as a preferred embodiment of the present invention.

Figure 37:
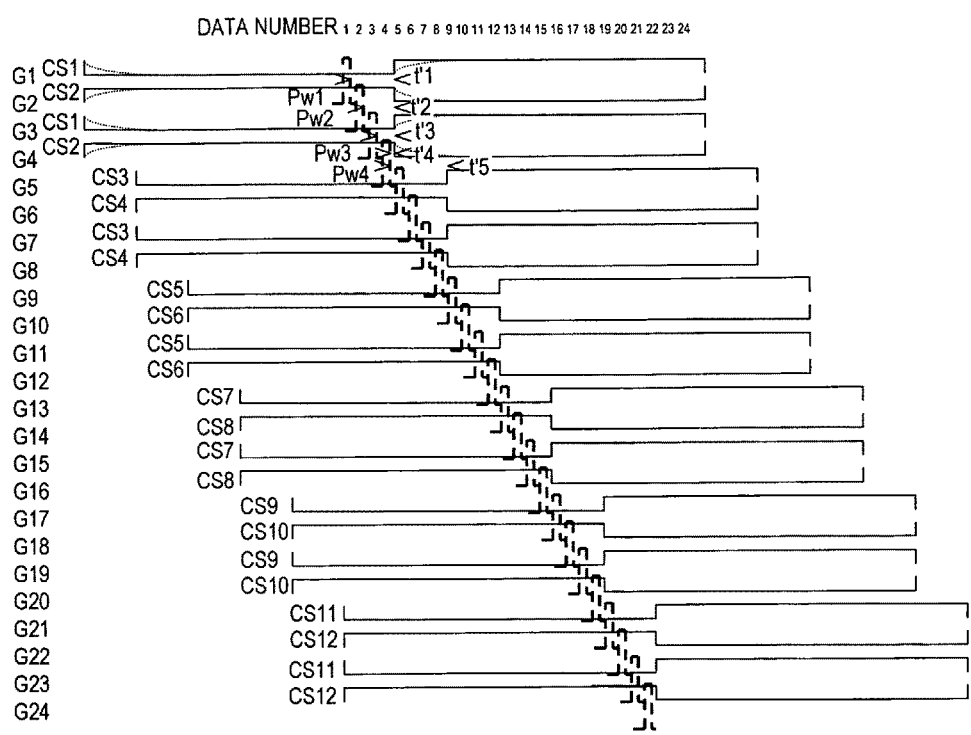

FIG. 37 schematically illustrates the phases of CS voltages and timings to turn TFTs OFF in a situation where a liquid crystal display device with the CS trunk connection pattern shown in FIG. 33 is driven by the dot inversion driving method.

Figure 38:
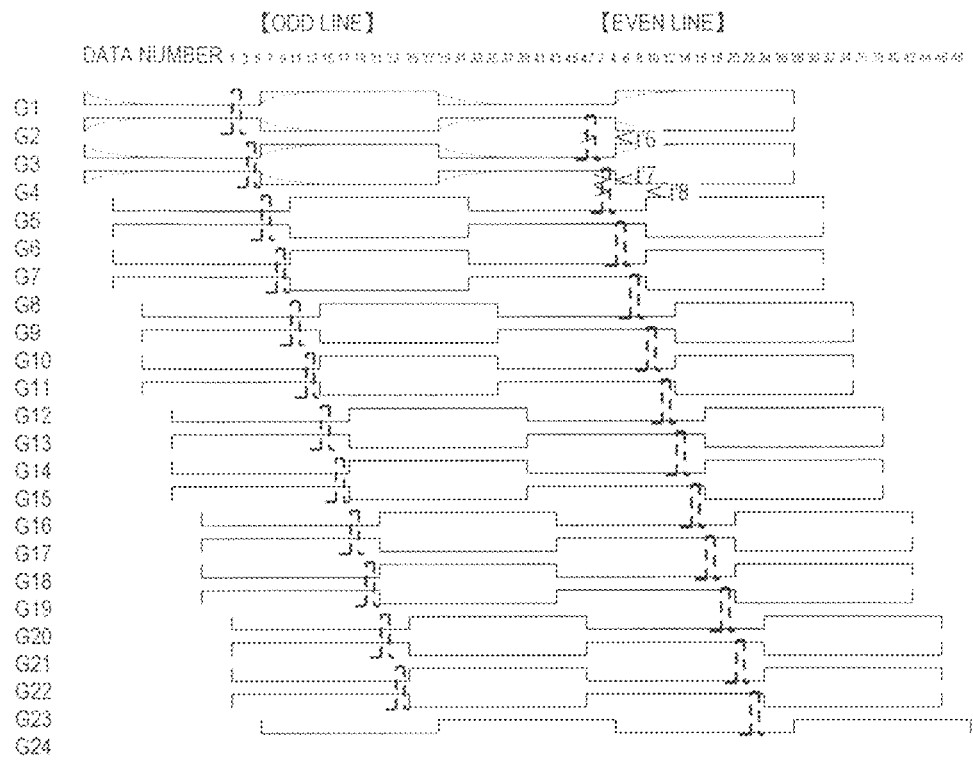

FIG. 38 schematically illustrates the phases of CS voltages and timings to turn TFTs OFF in a situation where a liquid crystal display device with the CS trunk connection pattern shown in FIG. 36 is driven by the dot inversion driving method.

Figure 39:
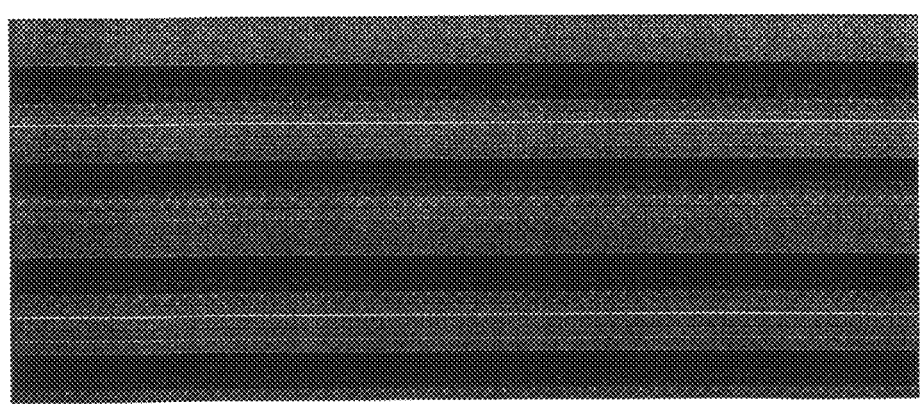

FIG. 39 schematically illustrates a display state of a certain frame when a grayscale tone is displayed over the entire screen by driving the liquid crystal display device with the CS trunk connection pattern shown in FIG. 36 by the dot inversion driving technique.

Figure 40:
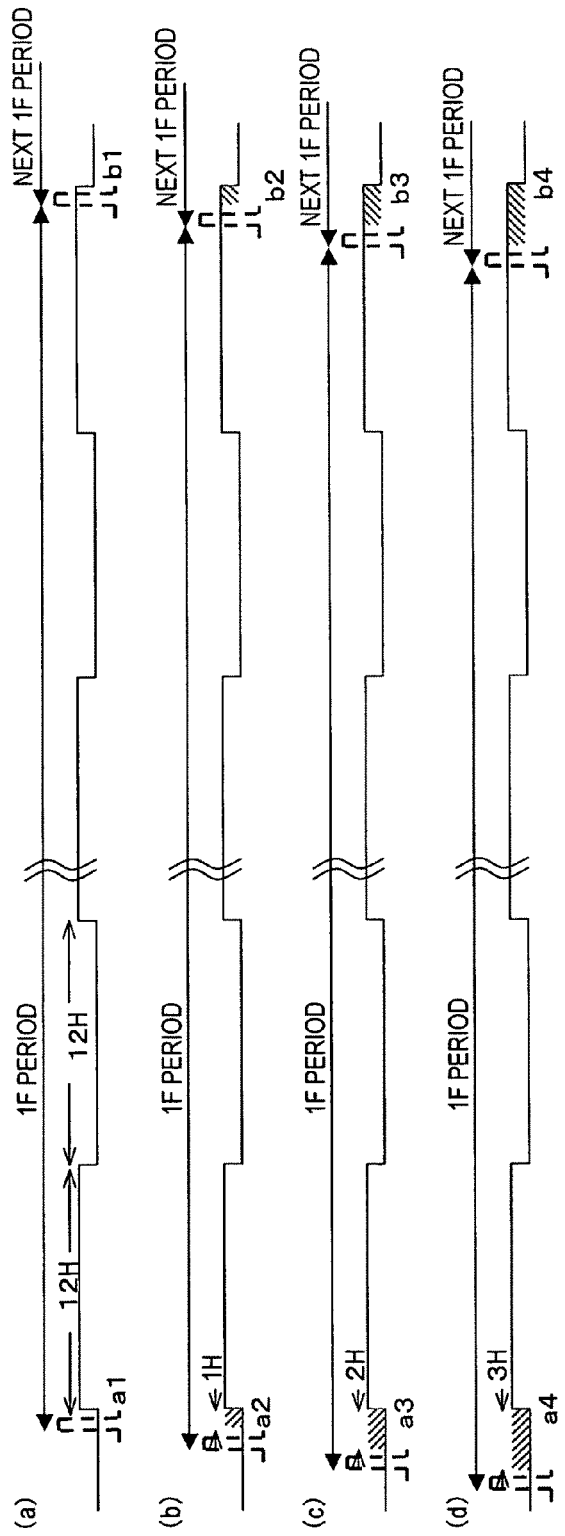

Portions (a) through (d) of FIG. 40 show why and how the frame shown in FIG. 39 is displayed and schematically illustrates relations between the gate ON pulse and the oscillating waveform of a CS voltage in a situation where the interval between the turn-OFF of a TFT and the first change of the CS voltage level varies.

Figure 41:
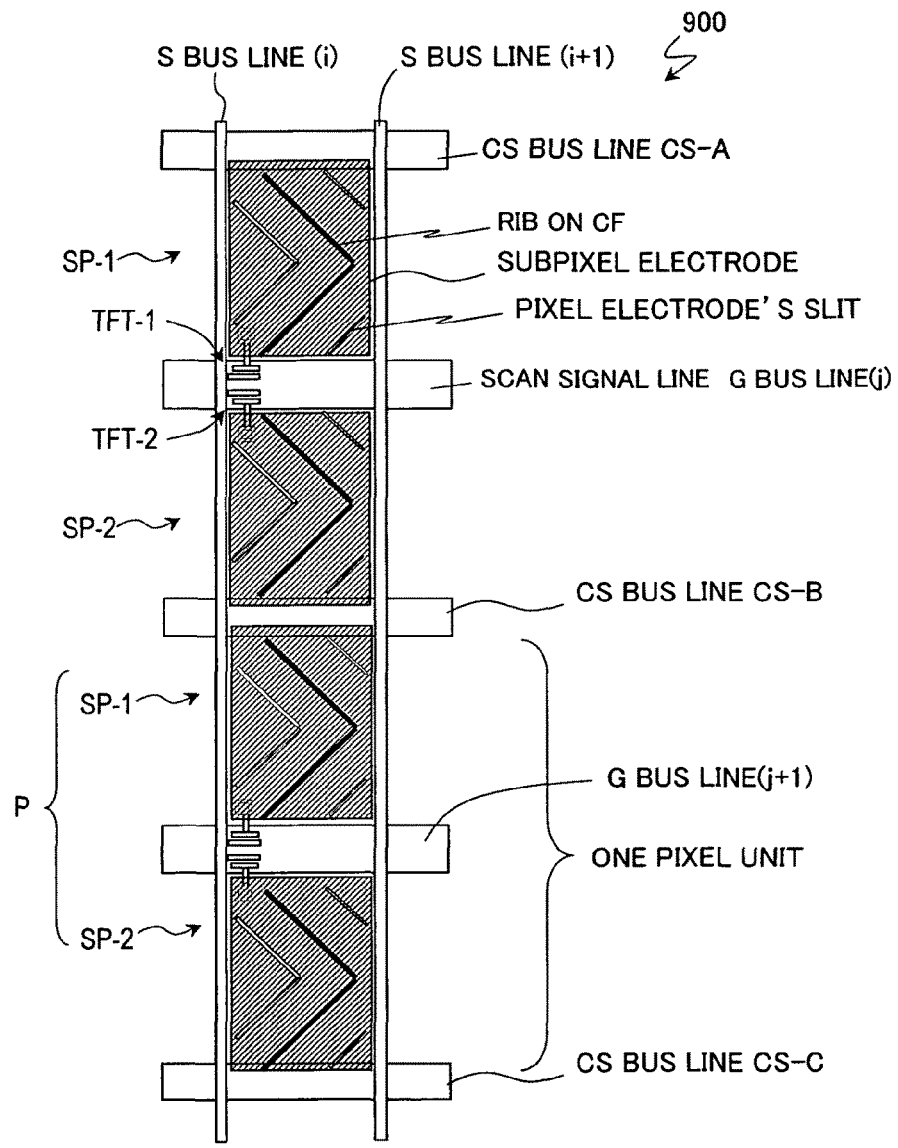

FIG. 41 schematically illustrates a configuration for a conventional MVA mode LCD with a multi-pixel structure by showing the structure of two pixels that are adjacent to each other in the column direction.

Figure 42:
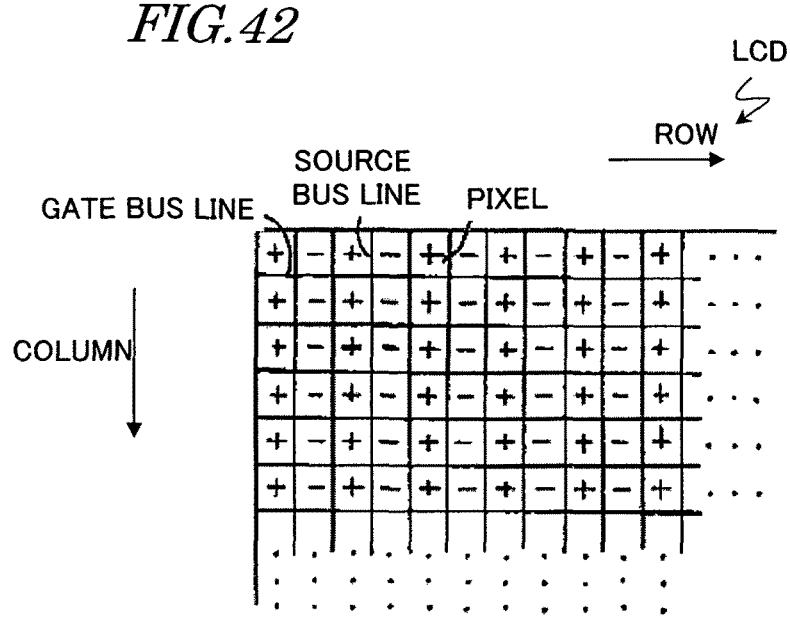

FIG. 42 is a schematic representation illustrating how to perform a source line inversion drive with the arrangement of the polarities (+ or −) of source signal voltages to be written.

Figure 43:
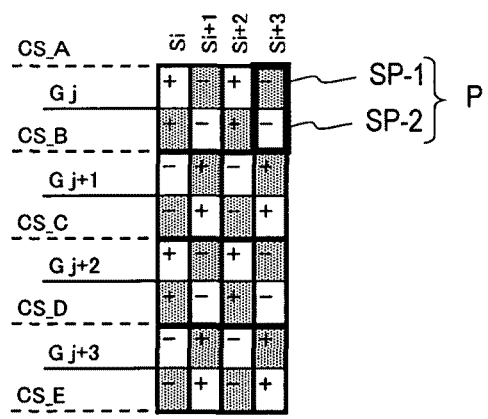

FIG. 43 schematically illustrates how pixels of the liquid crystal display device disclosed in Patent Document No. 2 may be connected to CS bus lines along with the polarities (+ or −) of the source signal voltages written and the arrangement of bright and dark subpixels (of which the shadowed ones are dark subpixels) when the dot inversion drive is performed.

Figure 44:
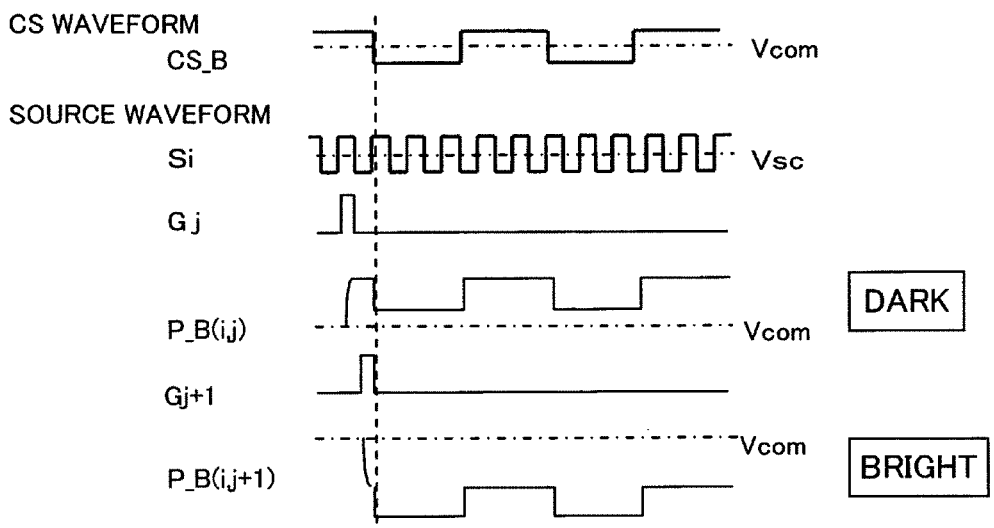

FIG. 44 illustrates the waveforms of respective signal voltages for use in the liquid crystal display device shown in FIG. 43.

Figure 45A:
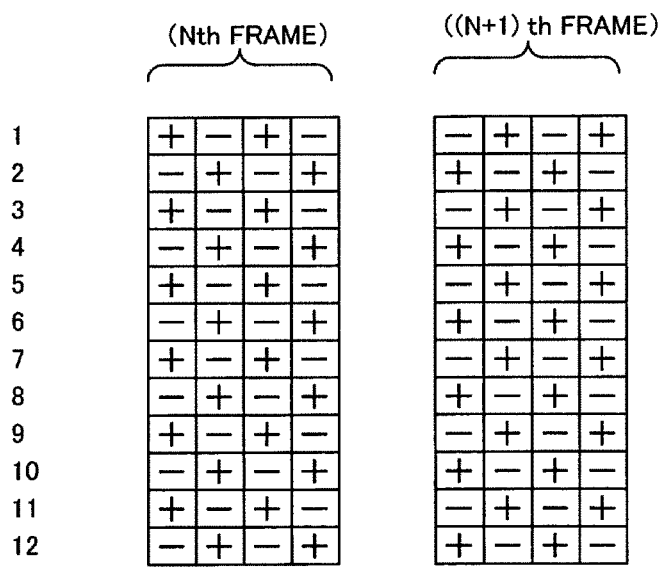

FIG. 45A shows the arrangement of the polarities of source signal voltages to be written in the $N^{th}$ and $(N+1)^{th}$ frames when the liquid crystal display device shown in FIG. 43 is driven by the dot inversion driving technique.

Figure 45B:
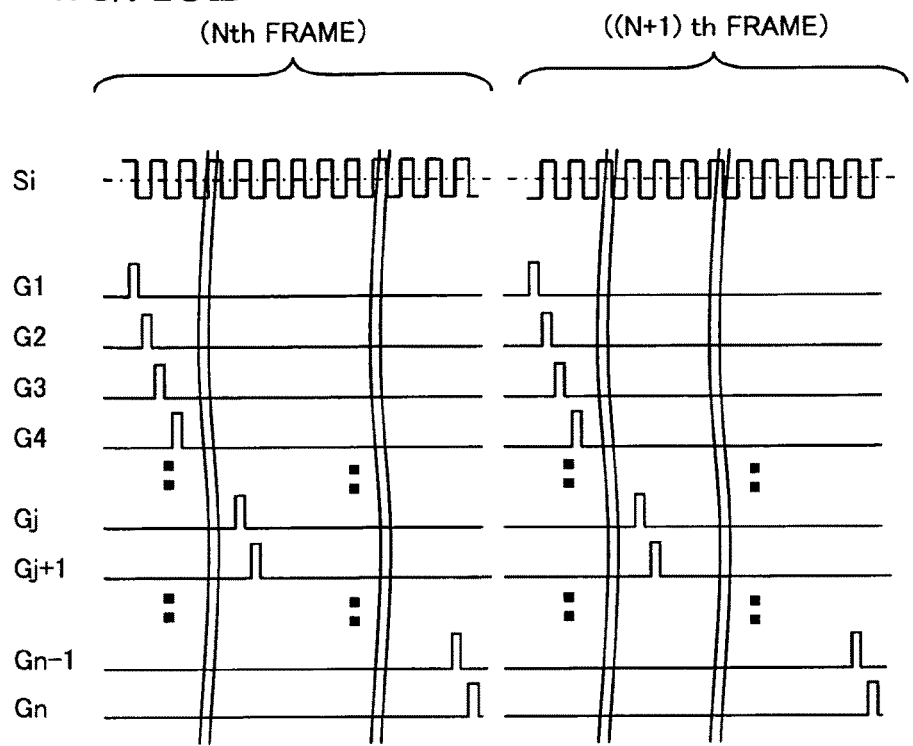

FIG. 45B illustrates the waveforms of respective signals for use to drive the liquid crystal display device shown in FIG. 43 by the dot inversion drive.

Figure 46:
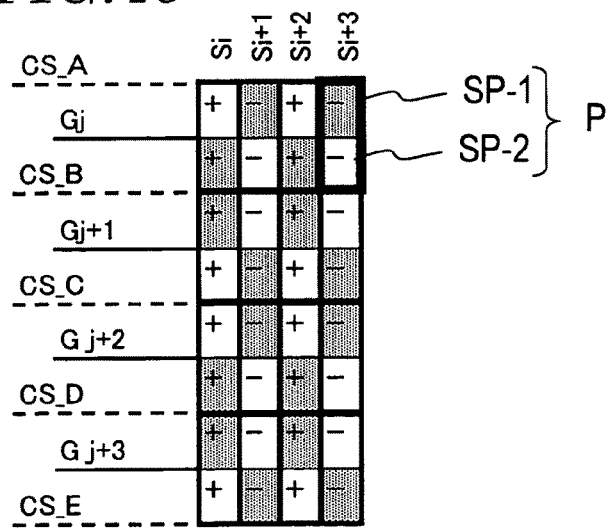

FIG. 46 schematically illustrates how pixels of the liquid crystal display device disclosed in Patent Document No. 2 may be connected to CS bus lines along with the polarities (+ or −) of the source signal voltages written and the arrangement of bright and dark subpixels (of which the shadowed ones are dark subpixels) when the source line inversion drive is performed.

Figure 47:
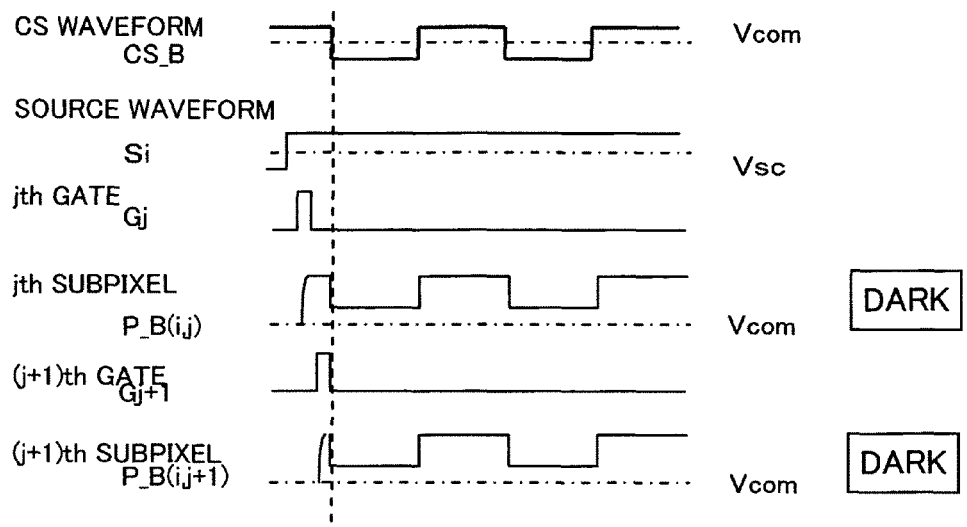

FIG. 47 shows the arrangement of the polarities of source signal voltages to be written in the $N^{th}$ and $(N+1)^{th}$ frames when the liquid crystal display device shown in FIG. 46 is driven by the source line inversion driving technique.

Figure 48A:
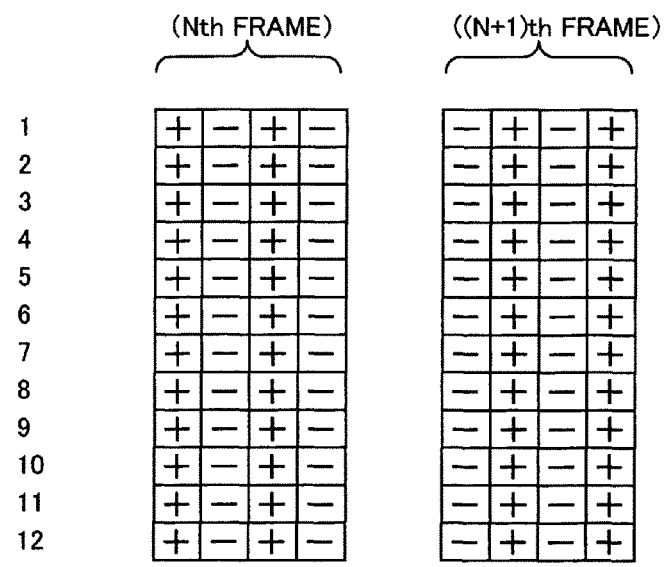

FIG. 48A shows the arrangement of the polarities of source signal voltages to be written in the $N^{th}$ and $(N+1)^{th}$ frames when the liquid crystal display device shown in FIG. 46 is driven by the source line inversion driving technique.

Figure 48B:
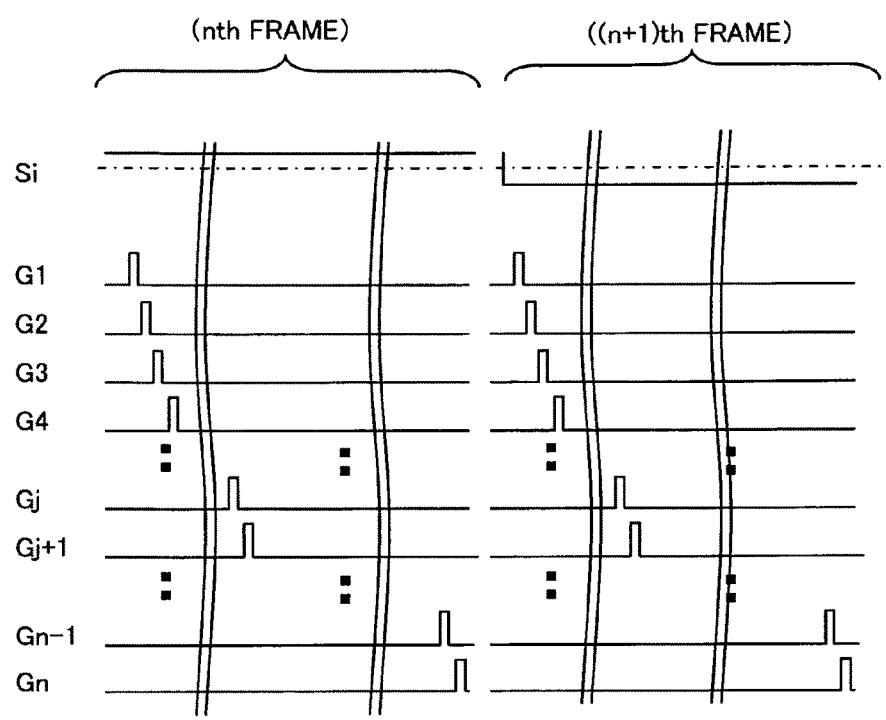

FIG. 48B illustrates the waveforms of respective signals for use to drive the liquid crystal display device shown in FIG. 46 by the source line inversion drive.

DESCRIPTION OF REFERENCE NUMERALS 100 liquid crystal display device
110 LCD panel
120 source driver
130 gate driver
140 CS controller
150 display controller

BEST MODE FOR CARRYING OUT THE INVENTION

Hereinafter, a configuration for a liquid crystal display device as a preferred embodiment of the present invention and how to drive it will be described with reference to the accompanying drawings. However, the present invention is in no way limited to the specific preferred embodiment to be described below.

Source Line Inversion

First of all, it will be described in detail with reference to FIGS. 43 through 45B and FIGS. 46 through 48B what problems the present inventors discovered would arise if the source line inversion drive method was applied to the multi-pixel technology.

Now it will be described with reference to FIGS. 43 through 45B what if the liquid crystal display device with the multi-pixel structure disclosed in Patent Document No. 2 is driven by the dot inversion drive technique.

FIG. 43 schematically illustrates how pixels of the liquid crystal display device disclosed in Patent Document No. 2 are connected to CS bus lines along with the polarities (i.e., + and − signs shown in FIG. 43) of source signal voltages to be written and the arrangement of bright and dark subpixels (where the shadowed ones are dark subpixels). FIG. 44 illustrates the waveforms of respective signal voltages to be applied to the liquid crystal display device. Specifically, the waveforms of the CS voltage supplied through a CS bus line CS-B, the source signal voltage supplied through an $i^{th}$ source bus line, the gate signal voltage supplied through a $j^{th}$ gate bus line, the voltage applied to a subpixel P-B(i, j) that has a storage capacitor connected to the CS bus line CS-B and that is one of the two subpixels of a pixel connected to the $i^{th}$ source bus line Si and the $j^{th}$ gate bus line Gj, the gate signal voltage supplied through the $j^{th}$ gate bus line, and the voltage applied to a subpixel P-B(i, j+1) that has a storage capacitor connected to the CS bus line CS-B and that is one of the two subpixels of a pixel connected to the $i^{th}$ source bus line Si and the $(j+1)^{th}$ gate bus line Gj+1 in this order from top to bottom. Also, in FIG. 44, Vcom denotes a counter voltage. FIG. 45A shows the polarities of source signal voltages to be written on respective pixels in two consecutive frames (i.e., the $N^{th}$ frame and $(N+1)^{th}$ frame in this case). FIG. 45B illustrates how the pixels are scanned in those two consecutive frames and schematically illustrates the waveforms of the source signal voltage supplied through the source bus line Si associated with the $i^{th}$ column and the gate signal voltages supplied through the gate bus lines G1 through Gn associated with the first through $n^{th}$ rows.

Hereinafter, respective drive-related periods for the liquid crystal display device will be defined. In this description, each of one frame period of a non-interlaced drive input video signal and one field period of an interlaced drive input video signal will be referred to herein as "one vertical scanning period V-Total of the input video signal". On the other hand, an interval between a point in time when one scan line (i.e., a gate bus line) is selected to write a display signal voltage (i.e., a source signal voltage) and a point in time when the same scan line is selected again to write the next display signal voltage in a liquid crystal display device will be referred to herein as one "vertical scanning period V-Total". Normally, one vertical scanning period of a liquid crystal display device corresponds to one vertical scanning period of the input video signal. In the example to be described below, one vertical scanning period is supposed to be one frame period and one vertical scanning period of the liquid crystal display panel is supposed to correspond to that of the input video signal for the sake of simplicity. However, the present invention is in no way limited to that specific preferred embodiment. Alternatively, the present invention is also applicable to a so-called "2× drive" with a vertical scanning frequency of 120 Hz in which two vertical scanning periods of the liquid crystal display panel (that lasts 2×1/120 sec, for example) are allocated to one vertical scanning period of the input video signal (that lasts 1/60 sec, for example). In this description, the sign × indicates multiplication.

It should be noted that the length of the time interval satisfies the relation described above. That is why one vertical scanning period as a time interval is equivalent for any scan line. Nevertheless, for a single scan line, one vertical scanning period also means a period for displaying a single picture. That is to say, the start point of one vertical scanning period counts. In view of this consideration, a period allocated to a single picture represented by the input video signal will be referred to herein as a "frame" to tell a frame period and a vertical scanning period from each other. Also, the interval (or time lag) between a point in time when a scan line is selected and a point in time when the next scan line is selected will be referred to herein as "one horizontal scanning period (1H)".

One vertical scanning period V-Total of an input video signal for a display device is made up of an effective display period V-Disp in which video is presented and a vertical blanking interval V-Blank in which no video is presented. For instance, if the display area has 1,080 rows of pixels (which is compatible with a full-spec HDTV), the effective display period is 1,080×one horizontal scanning period (H), the vertical blanking interval is 45×H and one vertical scanning period V-Total is 125×H. The effective display period V-Disp for presenting video is determined by the breadth of the display area (or the number of effective rows of pixels) of an LCD panel. On the other hand, the vertical blanking interval is a signal processing interval and therefore, is not always constant.

In this description, the number of horizontal scanning periods in one vertical scanning period V-Total will be identified herein by Nv-total, the number of horizontal scanning periods in one effective display period V-Disp by Nv-Disp, and the number of horizontal scanning periods in one vertical blanking interval V-Blank by Nv-Blank, respectively. In this example, Nv-total=1,125, V-Disp=1,080 and V-Blank=45. It should be noted that Nv-total is sometimes called "the number of scan lines" and V-Disp is sometimes called "the number of effective scan lines".

As shown in FIG. 43, a single pixel (e.g., a pixel associated with a source bus line Si and a gate bus line Gj) includes a subpixel associated with a CS bus line CS-A (such a subpixel will be sometimes identified herein by "P-A(i, j)") and a subpixel associated with a CS bus line CS-B (such a subpixel will be sometimes identified herein by "P-B(i, j)"). The next pixel associated with the gate bus line Gj+1 includes a subpixel associated with the CS bus line CS-B (such a subpixel will be sometimes identified herein by "P-B(i, j+1)") and a subpixel associated with a CS bus line CS-C (such a subpixel will be sometimes identified herein by "P-C(i, j+1)"). That is to say, in the configuration shown in FIG. 42, the CS bus line CS-B is associated in common with two subpixels that belong to two different pixels and that are adjacent to each other in the column direction. In this manner, each CS bus line is arranged between two pixels that are adjacent to each other in the column direction and is associated in common with two subpixels that belong to those two different pixels and that are adjacent to each other in the column direction.

If signal voltages with the waveforms shown in FIG. 44 are applied, the distribution of write voltage polarities (+ or −) and the distribution of bright and dark subpixels (the shadowed ones of which are dark subpixels) shown in FIG. 43 can be obtained. In the example illustrated in FIG. 43, a dot inversion drive is adopted and the bright and dark subpixels are arranged in a checkerboard pattern.

As the source signal voltage supplied to the source bus line Si is positive when the gate signal voltage on the gate bus line Gj is high, a positive voltage is written on P-B(i, j). As the first change of the oscillating voltage on the CS bus line CS-B after the gate signal voltage on the gate bus line Gj has gone low is a voltage decrease, the voltage at P-B(i, j) is subject to a voltage pull-down and falls. On the other hand, as the signal voltage on the source bus line Si is negative when the gate signal voltage on the gate bus line Gj+1 is high, a negative voltage is written on P-B(i, j+1). As the first change of the oscillating voltage on the CS bus line CS-B after the gate signal voltage on the gate bus line Gj+1 has gone low is a voltage decrease, the voltage at P-B(i, j+1) is subject to a voltage pull-down and falls. Since the voltage at P-B(i, j+1)

has already been negative before it starts to fall, the amplitude of the voltage will rather increase as a result. Consequently, the subpixel P-B(i, j) becomes a dark subpixel and P-B(i, j+1) becomes a bright subpixel.

According to the dot inversion drive method, in both of the $N^{th}$ and $(N+1)^{th}$ frames, source signal voltages of mutually opposite polarities are written on every pair of pixels that are adjacent to each other in the column or row direction as shown in FIG. 45A. On top of that, the polarity of the voltage written on each pixel in the $(N+1)^{th}$ frame is inverse of that of the voltage that has been written on that pixel in the previous $N^{th}$ frame. That is to say, a so-called "frame inversion" is also done.

When such a dot inversion drive is carried out, the gate bus lines G1 through Gn are sequentially selected one after another from one end (e.g., the upper end in this example) of the display area and pixels are selected on a row-by-row basis in both of the $N^{th}$ and $(N+1)^{th}$ frames as shown in FIG. 45B. The source signal voltage Si has a waveform that changes its polarities every horizontal scanning period (which will be identified herein by 1H) but that has constant amplitude. And the source signal voltage Si causes a phase difference of 1H between the $N^{th}$ and $(N+1)^{th}$ frames. Also, although not shown, the source signal voltage supplied through a source bus line Si+1 that is adjacent to the source bus line Si in the row direction has a phase difference of 1H from the one supplied through the source bus line Si.

Next, it will be described with reference to FIGS. 46 through 48B how to drive a liquid crystal display device with the multi-pixel structure disclosed in Patent Document No. 2 by a source line inversion drive technique.

Every pixel shown in FIG. 46 is connected to its associated CS bus line just like its counterpart shown in FIG. 43. However, the drive method shown in FIG. 46 is different from the one shown in FIG. 43 in that voltages of the same polarity are written on all pixels that form a single column. That is to say, the polarity of the source signal voltage supplied through the source bus line Si shown in FIG. 47 remains the same (e.g., positive in this example) through a single frame. Comparing FIG. 48A to FIG. 45A, it can be seen easily that according to the source line inversion drive, voltages of the same polarity are written on a single column of pixels associated with the same source bus line but the polarity of the voltages written on one column is inverse of that of the voltages written on an adjacent column. On top of that, the polarity of the voltage written on each pixel in the $(N+1)^{th}$ frame is inverse of that of the voltage that has been written on that pixel in the previous $N^{th}$ frame. That is to say, a so-called "frame inversion" is also done. As for how to scan the pixels, the gate bus lines G1 through Gn are sequentially selected one after another from one end (e.g., the upper end in this example) of the display area and pixels are selected on a row-by-row basis in both of the $N^{th}$ and $(N+1)^{th}$ frames as shown in FIG. 48B.

Look at FIG. 46 as for the arrangement of bright and dark subpixels, and it can be seen that two subpixels P-B(i, j) and P-B(i, j+1) that are associated with the same CS bus line CS-B, belong to two different pixels and are adjacent to each other in the column direction are both dark subpixels. This is because positive voltages are written on both of these subpixels P-B(i, j) and P-B(i, j+1), which are subjected to a voltage pull-down by the CS voltage supplied through their common CS bus line CS-B as shown in FIG. 47 and therefore both become dark subpixels.

As described above, if the source line inversion drive technique is applied to a liquid crystal display device in which two subpixels that belong to two different pixels and that are adjacent to each other in the column direction are both associated with the same CS bus line, then the bright subpixels of those two adjacent pixels in the column direction will be arranged adjacent to each other as shown in FIG. 46. As a result, the bright and dark subpixels will be distributed unevenly. Generally speaking, a human being tends to sense a pixel or a boundary mainly by detecting bright parts. That is why if the bright and dark subpixels are distributed unevenly as shown in FIG. 46, then the image will look jaggy to the viewer.

Preferred Embodiment of Source Line Inversion Drive

Figure 1:
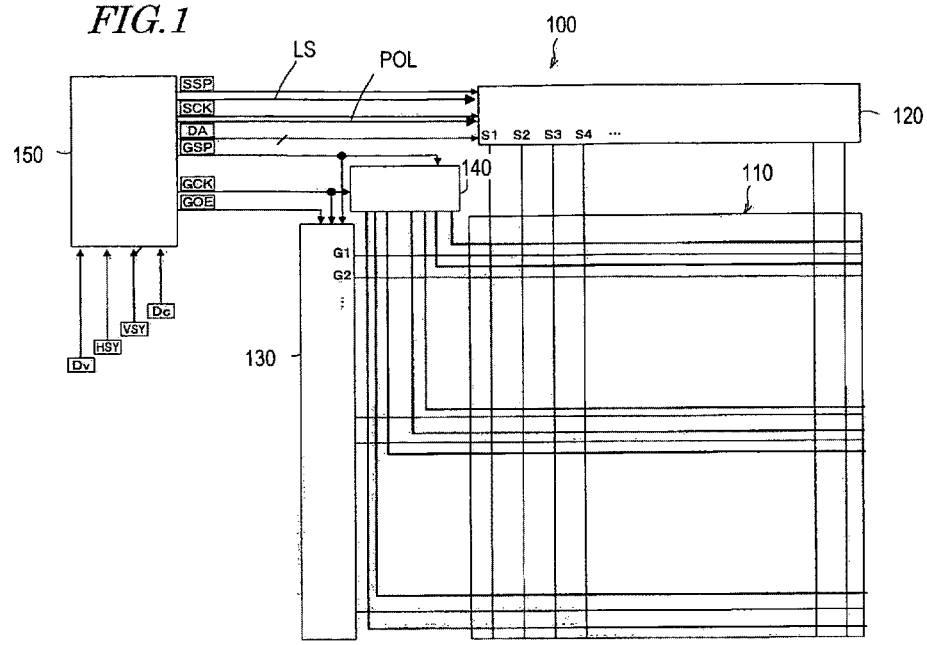
FIG. 1 schematically illustrates a configuration for a liquid crystal display device 100 as a preferred embodiment of the present invention.
Figure 2:
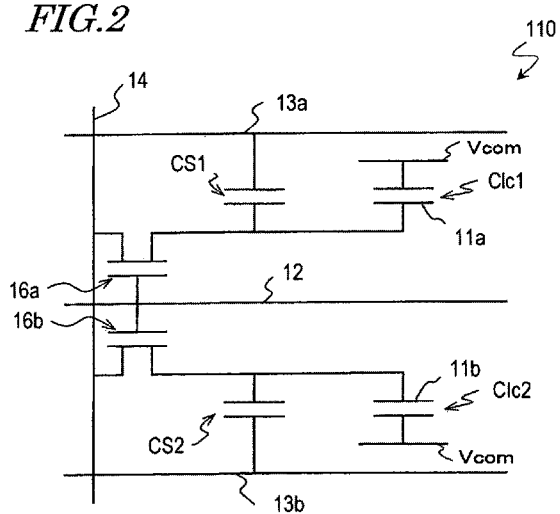
FIG. 2 illustrates an equivalent circuit of a single pixel of the liquid crystal display device 100.

FIG. 1 schematically illustrates a configuration for a liquid crystal display device 100 as a preferred embodiment of the present invention. On the other hand, FIG. 2 illustrates an equivalent circuit of a single pixel of the liquid crystal display device 100.

The liquid crystal display device 100 includes an LCD panel 110, a source driver (or data signal line driver) 120 for supplying source signal voltages to source bus lines S1, etc. (which will be sometimes identified herein by Si collectively), a gate driver (or scan signal line driver) 130 for supplying gate signal voltages to gate bus lines G1, etc., a CS controller 140 for supplying CS voltages to CS bus lines CS1, etc., and a display controller 150 for controlling the source driver 120, the gate driver 130 and the CS controller 140.

The LCD panel 110 may be the same as the counterpart of the liquid crystal display device 900 shown in FIG. 41. An equivalent circuit of one pixel thereof is shown in FIG. 2.

Each pixel of the LCD panel 110 includes two subpixels. The first subpixel SP-1 shown in FIG. 41 includes the liquid crystal capacitor Clc1 and storage capacitor CS1 shown in FIG. 2, while the second subpixel SP-2 shown in FIG. 41 includes the liquid crystal capacitor Clc2 and storage capacitor CS2 shown in FIG. 2. The liquid crystal capacitor Clc1 is formed by a first subpixel electrode 17a, a counter electrode Vcom, and a liquid crystal layer between them. Likewise, the liquid crystal capacitor Clc2 is formed by a second subpixel electrode 17b, the counter electrode Vcom, and the liquid crystal layer between them. The counter electrode is provided in common for these two subpixels and is generally shared by every pixel within the display area. In an LCD panel with a huge screen, however, the counter electrode is sometimes divided into multiple regions.

The pixel shown in FIG. 2 is associated with a source bus line 14 and a gate bus line 12 and their subpixels are associated with TFTs 16a and 16b, respectively. Specifically, the drain electrode of the TFT 16a is connected to the subpixel electrode 11a of its associated subpixel, while the drain electrode of the TFT 16b is connected to the subpixel electrode 11b of its associated subpixel. On the other hand, the respective gate electrodes of the TFTs 16a and 16b are connected in common to the same gate bus line 12 and their source electrodes are connected in common to the same source bus line 14. Also, those subpixels are respectively associated with CS bus lines 13a and 13b that are electrically independent of each other.

The display controller 150 receives, from an external signal source (such as a tuner), a digital video signal Dv representing an image to present, a horizontal sync signal HSY and a vertical sync signal VSY associated with that digital video signal Dv, and a control signal Dc for controlling the display operation. Based on these signals Dv, HSY, VSY and Dc, the display controller 150 generates, as signals to get an image represented by the digital video signal Dv presented on the LCD panel 110, a data start pulse signal SSP, a data clock signal SCK, a latch strobe signal L a signal POL to control the polarity of the data signal, a digital image signal DA representing the image to present, a gate start pulse signal GSP, a gate clock signal GCK and a gate driver output control signal GOE and outputs these signals.

More specifically, the video signal Dv is subjected to timing adjustment and other adjustments by an internal memory, if necessary, and then output as the digital image signal DA from the display controller 150. A data clock signal SCK is generated as a pulse signal associated with each of the pixels of the image represented by that digital image signal DA. The data start pulse signal SSP is generated as a signal that goes high (has H level) for only a predetermined period of time during one horizontal scanning period in response to the horizontal sync signal HSY. Meanwhile, the gate start pulse signal GSP is generated as a signal that goes high for only a predetermined period of time during one frame period (i.e., one vertical scanning period) in response to the vertical sync signal VSY. The gate clock signal GCK is generated based on the horizontal sync signal HSY. And the latch strobe signal LS and the gate driver output control signal GOE are generated based on the horizontal sync signal HSY and the control signal Dc.

Among these signals thus generated by the display controller 150, the digital image signal DA, the latch strobe signal LS, the signal POL to control the polarity of the data signal, the data start pulse signal SSP and the data clock signal SCK are input to the source driver 120. Meanwhile, the gate start pulse signal GSP, the gate clock signal GCK and the gate driver output control signal GOE are input to the gate driver 130.

Based on the digital image signal DA, the data start pulse signal SSP, the data clock signal SCK, the latch strobe signal LS, and the signal POL to control the polarity of the data signal, the source driver 120 sequentially generates data signals one horizontal scanning period after another as analog voltages corresponding to pixel values on respective horizontal scan lines of the image represented by the digital image signal DA. Then, the source driver 120 applies those data signals (i.e., display signal voltages) to the respective source bus lines Si.

Meanwhile, the gate clock signal GCK and the gate start pulse signal GSP are input to the CS controller 140, which controls the waveform of the CS voltage. If an oscillating voltage with a waveform that oscillates at a duty ratio of one to one is used as the CS voltage, the CS controller 140 controls the phase and width (or cycle time) of the oscillation.

The liquid crystal display device 100 is driven by the multi-pixel technology as described above. Specifically, a source signal voltage (i.e., display signal voltage) is supplied through the same source bus line to the first and second subpixel electrodes 11a and 11b. Then, after the respective TFTs 16a and 16b are turned OFF, the voltages on the first and second CS bus lines 13a and 13b are changed so as to be different from each other. As a result, mutually different voltages are applied to the first and second liquid crystal capacitors Clc1 and Clc2, thereby producing a bright subpixel and a dark subpixel within each pixel. According to this scheme, a source signal voltage is supplied through a single source bus line to two subpixel electrodes, and therefore, there is no need to increase the number of source bus lines or source drivers to drive them.

Hereinafter, a preferred embodiment of a method of applying the source line inversion drive to the liquid crystal display device 100 will be described with reference to FIGS. 3 through 5B. FIGS. 3, 4, 5A and 5B correspond to FIGS. 46, 47, 48A and 48B, respectively.

In the liquid crystal display device 100 of this preferred embodiment, the source line inversion drive technique is applied to the multi-pixel drive scheme and a gate bus line skip scanning drive (interlaced scanning drive) is adopted, thereby overcoming the problems described above. According to this preferred embodiment of the present invention, the power dissipated (i.e., the heat generated) by the source driver can be reduced. In addition, even when the image write rate is increased to improve the moving picture display performance, a decrease in charge rate can also be checked.

In the following description of skip scanning drive, odd rows are supposed to be scanned (i.e., even rows are supposed to be skipped) first, and then those even rows are supposed to be scanned. However, the present invention is in no way limited to that specific preferred embodiment. Naturally, even rows may be scanned (i.e., odd rows may be skipped) first, and then those odd rows may be scanned. The same statement will apply to a preferred embodiment of block inversion scanning to be described later.

Figure 3:
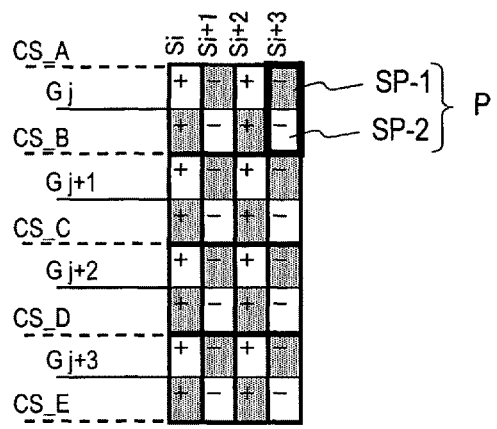
FIG. 3 schematically illustrates how pixels of the liquid crystal display device 100 may be connected to CS bus lines along with the polarities (+ or −) of the source signal voltages written and the arrangement of bright and dark subpixels (of which the shadowed ones are dark subpixels) when a source line inversion drive is performed.

FIG. 3 schematically illustrates how pixels of the liquid crystal display device 100 are connected to CS bus lines along with the polarities (i.e., + or −) of the source signal voltages written and the arrangement of bright and dark subpixels (of which the shadowed ones are dark subpixels). And FIG. 3 illustrates a situation where the liquid crystal display device 100 is driven by the source inversion drive technique. In FIG. 3, Gj through Gj+3 denote gate bus lines, CS-A through CS-E denote CS bus lines, and Si through Si+3 denote source bus lines. As shown in FIG. 3, in the liquid crystal display device of this preferred embodiment, the voltages of the same polarity are written on each column of pixels and yet the bright and dark subpixels are arranged in a checkerboard pattern. As a result, the non-uniform distribution of bright subpixels that has already been described with reference to FIG. 45 has been eliminated. Consequently, the image on the screen will never look jaggy to the viewer.

Figure 4:
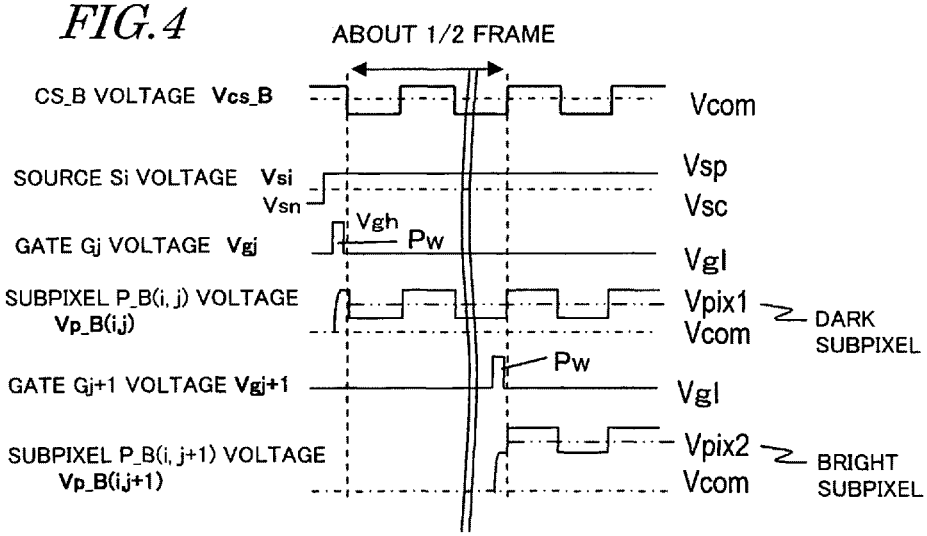
FIG. 4 shows an exemplary arrangement of the polarities of source signal voltages to be written in $N^{th}$ and $(N+1)^{th}$ frames in a situation where the liquid crystal display device 100 is driven by the source line inversion driving method.

FIG. 4 illustrates the waveforms of respective signal voltages to be applied to the liquid crystal display device 100. Specifically, the waveforms of the CS voltage Vcs-B supplied through a CS bus line CS-B, the source signal voltage Vsi supplied through an $i^{th}$ source bus line Si, the gate signal voltage Vgi supplied through a $j^{th}$ gate bus line Gj, the voltage Vp-B(ij) applied to a subpixel P-B(i, j) that has a storage capacitor connected to the CS bus line CS-B and that is one of the two subpixels of a pixel connected to the $i^{th}$ source bus line Si and the $j^{th}$ gate bus line Gj, the gate signal voltage Vgj supplied through the $j^{th}$ gate bus line Gj, and the voltage Vp-B(ij+1) applied to a subpixel P-B(i, j+1) that has a storage capacitor connected to the CS bus line CS-B and that is one of the two subpixels of a pixel connected to the $i^{th}$ source bus line and the $(j+1)^{th}$ gate bus line Gj+1 in this order from top to bottom. Also, in FIG. 4, Vcom denotes a counter voltage and Vpix1 and Vpix2 denote the effective voltages of the respective subpixels.

Figure 5A:
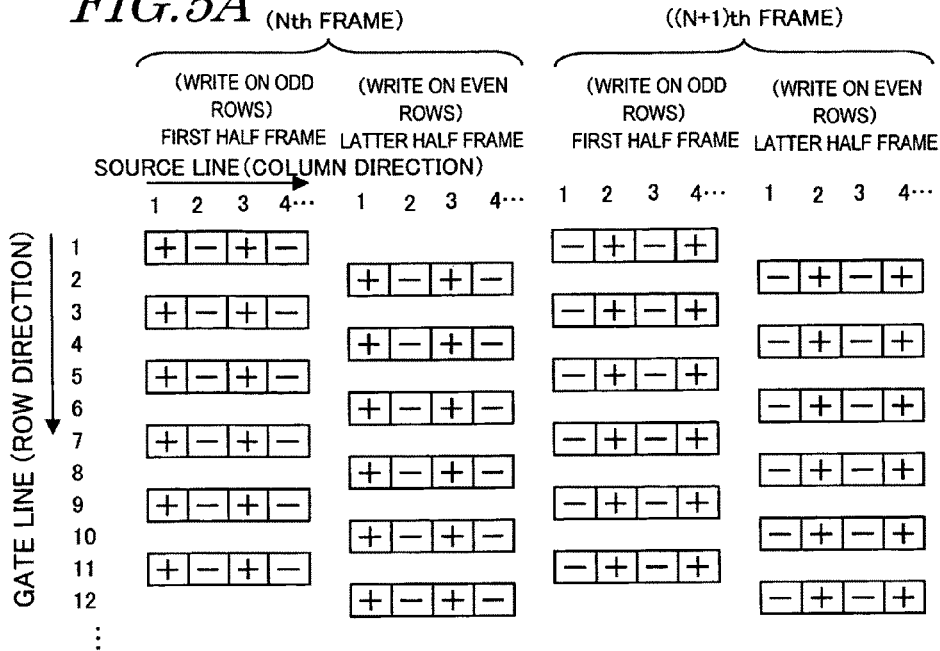
FIG. 5A shows an exemplary arrangement of the polarities of source signal voltages to be written in $N^{th}$ and $(N+1)^{th}$ frames in a situation where the liquid crystal display device 100 is driven by the source line inversion driving method.

FIG. 5A shows the polarities of source signal voltages to be written on respective pixels in two consecutive frames (i.e., the $N^{th}$ frame and $(N+1)^{th}$ frame in this case). The liquid crystal display device 100 of this preferred embodiment performs not only the source line inversion drive but also the gate bus line skip scanning drive (i.e., interlaced scanning drive). That is why in FIG. 5A, each frame is divided into two periods (i.e., the first half frame and the latter half frame). In the following description, each half frame will be sometimes referred to herein as a "½ frame" or "F/2".

Figure 5B:
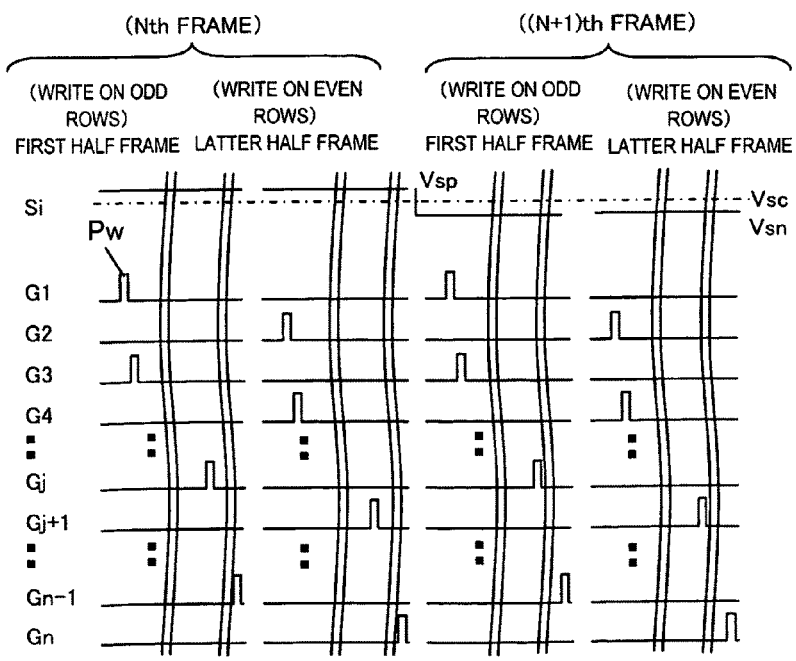
FIG. 5B shows exemplary waveforms of respective signals to be used when the liquid crystal display device 100 is driven by the source line inversion driving method.

FIG. 5B illustrates how the pixels are scanned in those two consecutive frames and schematically illustrates the waveforms of the source signal voltage supplied through the source bus line Si associated with the $i^{th}$ column and the gate signal voltages supplied through the gate bus lines G1 through Gn associated with the first through $n^{th}$ rows. In FIG. 5B, each frame is also divided into two periods (i.e., the first half frame and the latter half frame). These two periods included in a single frame will be referred to herein as "subframes". As one frame period generally corresponds to one vertical scanning period, a period corresponding to one subframe will be referred to herein as a "vertical scanning sub-period". It should be noted that the lengths of the first and second subframes are not always exactly equal to each other.

Hereinafter, it will be described with reference to FIGS. 5A and 5B how to scan the pixels.

In the first half frame (i.e., the first vertical scanning sub-period) of the $N^{th}$ frame, a pixel data write pulse Pw, which is a gate signal voltage Vgj that rises from VgL (Low level) to VgH (High level) and maintains the VgH level for a predetermined period, is sequentially applied to one gate bus line Gj after another that are associated with odd rows. That is to say, the source signal voltages are written on every odd row of pixels from the first row through the $(n-1)^{th}$ row.

Next, in the latter half frame (i.e., the second vertical scanning sub-period), the even rows of pixels that have been skipped in the first half frame are sequentially scanned. For example, a pixel data write pulse Pw, which is a gate signal voltage Vgj that rises from VgL to VgH and maintains the VgH level for a predetermined period, is sequentially applied to one gate bus line Gj+1 after another that are associated with the even rows. That is to say, the source signal voltages are written on every even row of pixels from the second row through the $n^{th}$ row.

The polarity of the source signal voltage supplied to the source bus line Si is positive (as indicated by Vsp) with respect to the center value Vsc of the source signal voltage (which is generally approximately equal to Vcom) in both the first and latter half frames. However, in the next $(N+1)^{th}$ frame, a source signal voltage Vsn that is negative with respect to Vsc is supplied in both the first and latter half frames. The source signal voltage supplied to Si+1 that is adjacent to the source bus line Si has the opposite polarity to the source signal voltage supplied to the source bus line Si. Likewise, the source signal voltage supplied to the source bus line Si+2 has the opposite polarity to the source signal voltage supplied to the source bus line Si+1.

The CS voltage Vcs-B supplied to the CS bus line CS-B has an oscillating waveform, of which the polarity inverts in a regular cycle time with respect to the counter electrode voltage Vcom (e.g., a rectangular wave with a duty ratio of one to one as shown in FIG. 4).

As the source signal voltage supplied to the source bus line Si when the gate signal voltage on the gate bus line Gj is high is positive, a positive voltage is written on P-B(i, j). The CS voltage Vcs-B supplied to the CS bus line CS-B has an oscillating waveform, of which the polarity inverts in a regular cycle time with respect to the counter electrode voltage Vcom (e.g., a rectangular wave with a duty ratio of one to one as shown in FIG. 4). Since the first change of the oscillating voltage Vcs-B on the CS bus line CS-B after the gate signal voltage on the gate bus line Gj has gone low is a voltage decrease (e.g., a fall from a positive voltage into a negative one in this case), the voltage at P-B(i, j) is subjected to a voltage pull-down and falls. As a result, the effective voltage Vpix1 applied to the subpixel P-B(i, j) becomes equal to or lower than the source signal voltage that has been written in response to Pw (i.e., comes to have a decreased amplitude). Consequently, the subpixel P-B(i, j) becomes a dark subpixel.

On the other hand, as the signal voltage on the source bus line Si when the gate signal voltage on the gate bus line Gj+1 is high is also positive, a positive voltage is also written on P-B(i, j+1). Since the first change of the oscillating voltage on the CS bus line CS-B after the gate signal voltage on the gate bus line Gj+1 has gone low is a voltage increase (e.g., a rise from a negative voltage into a positive one in this case), the voltage at P-B(i, j+1) is subjected to a voltage pull-up and rises. As a result, the effective voltage Vpix2 applied to the subpixel P-B(i, j+1) becomes equal to or higher than the source signal voltage that has been written in response to Pw (i.e., comes to have an increased amplitude). Consequently, the subpixel P-B(i, j+1) becomes a bright subpixel.

That is to say, the CS voltage has a waveform that alternately performs the function of increasing or decreasing the effective voltage of one of two subpixels, which is associated with a CS bus line supplied with the CS voltage, in each of pixels that are connected to the gate bus line Gj to be selected during the first vertical scanning sub-period, and the function of increasing or decreasing the effective voltage of one of two subpixels, which is associated with a CS bus line supplied with the CS voltage, in each of pixels that are connected to the gate bus line Gj+1 to be selected during the second vertical scanning sub-period.

If there are two consecutive vertical scanning periods in which the source signal voltages have mutually opposite polarities but if the source signal voltages have the same polarity through the first and second vertical scanning sub-periods of the same vertical scanning period as in the example described above, then the CS voltage needs to change its polarities an odd number of times since a gate signal voltage supplied to the gate bus line Gj has changed from high into low during the first vertical scanning sub-period and until a gate signal voltage supplied to the gate bus line Gj+1 changes from high into low during the second vertical scanning sub-period. Considering that the oscillating waveform of the CS voltage could get blunted, the interval at which the polarity is inverted (which is a half of one oscillation period) is more preferably at least as long as 5H. Also, the gate ON pulse Pw is preferably generated as late as possible after the CS voltage has inverted its polarity. And after the gate signal voltage has gone low, the polarity of the CS voltage is preferably inverted as early as possible. Actually, by simulating signal delays based on the resistance and capacitance values of CS bus lines, the polarity inversion interval is preferably determined so that the CS voltage will reach at least 97%, more preferably 99% or more, of its maximum level when its associated gate signal voltage goes low.

In the preferred embodiment described above, the CS voltage is supposed to be an oscillating voltage that has a waveform oscillating at a duty ratio of one to one. However, the present invention is in no way limited to that specific preferred embodiment. The CS voltage only needs to change its polarities an odd number of times, and therefore, has to change its polarities once to say the least. Nevertheless, if the CS bus lines are arranged as described above, the oscillating voltage applied to the storage capacitor counter electrode through a CS bus line can have its oscillation period extended by providing electrically independent CS trunks and connecting the CS bus lines to those CS trunks as disclosed in WO 2006/070829 A1, the entire disclosure of which is hereby incorporated by reference.

As described above, the liquid crystal display device and its driving method according to this preferred embodiment never loses the checkerboard pattern of bright and dark subpixels while achieving the effects of the source inversion drive mentioned above. As a result, deterioration in display quality such as a jaggy look can be prevented.

Next, another preferred embodiment of a method of applying the source line inversion drive to the liquid crystal display device 100 will be described with reference to FIGS. 6 through 8B. FIGS. 6, 7, 8A and 8B correspond to FIGS. 3, 4, 5A and 5B, respectively.

The method to be described below is different from the method that has just been described in that there are two consecutive vertical scanning sub-periods in which the source signal voltages have mutually opposite polarities and that the source signal voltages also have opposite polarities in the first and second vertical scanning sub-periods of the same vertical scanning period. Also, unlike the preferred embodiment described above, the CS voltage inverts its polarity an even number of times since a gate signal voltage supplied to the $j^{th}$ gate bus line has changed from high into low during the first vertical scanning sub-period and until a gate signal voltage supplied to the gate bus line changes from high into low during the second vertical scanning sub-period.

Figure 6:
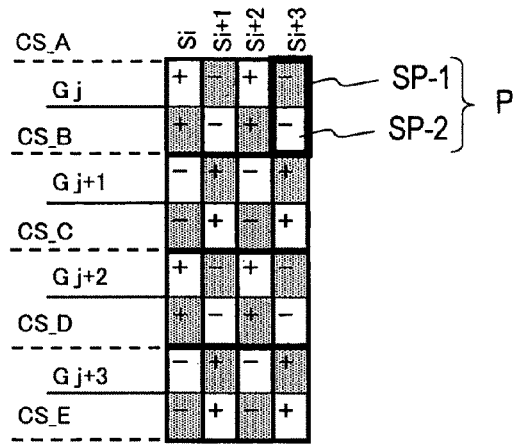
FIG. 6 schematically illustrates how pixels of the liquid crystal display device 100 may also be connected to CS bus lines along with the polarities (+ or −) of the source signal voltages written and the arrangement of bright and dark subpixels (of which the shadowed ones are dark subpixels) when the source line inversion drive is performed.

FIG. 6 schematically illustrates how pixels of the liquid crystal display device 100 are connected to CS bus lines along with the polarities (i.e., + or −) of the source signal voltages written and the arrangement of bright and dark subpixels (of which the shadowed ones are dark subpixels). And FIG. 6 illustrates a situation where the liquid crystal display device 100 is driven by the source inversion drive technique. As shown in FIG. 6, in the liquid crystal display device of this preferred embodiment, even though the source inversion drive scheme is adopted, the distribution of the polarities of voltages written on respective pixels is the same as that of the conventional dot inversion drive scheme shown in FIG. 43. And the bright and dark subpixels are arranged in a checkerboard pattern. As a result, the non-uniform distribution of bright subpixels that has already been described with reference to FIG. 46 has been eliminated. Consequently, the image on the screen will never look jaggy to the viewer.

Figure 7:
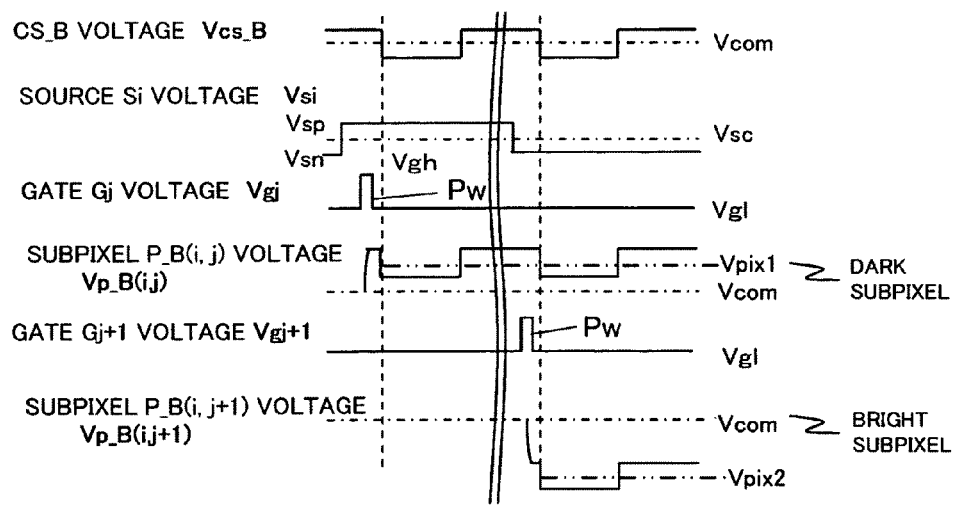
FIG. 7 shows another exemplary arrangement of the polarities of source signal voltages to be written in the $N^{th}$ and $(N+1)^{th}$ frames in a situation where the liquid crystal display device 100 is driven by the source line inversion driving method.

FIG. 7 illustrates the waveforms of respective signal voltages to be applied to the liquid crystal display device 100. Specifically, the waveforms of the CS voltage Vcs-B supplied through a CS bus line CS-B, the source signal voltage Vsi supplied through an $i^{th}$ source bus line Si, the gate signal voltage Vgi supplied through a $j^{th}$ gate bus line Gj, the voltage Vp-B(i,j) applied to a subpixel P-B(i, j) that has a storage capacitor connected to the CS bus line CS-B and that is one of the two subpixels of a pixel connected to the $i^{th}$ source bus line Si and the $j^{th}$ gate bus line Gj, the gate signal voltage Vgj supplied through the $j^{th}$ gate bus line Gj, and the voltage Vp-B(i,j+1) applied to a subpixel P-B(i, j+1) that has a storage capacitor connected to the CS bus line CS-B and that is one of the two subpixels of a pixel connected to the $i^{th}$ source bus line and the $(j+1)^{th}$ gate bus line Gj+1 in this order from top to bottom. Also, in FIG. 7, Vcom denotes a counter voltage and Vpix1 and Vpix2 denote the effective voltages of the respective subpixels.

Figure 8A:
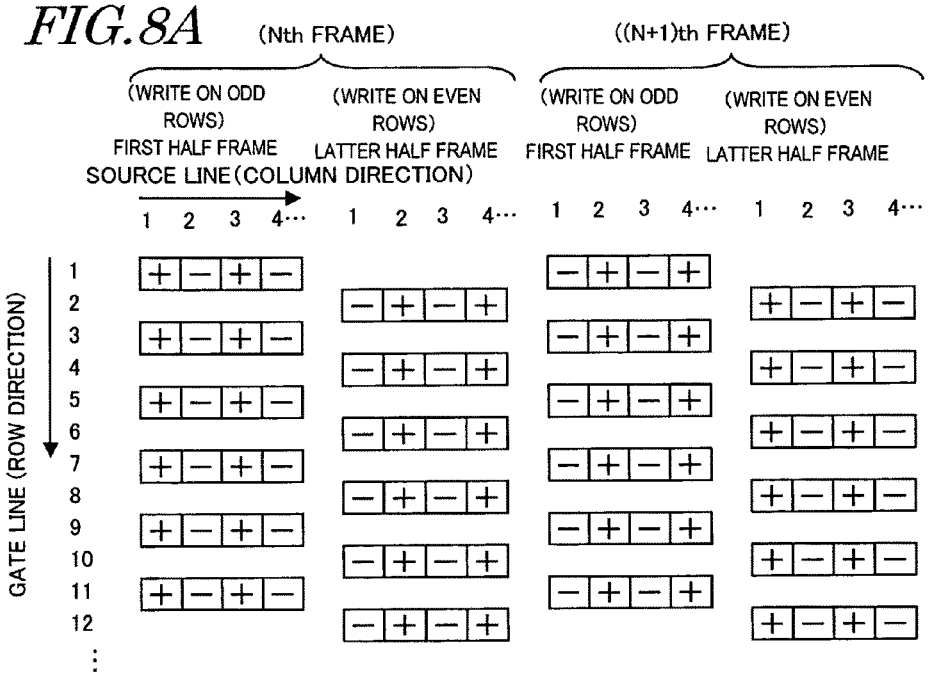
FIG. 8A shows another exemplary arrangement of the polarities of source signal voltages to be written in the $N^{th}$ and $(N+1)^{th}$ frames in a situation where the liquid crystal display device 100 is driven by the source line inversion driving method.

FIG. 8A shows the polarities of source signal voltages to be written on respective pixels in two consecutive frames (i.e., the $N^{th}$ frame and $(N+1)^{th}$ frame in this case). The liquid crystal display device 100 of this preferred embodiment performs not only the source line inversion drive but also the gate bus line skip scanning drive (i.e., interlaced scanning drive). That is why in FIG. 8A, each frame is divided into two periods (i.e., the first half frame and the latter half frame). Also, in those two periods of the same frame, the source signal voltages have mutually opposite polarities.

Figure 8B:
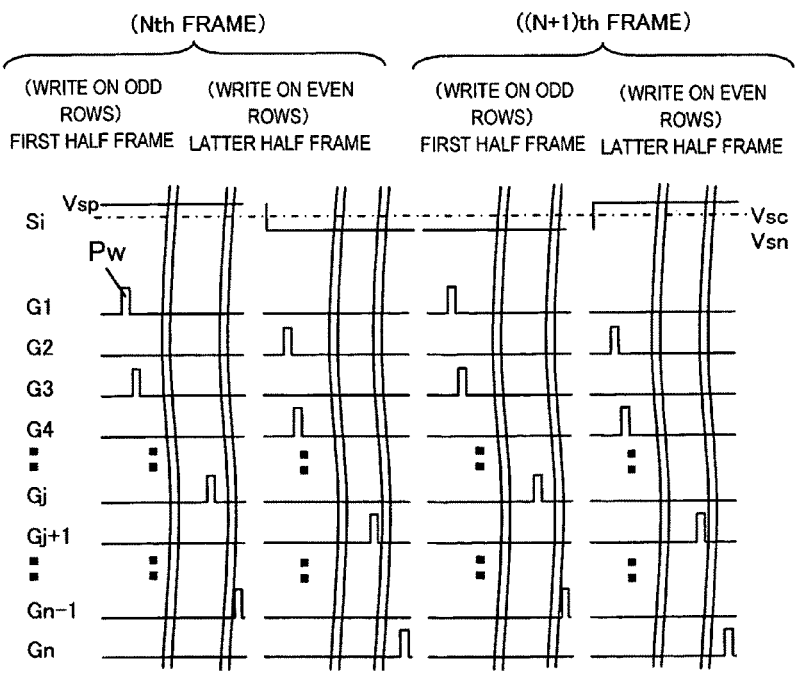
FIG. 8B shows other exemplary waveforms of respective signals to be used when the liquid crystal display device 100 is driven by the source line inversion driving method.

FIG. 8B illustrates how the pixels are scanned in those two consecutive frames and schematically illustrates the waveforms of the source signal voltage supplied through the source bus line Si associated with the $i^{th}$ column and the gate signal voltages supplied through the gate bus lines G1 through Gn associated with the first through $n^{th}$ rows. In FIG. 8B, each frame is also divided into two periods (i.e., the first half frame and the latter half frame). These two periods included in a single frame will be referred to herein as "subframes". As one frame period generally corresponds to one vertical scanning period, a period corresponding to one subframe will be referred to herein as a "vertical scanning sub-period". It should be noted that the lengths of the first and second subframes are not always exactly equal to each other.

Hereinafter, it will be described with reference to FIGS. 8A and 8B how to scan the pixels.

In the first half frame (i.e., the first vertical scanning sub-period) of the $N^{th}$ frame, a pixel data write pulse Pw, which is a gate signal voltage Vgj that rises from VgL (Low level) to VgH (High level) and maintains the VgH level for a predetermined period, is sequentially applied to one gate bus line Gj after another that are associated with odd rows. That is to say, the source signal voltages are written on every odd row of pixels from the first row through the $(n-1)^{th}$ row.

Next, in the latter half frame (i.e., the second vertical scanning sub-period), the even rows of pixels that have been skipped in the first half frame are sequentially scanned. For example, a pixel data write pulse Pw, which is a gate signal voltage Vgj that rises from VgL to VgH and maintains the VgH level for a predetermined period, is sequentially applied to one gate bus line Gj+1 after another that are associated with the even rows. That is to say, the source signal voltages are written on every even row of pixels from the second row through the $n^{th}$ row. This is the same scanning method as what has already been described for the previous preferred embodiment.

The polarity of the source signal voltage supplied to the source bus line Si is positive (as indicated by Vsp) with respect to the center value Vsc of the source signal voltage (which is generally approximately equal to Vcom) in the first half frame but is negative (as indicated by Vsn) with respect to the center value Vsc of the source signal voltage in the latter half frame, respectively. Likewise, in the next $(N+1)^{th}$ frame, a source signal voltage Vsp that is positive with respect to Vsc is supplied in the first half frame and a source signal voltage Vsn that is negative with respect to Vsc is supplied in the latter half frame. The source signal voltage supplied to Si+1 that is adjacent to the source bus line Si has the opposite polarity to the source signal voltage supplied to the source bus line Si. Likewise, the source signal voltage supplied to the source bus line Si+2 has the opposite polarity to the source signal voltage supplied to the source bus line Si+1.

The CS voltage Vcs-B supplied to the CS bus line CS-B has an oscillating waveform, of which the polarity inverts in a regular cycle time with respect to the counter electrode voltage Vcom (e.g., a rectangular wave with a duty ratio of one to one as shown in FIG. 7).

As the source signal voltage supplied to the source bus line Si when the gate signal voltage on the gate bus line Gj is high is positive, a positive voltage is written on P-B(i, j). The CS voltage Vcs-B supplied to the CS bus line CS-B has an oscillating waveform, of which the polarity inverts in a regular cycle time with respect to the counter electrode voltage Vcom (e.g., a rectangular wave with a duty ratio of one to one as shown in FIG. 7). Since the first change of the oscillating voltage Vcs-B on the CS bus line CS-B after the gate signal voltage on the gate bus line Gj has gone low is a voltage decrease (e.g., a fall from a positive voltage into a negative one in this case), the voltage at P-B(i, j) is subjected to a voltage pull-down and falls. As a result, the effective voltage Vpix1 applied to the subpixel P-B(i, j) becomes equal to or lower than the source signal voltage that has been written in response to Pw (i.e., comes to have a decreased amplitude). Consequently, the subpixel P-B(i, j) becomes a dark subpixel.

On the other hand, as the signal voltage on the source bus line Si when the gate signal voltage on the gate bus line Gj+1 is high is negative, a negative voltage is written on P-B(i, j+1). Since the first change of the oscillating voltage on the CS bus line CS-B after the gate signal voltage on the gate bus line Gj+1 has gone low is a voltage decrease (e.g., a fall from a positive voltage into a negative one in this case), the voltage at P-B(i, j+1) is subjected to a voltage pull-down and falls. As a result, the effective voltage Vpix2 applied to the subpixel P-B(i, j+1) becomes equal to or higher than the source signal voltage that has been written in response to Pw (i.e., comes to have an increased amplitude). Consequently, the subpixel P-B(i, j+1) becomes a bright subpixel.

That is to say, the CS voltage has a waveform that alternately performs the function of increasing or decreasing the effective voltage of one of two subpixels, which is associated with a CS bus line supplied with the CS voltage, in each of pixels that are connected to the gate bus line Gj to be selected during the first vertical scanning sub-period, and the function of increasing or decreasing the effective voltage of one of two subpixels, which is associated with a CS bus line supplied with the CS voltage, in each of pixels that are connected to the gate bus line Gj+1 to be selected during the second vertical scanning sub-period.

If there are two consecutive vertical scanning sub-periods in which the source signal voltages have mutually opposite polarities and if the source signal voltages have mutually opposite polarities in the first and second vertical scanning sub-periods of the same vertical scanning period as in the example described above, then the CS voltage needs to change its polarities an even number of times since a gate signal voltage supplied to the $j^{th}$ gate bus line has changed from high into low during the first vertical scanning sub-period and until a gate signal voltage supplied to the $(j+1)^{th}$ gate bus line changes from high into low during the second vertical scanning sub-period. Considering that the oscillating waveform of the CS voltage could get blunted, the interval at which the polarity is inverted (which is a half of one oscillation period) is more preferably at least as long as 5H. Actually, by simulating signal delays based on the resistance and capacitance values of CS bus lines, the polarity inversion interval is preferably determined so that the CS voltage will reach at least 97%, more preferably 99% or more, of its maximum level when its associated gate signal voltage goes low.

In the preferred embodiment described above, the CS voltage is supposed to be an oscillating voltage that has a waveform oscillating at a duty ratio of one to one. However, the present invention is in no way limited to that specific preferred embodiment. The CS voltage only needs to change its polarities an even number of times, and therefore, twice to say the least. Nevertheless, if the CS bus lines are arranged as described above, the oscillating voltage applied to the storage capacitor counter electrode through a CS bus line can have its oscillation period extended by providing electrically independent CS trunks and connecting the CS bus lines to those CS trunks as disclosed in WO 2006/070829 A1.

As described above, the liquid crystal display device and its driving method according to this preferred embodiment never loses the checkerboard pattern of bright and dark subpixels while achieving the effects of the source inversion drive mentioned above. As a result, deterioration in display quality such as a jaggy look can be prevented.

Block Inversion Drive

According to the preferred embodiment described above, even if the multi-pixel drive scheme and the source line inversion drive scheme are combined with each other, the image will never look jaggy. Nevertheless, if such a display device is used to present a moving picture, a so-called "combing" phenomenon could occur. Thus, it will be described, as another specific preferred embodiment of the present invention, how to prevent the occurrence of such combing when a moving picture is presented.

If the method of writing pictures according to the preferred embodiment described above is schematically illustrated on a frame by frame basis, the picture of the previous frame is always presented while the picture of each half of a single frame is being presented as shown in FIG. 9. For example, if writing is done on odd rows during the first subframe and then on even rows during the second subframe, the picture of the current frame is presented on the odd rows of pixels during the first subframe and the picture of the previous frame is presented on the even rows of pixels, which is an abnormal situation.

That is why if a moving picture, representing a horizontal move of a vertical bar, is presented as shown in portion (a) of FIG. 10, then the edges of the vertical bar could look comb-shaped, which is the so-called "combing" phenomenon, as shown in portion (b) of FIG. 10. In the example illustrated in FIG. 9 and portions (a) and (b) of FIG. 10, scanning is supposed to be done at the same timing every other row. When this display device is actually driven, however, scanning is done with a delay of one horizontal scanning period caused every other row. Nevertheless, in these drawings, such a delay is not taken into consideration to make the reader get the idea of the combing phenomenon more easily.

It depends on the ratio of the duration (Tc) of such an abnormal situation to the overall presentation period how easily such an inconvenience is sensible to the eye. In this case, Tc is the amount of time it takes to scan two adjacent rows (such as the $j^{th}$ and $(j+1)^{th}$ rows) of pixels (i.e., to get source signal voltages written there). That is why if the frame rate is sufficiently higher than the motion velocity, it would not be a problem. However, if the motion shown in FIG. 10(b) is produced during one frame period, then that should be a problem. For example, as schematically shown in FIG. 11, if interlaced scanning is done with a display signal having a frame rate of 120 Hz (i.e., having a frame period of 8.33 ms) split into two subframes, the interval Tc between one subframe to be written on odd rows and the other subframe to be written on even rows is approximately 4,167 μs, which is a half as long as one frame period (i.e., as long as one subframe period). That is to say, Tc/one frame period×100=50. In this case, since one frame period generally corresponds to one vertical scanning period V-total, Tc/V-total×100=50 is satisfied.

The present inventors attempted via experiments to set conditions for making the combing phenomenon insensible even when a display operation is conducted as shown in FIG. 10. Our ratings are shown in the following Tables 1 and 2. Specifically, Table 1 shows the results in a situation where the frame rate was 60 Hz and Table 2 shows the results in a situation where the frame rate was 120 Hz. In these tables, the rating of sensibility of combing was determined to be apparent (×), barely sensible (Δ) and insensible (○):

TABLE 1

| Difference in number of horizontal scanning periods: Nsv | (Nsv/Nv-total) × 100 | Time Tc (µs) | Rating |
|---|---|---|---|
| 540 | 48.0 | 8,000 | x |
| 270 | 24.0 | 4,000 | x |
| 160 | 14.2 | 2,370 | x |
| 135 | 12.0 | 2,000 | x |
| 120 | 10.7 | 1,778 | x |
| 100 | 8.9 | 1,481 | x |
| 80 | 7.1 | 1,185 | Δ |
| 60 | 5.3 | 888.9 | Δ |
| 55 | 4.9 | 814.8 | ○ |
| 50 | 4.4 | 740.7 | ○ |
| 48 | 4.3 | 711.1 | ○ |
| 40 | 3.6 | 592.6 | ○ |
| 10 | 0.9 | 148.1 | ○ |

TABLE 2

| Difference in number of horizontal scanning periods: Nsv | (Nsv/Nv-total) × 100 | Time Tc (µs) | Rating |
|---|---|---|---|
| 540 | 48.0 | 4,000 | x |
| 270 | 24.0 | 2,000 | x |
| 160 | 14.2 | 1,185 | Δ |
| 135 | 12.0 | 1,000 | Δ |
| 120 | 10.7 | 888.9 | ○ |
| 100 | 8.9 | 740.7 | ○ |
| 80 | 7.1 | 592.6 | ○ |
| 60 | 5.3 | 444.4 | ○ |
| 55 | 4.9 | 407.4 | ○ |
| 50 | 4.4 | 370.4 | ○ |
| 48 | 4.3 | 355.6 | ○ |
| 40 | 3.6 | 296.3 | ○ |
| 10 | 0.9 | 74.1 | ○ |

As can be seen from Table 1, if the frame rate is 60 Hz, (Nsv/Nv-total)×100 is preferably equal to or smaller than seven and more preferably five or less. On the other hand, if the frame rate is 120 Hz, (Nsv/Nv-total)×100 is preferably equal to or smaller than 14 and more preferably 10 or less as can be seen from Table 2. Looking at the Tc values shown in Tables 1 and 2, it could be said that the Tc value is preferably 1.2 ms or less, and more preferably 0.8 ms or less, irrespective of the frame rate.

As can be seen, to avoid the combing phenomenon, the Tc value is preferably as small as possible (i.e., Nsv (=α/2) is as small as possible). To cut down the power dissipation, on the other hand, Nsv is preferably as large as possible. This is because the smaller Nsv, the more often the source signal voltage needs to invert its polarity and the greater the power dissipation will be.

According to this preferred embodiment, the duration (Tc) in which the current and previous frames are presented simultaneously is shortened by subdividing one frame more finely as schematically shown in FIG. 12, thereby making the combing phenomenon insensible.

Hereinafter, it will be described with reference to FIG. 12 how to drive the liquid crystal display device according to this preferred embodiment.

As shown in FIG. 12, every time skip scanning is done on a series of α gate bus lines (i.e., every time a total of 2 α rows are traced) in the order of odd, even, even, odd, odd, and even rows and so on, for example, the scanning beam goes back α rows to restart writing. When scanning is done for the first time, every time α/2 rows are scanned (i.e., a total of α rows are traced), the scanning beam goes back α rows. Also, when the scanning beam goes back, skip scanning is carried out. That is why more exactly, the beam will go back α-3 rows when the targets are changed from an odd row into even row and will go back α-1 rows when the targets are changed from an even row into an odd row.

Such scanning includes a first subframe in which a first set of odd rows of pixels (of which the number Nsv is supposed to be α/2) are scanned sequentially, a second subframe in which Nsv even rows of pixels that have been skipped in the first subframe are sequentially scanned, a third subframe in which a series of Nsv even rows of pixels, starting with an even row next to the last even row that has been scanned in the second subframe, are sequentially scanned, and a fourth subframe in which the Nsv odd rows of pixels that have been skipped in the third subframe are sequentially scanned. After the fourth subframe on, the same series of scanning steps will be repeatedly performed to present one frame of an image.

In this case, the "subframe" means a period for scanning a series of Nsv (=α/2) odd or even rows of pixels. Stated otherwise, Nsv is the number of horizontal scanning periods included in one subframe period (i.e., one vertical scanning sub-period). Suppose an area with a series of a rows is one block. In that case, one frame is split into two in the preferred embodiment described above, whereas one frame is subdivided into the number of (one subframe period/one frame period), i.e., the number of blocks×2, according to this preferred embodiment. In the following description, such a driving method will be referred to herein as a "block inversion drive".

In this example, the Tc value is calculated by the following equation:

$$Tc = (Nsv/Nv\text{-total}) \times (\text{one frame period})$$

Also, since one frame period (=V-total)/Nv-total=1H, Tc may also be represented as:

$$Tc = Nsv \times H$$

However, if data signals are input from both sides of the LCD panel (e.g., through both of the upper and lower data signal input terminals) to scan the upper and lower parts of the display area at the same time, for example, then the same calculation can be made with Nv-total replaced with (Nv-total/2).

For example, if a 52-inch full-spec HD LCD (of which the display panel has 1,080 scan lines and Nv-total is 1,125) is driven at a vertical scanning frequency of 120 Hz and if Nsv is set to be 24 (i.e., if α=48), then Tc is $$Tc = (48/2)/1125 \times 1/120 = 177.8 \ \mu s$$

Thus, the ratio of the duration of the abnormal display state becomes approximately 2.1%=(177.8/8333)×100. As a result, the combing can be reduced to an almost insensible level and a moving picture of quality can be presented.

On the other hand, if a 37-inch full-spec HD LCD (of which the display panel has 1,080 scan lines (or rows of pixels) and Nv-total is 1,125) is driven at 120 Hz and if Nsv is set to be 10 (i.e., if α=20), then Tc can be calculated to be 148.1 µs by the same equation. Thus, the ratio of the duration of the abnormal display state becomes approximately 0.9%. As a result, the combing can also be reduced to an almost insensible level and a moving picture of quality can be presented.

It should be noted that if the length of one horizontal period in an effective display period V-Disp is different from that of one horizontal period in a vertical blanking interval V-Blank, for example, the calculation can be made more accurately with Nv-total replaced with Nv-Disp and with one frame period (V-Total) represented by the effective display period. In that case, Tc can be represented by Tc=(Nsv/Nv-Disp)×(effective display period)

Also, since effective display period (=V-Disp)/Nv-Disp=1H, Tc can also be represented as Tc=Nsv×H where H is a horizontal period in the effective display period. Also, attention should be paid to the Tc value that is always calculated by Nsv×H, no matter whether it is represented by Nv-Disp or Nv-total. If one horizontal period in an effective display period V-Disp is as long as one horizontal period in a vertical blanking interval V-Blank, then the same Tc value is calculated by both of the two equations that use V-Disp and V-Total. Exemplary ratings of ours are shown in the following Tables 3 and 4. In the following example, the samples as the ones shown in Tables 1 and 2 were used and one horizontal period in an effective display period V-Disp was as long as one horizontal period in a vertical blanking interval V-Blank. Thus, the Tc values are the same as those of the previous example.

TABLE 3

| Difference in number of horizontal scanning periods: Nsv | (Nsv/V-Disp) × 100 | Time Tc (μs) | Rating |
|---|---|---|---|
| 540 | 50.0 | 8,000 | x |
| 270 | 25.0 | 4,000 | x |
| 160 | 14.8 | 2,370 | x |
| 135 | 12.5 | 2,000 | x |
| 120 | 11.1 | 1,778 | x |
| 100 | 9.3 | 1,481 | x |
| 80 | 7.4 | 1,185 | Δ |
| 60 | 5.6 | 889 | Δ |
| 55 | 5.1 | 815 | ○ |
| 50 | 4.6 | 741 | ○ |
| 48 | 4.4 | 711 | ○ |
| 40 | 3.7 | 593 | ○ |
| 10 | 0.9 | 148 | ○ |

TABLE 4

| Difference in number of horizontal scanning periods: Nsv | (Nsv/V-Disp) × 100 | Time Tc (μs) | Rating |
|---|---|---|---|
| 540 | 50.0 | 4,000 | x |
| 270 | 25.0 | 2,000 | x |
| 160 | 14.8 | 1,185 | Δ |
| 135 | 12.5 | 1,000 | Δ |
| 120 | 11.1 | 889 | ○ |
| 100 | 9.3 | 741 | ○ |
| 80 | 7.4 | 593 | ○ |
| 60 | 5.6 | 444 | ○ |
| 55 | 5.1 | 407 | ○ |
| 50 | 4.6 | 370 | ○ |
| 48 | 4.4 | 356 | ○ |
| 40 | 3.7 | 296 | ○ |
| 10 | 0.9 | 74 | ○ |

In FIG. 12, the sequence of the polarities of source signal voltages to write includes a sequence in which the source signal voltages have different polarities between the first subframe (e.g., positive) and the second subframe (e.g., negative), have the same polarity in the second and third subframes (e.g., negative) and have different polarities again between the third subframe (e.g., negative) and the fourth subframe (e.g., positive). To improve the display quality, the voltages to be written on odd and even rows preferably have opposite polarities in this manner. Then, vertical shadows, horizontal stripes due to the coupling capacitance between vertically adjacent pixels, and a flicker pattern can be eliminated.

If the block inversion drive scheme described above is applied to the multi-pixel structure shown in FIG. 2, the CS voltage has a waveform, a part of which oscillates in a period that is a positive integral number of times as long as one horizontal scanning period. If one period of the CS voltage is represented by M×H where H is one horizontal scanning period and M is a positive integer, α is preferably a positive integral number of times as large as M and Nsv is preferably a positive integral number of times as large as M/2. If the CS bus lines include a CS bus line that is associated in common with two subpixels that belong to two different pixels and that are adjacent to each other in the column direction, then α is preferably an even number of times as large as M (and Nsv is preferably a positive integral number of times as large as M). One period M×H of the CS voltage is preferably defined such that the duration in which the CS voltage has high level is as long as the duration in which the CS voltage has low level (i.e., such that the CS voltage has a duty ratio of one to one). Considering that the oscillating waveform of the CS voltage could get blunted, the interval at which the polarity is inverted (which is a half of one oscillation period M of the CS voltage) is more preferably at least as long as 5H. Actually, by simulating signal delays based on the resistance and capacitance values of CS bus lines, the polarity inversion interval is preferably determined so that the CS voltage will reach at least 97%, more preferably 99% or more, of its maximum level when its associated gate signal voltage goes low.

Hereinafter, a specific example will be described. For example, supposing in a 37-inch full-spec HD LCD (driven at 60 Hz), the oscillating waveform of the CS voltage has one period of 10H and the number M of horizontal scanning periods included in one oscillation period is 10, α is preferably a positive integral number of times as large as 10. However, if a single pixel is driven separately in the upper and lower parts thereof at the same time, then the brightness ranks of two subpixels in the two vertically adjacent pixels could reverse to make the edges of the image look saw-toothed (or jaggy). That is why α is more preferably a positive integral number of times as large as 20.

FIG. 13A is a timing diagram of source signal voltages, gate signal voltages and CS voltages along with the order of writing (i.e., the order of scanning the rows of pixels) in a situation where Nsv=10 (i.e., α=20). The source signal voltage is positive when written on an odd row but is negative when written on an even row and is supposed to have constant amplitude. As for the gate signal voltage, only portions corresponding to the gate ON pulses Pw are shown.

If one oscillation period of the CS voltage is M×H (where M is a positive integer), Nsv, which is the number of horizontal scanning periods included in one vertical scanning sub-period, is given by Nsv (=α/2)=M×k. In the example illustrated in FIG. 13A, as the number M of horizontal scanning periods included in one oscillation period of the CS voltage is 10 and k=1, Nsv (=α/2)=10×1=10. Stated otherwise, the number M of horizontal scanning periods included in one oscillation period of the CS voltage can be calculated based on the number Nsv (=α/2) of horizontal scanning periods included in one vertical scanning sub-period by M=Nsv/k. In the example illustrated in FIG. 13A, Nsv=10 (i.e., α=20), k=1, and therefore, M=10/1=10.

Next, it will be described how the number of times of polarity inversion of the CS voltage changes according to the sequence of polarity changes of the source voltage. According to the sequence of polarity changes of the source voltage shown in FIG. 13A, the source voltage is positive when written on an odd row but is negative when written on an even row, and has mutually opposite polarities in a two consecutive vertical scanning sub-periods. Specifically, supposing the period for getting Writing Steps #1 through #10 done (i.e., the period for scanning $1^{st}, 3^{rd}, 5^{th}$ ... and $19^{th}$ rows of pixels) is the first vertical scanning sub-period and the period for getting Writing Steps #11 through #20 done (i.e., the period for scanning $2^{nd}, 4^{th}, 6^{th}$ ... and $20^{th}$ rows of pixels) is the second vertical scanning sub-period, the source signal voltage is positive during the first vertical scanning sub-period but is negative during the second vertical scanning sub-period. That is to say, the source signal voltage has two different polarities in these two vertical scanning sub-periods. In the interval between a point in time when the gate signal voltage supplied to the $j^{th}$ gate bus line (associated with the first row, for example, and its Writing Step is #1) during the first vertical scanning sub-period changes from high into low and a point in time when the gate signal voltage supplied to the $(j+1)^{th}$ gate bus line (associated with the second row, for example, and its Writing Step is #11) during the second vertical scanning sub-period changes from high into low, the CS voltage inverts its polarity an even number of times. In this example, the CS voltage inverts its polarity twice ($=2 \times k=2 \times 1$).

Also, in the example illustrated in FIG. 13A, the source signal voltage is negative in the third vertical scanning sub-period, which is continuous with the second vertical scanning sub-period and is a period for getting Writing Steps #21 through #30 done (i.e., the period for scanning $22^{nd}, 24^{th}, 26^{th}$ ... and $40^{th}$ rows of pixels) but is positive in the fourth vertical scanning sub-period, which is continuous with the third vertical scanning sub-period and is a period for getting Writing Steps #31 through #40 done (i.e., the period for scanning $21^{st}, 23^{rd}, 25^{th}$ ... and $39^{th}$ rows of pixels). That is to say, the source signal voltage has different polarities between the first and second vertical scanning sub-periods, has the same polarity in the second and third vertical scanning sub-periods, and then has different polarities again between the third and fourth vertical scanning sub-periods.

In this example, the CS bus lines are connected to ten electrically independent CS trunks (not shown) and there are ten different types of CS voltages A, B, C, D, E, F, G, H, J and K. In that case, in two vertically adjacent pixels, bright and dark subpixels will be arranged alternately with each other. Furthermore, if data signals to be supplied through two adjacent source lines have opposite polarities, then the bright and dark subpixels will be arranged in a checkerboard pattern as shown in FIG. 6. As a result, the degree of jaggedness will decrease significantly. That is why the source signal voltages supplied to two source bus lines that are associated with two adjacent columns of pixels in an arbitrary vertical scanning period preferably have mutually opposite polarities. In this example, the CS bus lines are supposed to be connected to CS trunks. However, CS voltages may be supplied to the CS bus lines independently of each other. In that case, the respective CS voltages could be output from a gate driver.

FIG. 13B illustrates another example. FIG. 13B is a timing diagram of source signal voltages, gate signal voltages and CS voltages along with the order of writing (i.e., the order of scanning the rows of pixels) in a situation where one oscillation period of the CS voltage is 10H (i.e., M=10) and Nsv=20 (i.e., α=40). The source signal voltage is positive when written on an odd row but is negative when written on an even row and is supposed to have constant amplitude. As for the gate signal voltage, only portions corresponding to some gate ON pulses Pw at the beginning and end of vertical scanning sub-periods are shown. The source signal voltage has the same sequence of polarity changes as the one shown in FIG. 13A. In FIG. 13B, the particularly important polarity inversion timings of the data signal voltage and gate ON pulses to be applied to gate bus lines after the data signal has inverted its polarity are encircled.

This is a situation where k=2 in the equation described above. In the interval between a point in time when the gate signal voltage supplied to the $j^{th}$ gate bus line (associated with the first row, for example, and its Writing Step is #1) during the first vertical scanning sub-period changes from high into low and a point in time when the gate signal voltage supplied to the $(j+1)^{th}$ gate bus line (associated with the second row, for example, and its Writing Step is #21) during the second vertical scanning sub-period changes from high into low, the CS voltage inverts its polarity an even number of times. In this example, the CS voltage inverts its polarity four times ($=2 \times k=2 \times 2$). As can be seen, according to the scheme shown in FIG. 13B, the number of types of CS voltages is still ten but the number of times of polarity inversion of the source signal voltage (or data signal) can be reduced.

FIG. 13C illustrates still another example. FIG. 13C is a timing diagram of source signal voltages, gate signal voltages and CS voltages along with the order of writing (i.e., the order of scanning the rows of pixels) in a situation where one oscillation period of the CS voltage is 14H (i.e., M=14) and Nsv=14 (i.e., α=28).

In this example, Nv-total is 1,125, which is not divisible by 14H that is one oscillation period of the CS voltage. In that case, the CS voltage cannot consist of only a waveform portion oscillating in a period that is a positive integral number of times as long as one horizontal scanning period, unlike the examples shown in FIGS. 13A and 13B. That is why in this example, the CS voltage for a single vertical scanning period consists of a waveform portion oscillating in a period of 14H (which will be referred to herein as a "first waveform portion") and a waveform portion oscillating in periods that are not 14H (which will be referred to herein as a "second waveform portion") as shown in FIG. 13C. In this example, the second waveform portion is made up of a waveform oscillating in a period of 10H and a waveform oscillating in a period of 12H. In this case, in one vertical scanning period, the difference between the duration in which the CS voltage has high level and the duration in which the CS voltage has low level is preferably as small as possible. This is because if the difference between the high level duration and the low level duration were too big, the luminance balance between bright and dark subpixels could be lost on some rows of pixels to possibly produce luminance unevenness on the screen. It should be noted that the second waveform portion does not always have to be an oscillating waveform.

In this manner, if Nv-total is not an integral multiple of Nsv×2, then such complicated processing will be required. Also, if the number Nv-Disp of horizontal scanning periods (e.g., 1,080 in this example) included in an effective display period V-Disp is not an integral multiple of Nsv×2, then it will not be enough to shape the waveform of the CS voltage during the vertical blanking interval V-Blank but more complicated processing will be required. For that reason, Nsv is preferably defined so that not only Nv-total but also Nv-Disp become an integral multiple of Nsv×2.

FIG. 14 is a timing diagram illustrating a situation where Nsv=5 (i.e., α=10). In this example, the polarity of the source signal voltage is inverted every 10H. Specifically, the first through tenth rows of pixels—both odd and even rows alike—are supposed to be positive, the eleventh through twentieth rows of pixels negative, the twenty-first through thirtieth rows positive and the thirty-first through fortieth rows negative. In that case, the bright and dark subpixels will be arranged in a checkerboard pattern as shown in FIG. 14B. As a result, both the degree of jaggedness and Nsv ($=\alpha/2$) can be reduced, and therefore, the combing phenomenon can be substantially eliminated as well.

If on the tenth and eleventh rows, for example, there is a coupling capacitance between vertically adjacent subpixel electrodes belonging to upper and lower different pixels, then the voltages applied to those two different pixels will be different from each other. That is why when the TFT is turned OFF, the voltage changes, thus possibly producing visible stripes on the screen. To avoid such a situation, the source signal voltage (or data signal voltage) is preferably adjusted using the coupling capacitance and the pixel capacitance (i.e., the sum of the respective liquid crystal capacitances and storage capacitances of the subpixels that form a single pixel) as parameters.

Also, the polarity of the source signal voltage is inverted in the middle of a vertical scanning period. This is done in order to minimize a flicker that could be seen along each column or a vertical shadow phenomenon that would be produced by the parasitic capacitance between a source bus line and pixels if data signals of the same polarity are supplied continuously. Optionally, if the voltages to be written on the odd and even rows have their polarity inverted on a row-by-row basis as shown in FIGS. 13A and 13B, then the flicker level can be further reduced.

Gate Driver

The gate driver 130 of the liquid crystal display device 100 shown in FIG. 1 may have the following configuration, for example, and can carry out the scan described above. Hereinafter, an exemplary configuration and operation of the gate driver 130 will be described with reference to FIGS. 15 through 22.

First of all, it will be described with reference to FIGS. 15 through 19 what if the source inversion drive described above (see FIG. 5B or 8B) is carried out.

In order to write source signal voltages (data signal voltages) Vsi (where i=1, 2, . . . and m) on respective pixels (more specifically, the liquid crystal capacitors and storage capacitors of the respective pixels) based on a gate start pulse signal GSP, a gate clock signal GCK and a gate driver output control signal GOEr (where r=1, 2, . . . and q), the gate driver 130 selects every other gate bus line Gj (where j=1, 2, . . . and n) (and skips the other gate bus lines Gj) for almost one horizontal scanning period in each frame period of the digital image signal DA (i.e., each vertical scanning period of the input video signal). The gate driver 130 supplies a scan signal Vgj (where j=1, 2, and n) with the pixel data write pulses (gate ON pulses) Pw such as the ones shown in FIGS. 5B and 8B to one of the gate bus lines G. The gate bus line Gj to which the pulse Pw is applied gets selected and a TFT connected to the selected gate bus line G is turned ON. Naturally, the TFTs connected to non-selected gate bus lines Gj remain OFF. By applying the pulses Pw such as the ones shown in FIGS. 5B and 8B, the odd ones Gj (where j=1, 3, 5, . . . and n−1) of the gate bus lines Gj (where j=1, 2, . . . and n) may be selected with the even ones skipped during the first half frame period and the even lines Gj (where j=2, 4, 6, . . . and n) are selected with the odd lines skipped during the latter half frame period. In this case, each of those pixel data write pulses Pw rises to H level for an effective scan period corresponding to the data write period of one horizontal scanning period (H). The effective scan period may be approximately a half as long as one horizontal scanning period (i.e., about H/2).

FIGS. 15(A) and 15(B) are block diagrams illustrating an exemplary configuration for a gate driver that can output the gate signal voltages shown in FIGS. 5B and 8B.

The gate driver shown in FIG. 15(A) includes a number q of gate driver IC (integrated circuit) chips 411, 412, . . . and 41q as partial circuits, each including a shift register.

As shown in FIG. 15(B), each of the gate driver IC chips 411 through 14q includes a shift register 40, first and second groups of AND gates 41 and 43 provided for respective stages of the shift register 40, and an output section 45 that outputs scan signal voltages G1 through Gp in response to the output signals g1 through gp of the second group of AND gates 43. The shift register 40 receives a start pulse signal SPi, a clock signal CK and an output control signal OE from an external device. The start pulse signal SPi is input to the input terminal of the shift register 40, which outputs, through its output terminal, a start pulse signal SPo to be supplied to a gate driver IC chip that follows. A logically inverted one of the clock signal CK is supplied to each of the AND gates 41 of the first group, while a logically inverted one of the output control signal OE is input to each of the AND gates 43 of the second group. And the output signal Qk (where k=1 to p) of each stage of the shift register 40 is input to an associated one of the AND gates 41 of the first group, of which the output signal is passed to an associated one of the AND gates 43 of the second group.

The gate driver with this configuration is implemented as a cascade connection of multiple (i.e., q) gate driver IC chips 411 through 41q as shown in FIG. 15(A). That is to say, the output terminal of the shift register in each gate driver IC chip (i.e., the output terminal for the start pulse signal SPo) is connected to the input terminal of the shift register in the next gate driver IC chip (i.e., the input terminal for the start pulse signal SPi) so that the respective shift registers 40 in the gate driver IC chips 411 through 41q together form a single shift register. Such a cascaded shift register will be referred to herein as a "coupled shift register". To the input terminal of the shift register 40 in the top gate driver IC chip 411, a gate start pulse signal GSP (see FIG. 1) is supplied from the display controller 150. And the output terminal of the shift register in the last gate driver IC chip 41q is not connected to any external device. The gate clock signal GCK is supplied as a clock signal CK from the display controller 150 to the respective gate driver IC chips 411 through 41q in common. On the other hand, the gate driver output control signal GOE generated by the display controller 150 includes first through $q^{th}$ gate driver output control signals GOE1 through GOEq, which are respectively supplied as output control signals OE to the gate driver IC chips 411 through 41q.

Next, it will be described with reference to FIG. 16 how the gate driver 130 with such a configuration operates. Portions (a) through (g) of FIG. 16 show the waveforms of respective signals to illustrate how the gate driver 130 operates.

The display controller 150 generates not only a signal that rises to H level (i.e., is activated) for only a period Tspw corresponding to a pixel data write pulse Pw as the gate start pulse signal GSP as shown in portion (a) of FIG. 16 but also a gate clock signal GCK that has H level for only a predetermined amount of time every half horizontal scanning period (which will be referred to herein as a "½ vertical scanning period" or "H/2") as shown in portion (b) of FIG. 16. When the gate start pulse signal GSP and gate clock signal GCK such as these are supplied to the gate driver 130 shown in FIG. 15, the signal Q1 shown in portion (c) of FIG. 16 is output as the output signal Q1 for the first stage of the shift register 40 of the top gate driver IC chip 411. This output signal Q1 has a single pulse Pqw corresponding to the pixel data write pulse Pw for each half frame period (F/2). And such a pulse Pqw is sequentially transferred through the coupled shift register in the gate driver 130 in response to the gate clock signal GCK. As a result, signals with such a waveform as the one shown in portion (c) of FIG. 16 are sequentially output from one stage of the coupled shift register after another with a time lag of a half horizontal scanning period (H/2) caused each time.

In addition, the display controller 150 also generates the gate driver output control signals GOE1 through GOEq to be supplied to the respective gate driver IC chips 411 through 41q that form the gate driver 130 as described above. In this case, the gate driver output control signal GOEr to be supplied to the $r^{th}$ gate driver IC chip 41r falls to L level if the pixel data write pulse (which is associated with either G(1) or G(3) in this case) should be output while the pulse Pqw corresponding to the pixel data write pulse Pw is being output from any stage of the shift register 40 in that gate driver IC chip 41r.

For example, the gate driver output control signal GOE1 shown in portion (d) of FIG. 16 is supplied to the top gate driver IC chip 411. Specifically, GOE1 falls to L level to apply the pixel data write pulse Pw to G(1) (which will also be identified herein by Vg1), rises to H level not to apply Pw to G(2) (which will also be identified herein by Vg2), and then falls to L level again to apply Pw to G(3) (which will also be identified herein by Vg3). Those pulses included in the gate driver output control signals GOE1 through GOEq (which will be referred to herein as "write period adjusting pulses" because those pulses virtually rise to H level during the predetermined periods) to adjust the pixel data write pulses Pw may rise earlier, or fall later, than the gate clock signal GCK in accordance with the pixel data write pulses Pw required. Alternatively, the pixel data write pulses Pw could also be adjusted with only the pulses of the gate clock signal GCK instead of using such write period adjusting pulses.

In each gate driver IC chip 41r (where r=1 to q), based on the output signal Qk (where k=1 to p) of each stage of the shift register 40, the gate clock signal GCK and the gate driver output control signal GOEr (see FIG. 15(B)), the first and second groups of AND gates 41 and 43 generate internal scan signals g1 through gp, of which the levels are then changed by the output section 45, thereby outputting scan signals G1 through Gp to be supplied to the gate bus lines. As a result, as shown in portions (e), (f) and (g) of FIG. 16, in the first half F/2 of one frame period, the pixel write pulses Pw are applied to every other one of the gate bus lines Gj (where j=1, 2, . . . and n), i.e., to the odd lines Gj (where j=1, 3, 5, . . . and n−1).

In the latter half F/2, on the other hand, the pulses included in the gate driver output control signals GOE1 through GOEq are controlled by the same method as the one just described such that Pw is applied to the even lines Gj (where j=2, 4, 6, . . . and n). As can be seen from FIG. 16, in the first H/2 of the latter half F/2, Pqw is also generated in the output signal Q1 as in the first H/2 of the first half F/2 but no image write pulses are output to G1. According to such a method, in a situation where the source signal voltage supplied to the source bus line has its polarity inverted every F/2, for example, even if the source signal voltage got blunted right after the polarity has been inverted, that first H/2 could be used as a precharge period to raise the voltage on the source bus line to a desired voltage.

In this manner, every other gate bus line can get scanned with the other lines skipped. By adopting such a driving method, the configuration of the gate driver can also be rather simplified. For example, this gate driver can have a much simpler configuration than a scheme in which two sets of gate drivers with the configuration shown in FIGS. 15(A) and 15(B) are just provided, one of the two sets is connected to odd gate bus lines and the other set is connected to even gate bus lines, and a start pulse is applied in each vertical scanning sub-period to an associated gate driver, thereby scanning every other gate bus line with the other lines skipped.

According to the example described above, however, the width of the pixel data write pulse Pw is limited to H/2 or less. That is why if one horizontal scanning period were short, then image data could not be written fully. Thus, an example in which the pixel data write pulse Pw can have a relatively broad width of more than H/2 period to 1H period will be described.

As shown in portion (b) of FIG. 17, although the first two pulses Pck1 and Pck2 of GCK have the same pulse width as the one shown in FIG. 16, the pulses that follow (i.e., from Pck3 on) have a narrower GCK pulse width. For example, two pulses are applied within one pulse width shown in FIG. 16. Also, although the interval between the respective leading edges of the GCK pulses Pck1 and Pck2 is H/2 in FIG. 16, the interval between the respective leading edges of Pck1 and Pck2 is 1H (which will be referred to herein as a "first interval") again in FIG. 17, so is the interval between the respective leading edges of Pck2 and Pck3, but the interval between the respective leading edges of Pck3 and Pck4 (which will be referred to herein as a "second interval") is defined to be equal to or smaller than the pulse width of PCK1, thereby bringing Pck3 and Pck4 rather close to each other. For instance, suppose Pck1 and Pck2 have a pulse width of 2 μs, but Pck3 has a width of 0.5 μs, Pck4 has a width of 1.0 μs, and the second interval is 1.0 μs. After that, the interval between the respective leading edges of Pck3 and Pck5 becomes the first interval (1H) again.

Within 1F, every GCK pulse from Pck3 on has as short a pulse width as Pck3 and Pck4. Supposing Pck3 to be a reference pulse, after Pck4 that rises at a second interval with respect to the leading edge of Pck3 has been applied, Pck5 that rises at a first interval with respect to the leading edge of Pck3 is applied. Subsequently, after a GCK pulse that rises at the second interval with respect to the leading edge of Pck5 has been applied, a GCK pulse that rises at the first interval with respect to the leading edge of Pck5 is applied. By adopting such a scheme, the output stage Qk of the shift register, associated with a gate line to which no image write pulses are output, can have a shortened pulse width. Consequently, the output stage Qk of the shift register, associated with a gate line to which an image write pulse should be output at a width of 1H, can have a pulse width of 1H.

Also, in the LCD panel, a dummy gate bus line G0, to which no pixels contributing to a display operation are connected, is arranged before the gate bus line G1. The gate driver to be used in the following example may have the same configuration as the counterpart described above except that Q0 and G0 associated with the dummy gate bus line G0 are added to the initial stage of the shift register 40 in the top gate driver IC chip 411 of the gate driver shown in FIGS. 15(A) and 15(B).

The display controller 150 generates not only a signal that rises to H level (i.e., is activated) for only a period Tspw corresponding to a pixel data write pulse Pw as the gate start pulse signal GSP as shown in portion (a) of FIG. 17 but also a gate clock signal GCK as described above as shown in portion (b) of FIG. 17. When the gate start pulse signal GSP and gate clock signal GCK such as these are supplied to the gate driver, the signal Q0 shown in portion (c) of FIG. 17 is output as the output signal for the initial stage of the shift register 40 of the top gate driver IC chip 411 (associated with the dummy gate bus line G0). This output signal Q0 has a single pulse Pqw corresponding to the pixel data write pulse Pw for each half frame period (F/2). And such a pulse Pqw is sequentially transferred through the coupled shift register in the gate driver in response to the gate clock signal GCK. As a result, signals with such a waveform as the one shown in portion (c) of FIG. 17 are sequentially output from one stage of the coupled shift register after another synchronously with the leading edges of the gate clock GCK and at predetermined time intervals.

In addition, the display controller 150 also generates the gate driver output control signals GOE1 through GOEq to be supplied to the respective gate driver IC chips 411 through 41q that form the gate driver 130 as described above. In this case, the gate driver output control signal GOEr to be supplied to the r$^{th}$ gate driver IC chip 41r falls to L level if the pixel data write pulses (which are associated with either G(0), G(1), G(3) and so on in the first half F/2 or G(0), G(2) and so on in the latter half F/2 in this case) should be output while the pulse Pqw corresponding to the pixel data write pulse Pw is being output from any stage of the shift register 40 in that gate driver IC chip 41r. Also, the gate driver output control signal GOEr rises to H level if no pixel data write pulses (which are associated with either G(2) and so on in the first half F/2 or G(1), G(3) and so on in the latter half F/2 in this case) should be output. For example, GOE1 falls from H level to L level synchronously with the trailing edge of the GCK pulse Pck1, rises to H level with the leading edge of Pck2, falls to L level with the trailing edge of Pck2, rises from L level to H level halfway between the leading and trailing edges of Pck3, and then falls to L level halfway between the leading and trailing edges of Pck4 (see portion (d) of FIG. 17). The levels of GOE1 are changed between H and L levels halfway of Pck3 and Pck4 in order to mask the pulses generated between Pck3 and Pck4 just as intended. The dummy gate bus line G0 is provided to generate the pulse Pqw with the signal Q0. However, as the dummy gate bus line G0 is arranged in the non-display area (or frame area), G0 would not contribute to getting a display operation done even if any pixel data write pulse were output to G0.

For example, the gate driver output control signal GOE1 shown in portion (d) of FIG. 17 is supplied to the top gate driver IC chip. Specifically, to raise GOE1 to H level, the pixel data write pulse Pw is applied to G(0) (which will also be identified herein by Vg0), GOE1 falls to L level to apply the pixel data write pulse Pw to G(1) (which will also be identified herein by Vg1), rises to H level not to apply Pw to G(2) (which will also be identified herein by Vg2), and then falls to L level again to apply Pw to G(3) (which will also be identified herein by Vg3).

In each gate driver IC chip 41r (where r=1 to q), based on the output signal Qk (where k=0 to p for the initial stage only and k=1 to p for the others) of each stage of the shift register, the gate clock signal GCK and the gate driver output control signal GOEr as described above, the first and second groups of AND gates generate internal scan signals gk (where k=0 to p for the initial stage only and k=1 to p for the others), of which the levels are then changed by the output section, thereby outputting scan signals G0 through Gp or G1 through Gp to be supplied to the gate bus lines. As a result, as shown in portions (e), (f), (g) and (h) of FIG. 17, in the first half F/2 of one frame period, the pixel write pulses Pw are applied to every other one of the gate bus lines Gj (where j=1, 2, . . . and n), i.e., to only the odd lines Gj (where j=1, 3, 5, . . . and n−1). That is to say, the even lines Gj (where j=2, 4, 6, . . . and n) are skipped.

In the latter half F/2, on the other hand, the pulses included in the gate driver output control signals GOE1 through GOEq are controlled such that Pw is applied to the even lines Gj (where j=2, 4, 6, . . . and n). The timings of the gate start pulse signal GSP and gate clock signal GCK and the gate clock signal GCK generated itself are different from those of the first half F/2. That is to say, every GCK to be generated in the second half F/2 is GCK such as Pck3 and Pck4 with a narrower pulse width than Pck1 and Pck2. And the gate start pulse GSP is applied so as to rise when GCK falls to L level between the first two pulses Pck3 and Pck4 of the latter half F/2.

In this manner, every other gate bus line can get scanned with the other lines skipped in each vertical scanning sub-period (consisting of the first and latter half frames in this example).

Modified examples of the gate driver operation shown in FIG. 17 are shown in FIGS. 18 and 19, which are the same as FIG. 17 except the waveform of GCK shown in their portion (b).

As shown in portion (b) of FIG. 18, the first GCK pulse of each subframe may consist of a single pulse (which is identified by Pck1). Alternatively, the first GCK pulse of each subframe may also consist of double pulses (which are identified by Pck3 and Pck4) as shown in portion (b) of FIG. 19.

If the gate driver and method of operating it that have been described with reference to FIGS. 17 through 19 are adopted, each pixel data write pulse Pw can have a broad width that is longer than a H/2 period and equal to or shorter than 1H period. That is why even if a 2× drive is carried out (at a rate of 120 Hz), image data (i.e., source signal voltages) can be written sufficiently on respective pixels. In addition, the configuration of the gate driver can be naturally simplified, too.

Next, the configuration and operation of a gate driver that can perform a block inversion drive (see FIG. 12) will be described with reference to FIGS. 20 through 22. The gate driver to be described below can also be used as the gate driver 130 of the liquid crystal display device 100 shown in FIG. 1. FIGS. 20 and 21 are block diagrams illustrating an exemplary configuration for the gate driver and FIG. 22 illustrates the waveforms of various signals and the timings to apply them. The same reference numerals as the one used in FIGS. 15(A) and 15(B) are also used in this example for the sake of simplicity of description.

The gate driver shown in FIG. 20 includes a number q of gate driver IC (integrated circuit) chips 411, 412, . . . and 41q as partial circuits, each including a shift register.

As shown in FIG. 21, each of the gate driver IC chips 411 through 41q includes two shift registers a and b. Specifically, the shift register a is an odd stage shift register for use in a situation where k in the output signal Qk of a given stage is an odd number. On the other hand, the shift register b is an even stage shift register for use in a situation where k in the output signal Qk of a given stage is an even number. Each gate driver IC chip 411 through 41q further includes first and second groups of AND gates 41 and 42 provided for respective stages of the shift registers a and b, and an output section that outputs scan signals G1 through Gp in response to the output signals g1 through gp of the first and second groups of AND gates 41 and 42. The shift registers a and b receive start pulse signals SPia and SPib, clock signals CKa and CKb and an output control signal OE. Each of the start pulse signals SPia and SPib and clock signals CKa and CKb is input independently to the input terminal of its associated shift register a or b, which outputs, through its output terminal, a start pulse signal SPoa or SPob to be supplied to a gate driver IC chip that follows.

In the odd stage shift register a, the odd stage output signal Qk (where k is an odd number) of the shift register a and a logically inverted one of the output control signal OE are supplied to each of the AND gates 41 of the first group. In the even stage shift register b, on the other hand, the even stage output signal Qk (where k is an even number) of the shift register b and the output of the inverter 43 (i.e., a logically inverted one of the logically inverted output control signal OE) are supplied to each of the AND gates 42 of the second group.

The gate driver with this configuration is a coupled shift register that is implemented as a cascade connection of multiple (i.e., q) gate driver IC chips 411 through 41q as shown in FIG. 20. That is to say, the output terminals of the shift registers in each gate driver IC chip (i.e., the output terminals for the start pulse signals SPoa and SPob) are connected to the input terminals of the shift registers in the next gate driver IC chip (i.e., the input terminals for the start pulse signals SPia and SPib) so that the respective shift registers in the gate driver IC chips 411 through 41q together form a single shift register. To the input terminals of the shift registers a and b in the top gate driver IC chip 411, gate start pulse signals GSPa and GSPb are supplied from the display controller 150 (see FIG. 1). And the output terminals of the shift registers in the last gate driver IC chip 41q are not connected to any external device. The gate clock signals GCKa and GCKb and the output control signal GOE are supplied as clock signals CKa and CKb and the output control signal OE from the display controller 150 to the respective gate driver IC chips 411 through 41q in common.

Next, it will be described with reference to FIG. 22 how the gate driver with such a configuration operates.

The display controller 150 (see FIG. 1) generates not only signals that rise to H level (i.e., are activated) for only a period Tspw corresponding to a pixel data write pulse Pw as gate start pulse signals GSPa and GSPb as shown in FIG. 22 but also gate clock signals GCKa and GCKb that have H level for only a predetermined amount of time every horizontal scanning period (1H). In this case, the gate start pulses GSPa and GSPb are odd stage gate start pulses and are both shown as portion (d) of FIG. 22. The gate clock signals GCKa and GCKb are odd and even stage gate clock signals, respectively, and are both shown as portion (e) of FIG. 22.

When the gate start pulse signals GSPa and GSPb and gate clock signals GCKa and GCKb such as these are supplied to the gate driver, the output signals Q1 and Q2 for the first stage of the shift registers a and b of the top gate driver IC chip 411 are output. This output signals Q1 and Q2 shown in portion (f) of FIG. 22 have a single pulse Pqw corresponding to the pixel data write pulse Pw for each frame period. And such a pulse Pqw is sequentially transferred through the coupled shift register in the gate driver in response to the gate clock signals GCKa and GCKb. As a result, signals with such a waveform rise to H level synchronously with the leading edges of the gate clock signals GCKa and GCKb and fall to L level with the next leading edges of the gate clock signals GCKa and GCKb and then are sequentially output from one stage of the coupled shift register after another with a time lag caused each time.

In addition, the display controller 150 also generates the gate driver output control signals GOE (see portion (g) of FIG. 22) to be supplied to the respective gate driver IC chips 411 through 41q that form the gate driver as described above. In this case, the gate driver output control signal GOE to be supplied to the $r^{th}$ gate driver IC chip 41r falls to L level or rises to H level to adjust the pixel data write pulse Pw while the pulse Pqw corresponding to the pixel data write pulse Pw is being output from any stage of the shift registers in that gate driver IC chip 41r. This is equivalent to rising to H level during the predetermined period, and therefore, such a pulse will be referred to herein as a "write period adjustment pulse". The pulse included in the gate driver output control signal GOE to adjust the pixel data write pulse Pw (i.e., the write period adjustment pulse) can be adjusted appropriately in accordance with the pixel data write pulse Pw required.

Furthermore, both of these gate clock signals GCKa and GCKb maintain H level (i.e., stay at H level) when the polarity POL of the data signal inverts. And when the polarity of the data signal inverts next time, the clock signals will fall to L level to resume maintaining H level for only a predetermined period of time every 1H.

By using the variation in the width of the waveform Pqw of the output signal Qk according to the behavior of these gate clock signals GCKa and GCKb, the predetermined period of each Pqw in which the pixel data write pulse Pw should be output is controlled with the output control signal GOE (write period adjustment pulse).

In each gate driver IC chip 41r (where r=1 to q), based on the output signal Qk (where k=1 to p) of each stage of the shift register (shown in portion (f) of FIG. 22), the gate clock signals GCKa and GCKb and the gate driver output control signal GOE, the first and second groups of AND gates 41 and 42 generate internal scan signals g1 through gp, of which the levels are then changed by the output section, thereby outputting scan signal voltages G(1) (which will also be identified herein by g1) through G(p) (which will also be identified herein by Vgq) to be supplied to the gate bus lines. As a result, as shown in portion (i) of FIG. 22, the pixel data write pulses Pw are sequentially applied to the gate bus lines GL1 through GLm.

Rearrangement of Data

Next, it will be described with reference to FIGS. 23, 24A and 24B how to rearrange data. In the following example, one vertical scanning period V-total is 1,125H, one effective display period V-Disp is 1,080H and one vertical blanking interval is 45H.

FIG. 23 is a block diagram illustrating a rearrangement circuit diagrammatically. FIG. 24A is a schematic representation illustrating how to rearrange data, while FIG. 24B shows the encircled portion y of FIG. 24A on a larger scale.

As shown in FIG. 23, the rearrangement circuit 550 includes a rearrangement controller 552, an odd line rearrangement memory 554A and an even line rearrangement memory 554B. The rearrangement circuit 550 may be provided in the display controller 150 shown in FIG. 1, for example.

The rearrangement controller 552 receives image data to present, a vertical sync signal and a horizontal sync signal to be synchronized with the image data, and a control signal for controlling the display operation. The input image data is split into odd lines and even lines, of which the image data are written onto the odd and even line rearrangement memories 554A and 554B, respectively.

After the image data have been written onto the rearrangement memories 554A and 554B for a certain period of time, the rearrangement controller 552 reads data continuously from the odd line rearrangement memory 554A and then from the even line rearrangement memory 554B back to back.

In this case, according to the source line inversion drive in which each frame is split into first and second subframes, the number of data items is counted and controlled in the rearrangement circuit 552 so that it is not until the image data corresponding to at least a half (e.g., 540H or more) of one effective display period V-Disp (which lasts 1,080H, for example) has been written onto the odd and even line rearrangement memories 554A and 554B that data starts to be read. Likewise, even when the block inversion drive is adopted, by counting the number of data items in the rearrangement controller 552 based on the numbers of lines of the first, second, third and fourth subframes, settings are made to get ready to read data from the odd and even line rearrangement memories 554A and 554B.

For example, when image data is input to the rearrangement controller 552 as indicated by the input signal shown in portion (a) of FIG. 24B, that data is split into two and then sequentially written onto the odd and even line rearrangement memories as shown in portion (b) of FIG. 24B. As NsV=10 in this example, after at least 10 lines of data have been introduced into the rearrangement memories, the data starts to be read from the odd line rearrangement memory with the job of introducing the sequentially input data into the rearrangement memories continued.

In this case, 10 lines (i.e., $1^{st}$, $3^{rd}$, $5^{th}$, ... and $19^{th}$ lines) of data are continuously read from the odd line rearrangement memory and then 10 lines (i.e., $2^{nd}$, $4^{th}$, $6^{th}$, ... and $20^{th}$ lines) of data are continuously read from the even line rearrangement memory. After that, 10 more lines (i.e., $22^{nd}$, $24^{th}$, $26^{th}$, ... and $40^{th}$ lines) of data are continuously read from the even line rearrangement memory again and then 10 more lines (i.e., $21^{st}$, $23^{rd}$, $25^{th}$, ... and $39^{th}$ lines) of data are continuously read from the odd line rearrangement memory again. By getting these series of operations controlled by the rearrangement controller 552 so that these operations are performed repeatedly, the data is sequentially read through the last line from the rearrangement memories.

In the example illustrated in FIG. 24A, one effective display period V-Disp (of 1,080H) is divisible by α (of 20H), and therefore, data in the vicinity of the last line can also be rearranged in the same way. On the other hand, unless V-Disp is divisible by α, after V-Disp has been divided by α, the remainder may be split into even and odd lines, their data may be written onto the respective rearrangement memories, and the read cycle time may be changed only on even and odd lines in the vicinity of the last line.

On TV Receiver

Hereinafter, an example in which a liquid crystal display device according to the present invention is used in a TV receiver will be described.

FIG. 25(a) is a block diagram illustrating a configuration for a display device 800 for a TV receiver. The display device 800 includes a Y/C separator 80, a video chroma circuit 81, an A/D converter 82, an LCD controller 83, an LCD panel 84, a backlight driver 85, a backlight 86, a microcomputer 87 and a grayscale circuit 88. The LCD panel 84 includes a display section, which is implemented as an active-matrix-addressed array of pixels, and a source driver and a gate driver for driving the display section.

In the display device 800 with such a configuration, first of all, a composite color video signal Scv is input externally as a television signal to the Y/C separator 80, where the video signal is separated into a luminance signal and a chrominance signal. These luminance and chrominance signals are then converted by the video chroma circuit 81 into an analog RGB signal representing the three primary colors of light, which is then converted by the A/D converter 82 into a digital RGB signal to be input to the LCD controller 83 after that. Meanwhile, the Y/C separator 80 also extracts horizontal and vertical sync signals from the composite color video signal Scv that has been input externally and then passes them to the LCD controller 83, too, by way of the microcomputer 87.

The LCD controller 83 generates and outputs a driver data signal based on the digital RGB signal that has been supplied from the A/D converter 82 (and that corresponds to the digital video signal Dv in the preferred embodiments described above). In addition, the LCD controller 83 also generates a timing control signal for operating a source driver and a gate driver in the LCD panel 84 just as described for the preferred embodiments of the present invention based on the sync signals and then gives those timing control signals to the source driver and the gate driver. Meanwhile, the grayscale circuit 88 generates grayscale voltages for the three primary colors R, G and B for color display and also supplies those grayscale voltages to the LCD panel 84.

Based on the driver data signal, timing control signal and grayscale voltages, the internal source and gate drivers of the LCD panel 84 generate drive signals (such as a data signal and a scan signal). And based on those drive signals, a color image is presented on the display screen in the LCD panel 84. To present an image on this LCD panel 84, the LCD panel 84 needs to be irradiated with light from behind it. In this display device 800, the backlight driver 85 drives the backlight 86 under the control of the microcomputer 87, thereby irradiating the LCD panel 84 with light coming from behind it.

The control of the overall system, including the processing described above, is carried out by the microcomputer 87. As the externally input video signal (i.e., the composite color video signal), not only a video signal representing a TV broadcast but also a video signal captured with a camera and a video signal that has been transmitted over the Internet can be used as well. And an image based on any of those various video signals can be presented on this display device 800.

When an image representing a TV broadcast is presented on the display device 800 with such a configuration, a tuner section 90 is connected to the display device 800 as shown in FIG. 25(b). That tuner section 90 extracts a signal representing a channel to receive from the broadcasting wave (i.e., RF signal) that has been received at an antenna (not shown), converts the signal into an intermediate frequency signal, and detects that intermediate frequency signal, thereby extracting a composite color video signal Scv as a TV signal. That composite color video signal Scv is input to the display device 800 as described above, where an image represented by the composite color video signal Scv is presented.

In the preferred embodiments described above, a multi-pixel structure in which two subpixels belonging to two different pixels and adjacent to each other in the column direction share a CS bus line has been described as an example. However, the present invention is not necessarily applied to only that particular type of multi-pixel structure. Alternatively, the present invention is also applicable to a configuration in which CS bus lines are provided electrically independently on a subpixel-by-subpixel basis. Thus, the present invention is in no way limited to any particular correlation between CS bus lines and subpixels. Nevertheless, if the multi-pixel structure of the type sharing the same CS bus line between two adjacent subpixels is adopted as in the example described above, CS voltages can be selected so flexibly that the waveforms of respective CS voltages can be defined on an individual basis.

Next, another preferred embodiment of the present invention, which is applied to a liquid crystal display device that provides electrically independent CS bus lines for respective subpixels, will be described with reference to FIGS. 26 and 27.

FIG. 26 shows pixel row numbers (#1 through #40), order of writing (i.e., the order of the pixel rows #1 through #10, #11 through #30 and #31 through #40 to scan), arrangement of bright and dark subpixels on respective rows of pixels, and a timing diagram of source signal voltages, gate signal voltages and CS voltages in a situation where no dummy gate bus lines are provided and where Nsv=10 (α=20). As for the gate signal voltages, only portions corresponding to gate ON pulses Pw are shown.

According to this method, after an odd row has been scanned with a positive voltage, a negative voltage is written on an even row. The source signal voltages are supposed to have constant amplitude for the sake of simplicity. As for the amplitude of a CS voltage, after writing has been done on both of two pixels on two adjacent rows, the CS voltages on a CS bus line shared by one subpixel of one of the two pixels and one subpixel of the other pixel (e.g., CS_2 line shared by pixels on the first and second rows) are changed only once from H level (VcsH) into L level (VcsL). In this example, the CS voltage levels are not changed when the targets of writing are changed between odd and even rows. For example, the CS voltage level at the encircled point Pw indicating the timing to write a voltage on the second row of pixels is the same as the one at the point Pw indicating the timing to write a voltage on the first row of pixels. That is to say, the CS voltage does not change its polarities since the gate signal voltage supplied to the $j^{th}$ gate bus line falls from high to low in a period for writing a voltage on an even row (e.g., a first vertical scanning sub-period) and until the gate signal voltage supplied to the $(j+1)^{th}$ gate bus line falls from high to low in a period for writing a voltage on an odd row (e.g., a second vertical scanning sub-period).

In the example illustrated in FIGS. 13A and 13B, the CS voltage changes its polarities twice since the gate signal voltage supplied to the $j^{th}$ gate bus line (which may be the first row and have a writing order #1) has fallen from high to low during the first vertical scanning sub-period and until the gate signal voltage supplied to the $(j+1)^{th}$ gate bus line (which may be the second row and have a writing order #11) falls from high to low during the second vertical scanning sub-period. On the other hand, in the example illustrated in FIG. 26, the CS voltage never changes its polarity in that interval. Even so, the bright and dark subpixels can be alternately arranged in this order as shown in FIG. 26, thus minimizing jaggedness.

As already described with reference to FIGS. 13A and 13B, if a single vertical scanning period includes a series of two vertical scanning sub-periods in which the source signal voltage has mutually opposite polarities (i.e., the source signal voltages to be applied in the first and second vertical scanning sub-periods belonging to the same vertical scanning period have mutually opposite polarities), the CS voltage needs to change its polarities an even number of times (at least twice) during the interval between a point in time when the gate signal voltage supplied to the $j^{th}$ gate bus line falls from high to low during the first vertical scanning sub-period and a point in time when the gate signal voltage supplied to the $(j+1)^{th}$ gate bus line falls from high to low during the second vertical scanning sub-period. However, if an electrically independent CS bus line is provided for each and every subpixel as in this example, the polarity could be changed zero times during that interval. That is to say, the "even number of times" may be regarded as including zero times.

Such a configuration and driving method will work fine in a situation where there are a small number of rows on which a data signal should be written with the same polarity. According to the method shown in FIGS. 13A and 13B, if there were a small number of rows on which a data signal should be written with the same polarity, the CS voltage would have to invert its polarity numerous times. As a result, the CS controller to generate the CS voltage would dissipate a lot of power. On the other hand, according to the method shown in FIG. 26, the CS voltage needs to invert its polarity just once and the power dissipation of the CS controller can be cut down.

Hereinafter, a modified example of the driving method shown in FIG. 26 will be described with reference to FIG. 27. FIG. 27 shows pixel row numbers (#1 through #40), order of writing (i.e., the order of the pixel rows #1 through #10, #11 through #30 and #31 through #40 to scan), arrangement of bright and dark subpixels on respective rows of pixels, and a timing diagram of source signal voltages, gate signal voltages and CS voltages in a situation where no dummy gate bus lines are provided and where Nsv=10 (α=20) as in FIG. 26. As for the gate signal voltages, only portions corresponding to gate ON pulses Pw are shown.

According to the driving method shown in FIG. 26, the interval between a point in time when the gate signal voltage falls from high to low and a point in time when the CS voltage level changes for the first time (i.e., a timing when the CS voltage is subjected to a voltage pull-up or pull-down) has a different length between a row on which writing needs to be done earlier (e.g., the first row) and a row on which writing needs to be done later (e.g., the second row). That is why the effective voltage applied to the pixels will change row by row. As a result, the luminance might get uneven on a row by row basis.

To overcome such a problem, the polarity of the data signal could be inverted in a shorter cycle time. In that case, however, the data signal should invert its polarity a greater number of times, and therefore, either the power dissipation of the data driver or the number of rows where pixels are hard to charge would increase, which is not beneficial. For example, if one horizontal scanning period (1H) were too short, the actual voltage waveform would get blunted when the data signal inverts its polarity. And the pixels would be harder to charge after the polarity has been inverted.

According to the driving method shown in FIG. 27, in the interval between two points in time when writing is done on two pixels on two adjacent even and odd rows, respectively (i.e., since the gate signal voltage supplied to the $j^{th}$ gate bus line has fallen from high to low during the first vertical scanning sub-period and until the gate signal voltage supplied to the $(j+1)^{th}$ gate bus line falls from high to low during the second vertical scanning sub-period), the CS voltage supplied to the CS bus line shared by those two rows of pixels has its levels changed twice. In this case, the two level changes are equivalent to two polarity inversions. Optionally, the number of times of the level changes (or polarity inversions) of the CS voltage could be more than twice. After writing has been done on the latter row of pixels (i.e., the $(j+1)^{th}$ row), the level of the CS voltage is fixed at a center potential level Vcsc. In this case, the center potential Vcsc of the CS voltage is a time average of Vcs. If a portion of the waveform in which the CS voltage changes its polarity is an oscillating waveform that oscillates between two levels with a duty ratio of one to one, the center potential Vcsc is exactly an intermediate level between the higher and lower levels of the CS voltage. Typically, Vcsc is approximately equal to Vcom that is the potential level at the counter electrode.

Comparing FIGS. 26 and 27 to each other, it can be seen that according to the driving method shown in FIG. 27, the interval between the fall of the gate signal voltage from high to low and the first change of the CS voltage level (i.e., the timing when the CS voltage is subjected to a voltage pull-up or pull-down) has almost the same length between the row on which writing needs to be done earlier (e.g., the first row) and the row on which writing needs to be done later (e.g., the second row). As a result, the row-by-row luminance unevenness that might be produced by the driving method shown in FIG. 26 can be eliminated according to the driving method shown in FIG. 27.

Consequently, the preferred embodiments of the present invention described above provides a liquid crystal display device that can still minimize the deterioration in display quality even if either the source line inversion driving method or the block inversion driving method is applied to the multi-pixel technology.

When viewed from a different angle, the liquid crystal display device of the preferred embodiment described above can overcome the problem with the conventional block inversion driving method that luminance unevenness is produced on each of adjacent rows of pixels in the column direction (i.e., along the source bus lines). Hereinafter, it will be described exactly what the problem with the conventional block inversion drive is and why the liquid crystal display device of this preferred embodiment can overcome that problem.

First of all, it will be described with reference to FIGS. 28 and 29 why such luminance unevenness is produced on each of rows of pixels that are adjacent to each other in the column direction (i.e., along source bus lines) if the block inversion drive is carried out on a conventional liquid crystal display device with no multi-pixel structure.

FIG. 28 shows the polarities of source signal voltages to be written on pixels (where the polarities in parentheses are those of pixels in the previous frame) and variations in voltage due to coupling between pixels that are adjacent to each other in the column direction (as indicated by the arrows in FIG. 28) in a situation where the block inversion drive is carried out on a conventional liquid crystal display device with no multi-pixel structure. The gate ON pulses Pw indicating the write timings are also schematically shown in FIG. 28.

Now look at a pixel on the third row shown in FIG. 28. When a positive source signal voltage is written on a pixel on the third row in the current frame, the voltage held by the pixel changes its polarities from negative into positive. After that, when a negative source signal voltage is written on a pixel on the second row that is upwardly adjacent to the third row, the voltage held by the pixel on the second row changes its polarities from positive into negative. At this point in time, due to capacitance coupling between pixels that are adjacent to each other in the column direction, the voltage at the pixel on the third row is pulled down (as indicated by the arrow AW1 in FIG. 28). Subsequently, when a negative source signal voltage is written on a pixel on the fourth row that is downwardly adjacent to the third row, the voltage held by the pixel on the fourth row also changes its polarities from positive into negative. As a result, the voltage at the pixel on the third row is also pulled down (as indicated by the arrow AW2 in FIG. 28). In this manner, after the source signal voltage has been written on the pixel on the third row in the current frame, the voltage at that pixel on the third row is pulled down twice when the source signal voltages of the opposite polarity are written on the up- and downwardly adjacent even rows. That is to say, the voltage at the pixel on the third row is pulled down twice in a frame. As a result, the luminance unevenness could be sensible row by row.

Next, look at a pixel on the tenth row shown in FIG. 28. When a negative source signal voltage is written on a pixel on the tenth row in the current frame, the voltage held by the pixel changes its polarities from positive into negative. After that, when a positive source signal voltage is written on a pixel on the ninth row that is upwardly adjacent to the tenth row, the voltage held by the pixel on the ninth row changes its polarities from negative into positive. At this point in time, due to capacitance coupling between pixels that are adjacent to each other in the column direction, the voltage at the pixel on the tenth row is pulled up (as indicated by the arrow AW3 in FIG. 28). Subsequently, when a positive source signal voltage is written on a pixel on the eleventh row that is downwardly adjacent to the tenth row, the voltage held by the pixel on the eleventh row also changes its polarities from negative into positive. As a result, the voltage at the pixel on the tenth row is also pulled up (as indicated by the arrow AW4 in FIG. 28). In this manner, after the source signal voltage has been written on the pixel on the tenth row in the current frame, the voltage at that pixel on the tenth row is pulled up twice when the source signal voltages of the opposite polarity are written on the up- and downwardly adjacent odd rows. That is to say, the voltage at the pixel on the tenth row is pulled up twice in a frame.

Thus, the pixel on the tenth row has its voltage pulled up twice in a frame conversely to the pixel on the third row. Consequently, luminance unevenness could be produced between the blocks to which the pixels on the third and tenth rows respectively belong.

Next, look at a pixel on the eighth row shown in FIG. 28. When a source signal voltage is written on that pixel on the eighth row in the current frame, writing has already been done on a pixel on the seventh row that is upwardly adjacent to the eighth row. That is why the voltage held by the pixel on the eighth row is never affected by the pixel on the seventh row. On the other hand, when a positive source signal voltage is written on a pixel on the ninth row that is downwardly adjacent to the eighth row, the voltage held by the pixel on the ninth row changes its polarities from negative into positive. As a result, the voltage at the pixel on the eighth row is pulled up. In this manner, the pixel on the eighth row that is located on the boundary between two blocks has its voltage pulled up only once. That is to say, as a pixel on a block boundary such as the pixel on the eighth row has its voltage pulled up a different number of times from the other pixels in the same block (e.g., a pixel on the tenth row), the luminance unevenness could be sensible.

If such luminance unevenness were produced, horizontal striped unevenness such as the one shown in FIG. 29 could be sensible. FIG. 29 schematically illustrates a display state of a certain frame when a grayscale tone is displayed over the entire screen of a conventional liquid crystal display device with no multi-pixel structure by the block inversion drive. As shown in FIG. 29, if the block inversion drive is carried out on the conventional liquid crystal display device, not only horizontal stripes are visible row by row but also luminance unevenness is sensible between the block to which the third row of pixels belongs and the block to which the tenth row of pixels belongs. In addition, luminance unevenness is also sensible between pixels on a block boundary (such as pixels on the first and eighth rows) and the other pixels of the same block.

If the liquid crystal display device has a multi-pixel structure, however, such a problem can be substantially overcome and the block inversion drive can be used in actual products. This is because if a single pixel is divided into a number of electrically independent subpixels, then only one of those subpixels will be subject to the voltage pull-up or pull-down as a result of a variation in source signal voltage supplied to an adjacent pixel in the column direction.

Hereinafter, it will be described with reference to FIG. 30 what if a block inversion drive is carried out on a liquid crystal display device with the multi-pixel structure shown in FIG. 31.

In the multi-pixel structure shown in FIG. 31, first and second subpixels SP1 and SP-2 are arranged so as to interpose a gate bus line 12, which is associated with a pixel P including the first and second subpixels SP-1 and SP-2, between them and are represented by the equivalent circuit shown in FIG. 2. That is to say, the multi-pixel structure shown in FIG. 31 may be the same as that of the liquid crystal display device of the preferred embodiment described above. Thus, any pair of components having substantially the same function will be identified by the same reference numeral and the description thereof will be omitted herein.

Just like FIG. 28, FIG. 30 shows the polarities of source signal voltages to be written on pixels (where the polarities in parentheses are those of pixels in the previous frame) and variations in voltage due to coupling between pixels that are adjacent to each other in the column direction (as indicated by the arrows in FIG. 30) in a situation where the block inversion drive is carried out on a liquid crystal display device with the multi-pixel structure. Each pixel P includes first and second subpixels SP-1 and SP-2 and the polarity of a voltage to be written and the variation in the voltage are shown on a subpixel-by-subpixel basis.

Now look at a pixel on the third row shown in FIG. 30. When a positive source signal voltage is written on a pixel on the third row in the current frame, the voltage held by the pixel (i.e., the two subpixels SP-1 and SP-2) changes its polarities from negative into positive. After that, when a negative source signal voltage is written on a pixel on the second row that is upwardly adjacent to the third row, the voltage held by the pixel (i.e., the two subpixels SP-1 and SP-2) on the second row changes its polarities from positive into negative. At this point in time, due to capacitance coupling between the pixels that are adjacent to each other in the column direction, the voltage at the pixel on the third row is pulled down (as indicated by the arrow AW5 in FIG. 30). In this case, the capacitance coupling between the pixels on the second and third rows is produced only between the first subpixel SP-1 of the pixel on the third row and the second subpixel SP-2 of the pixel on the second row. That is why only the first subpixel SP-1 of the pixel on the third row has its voltage affected and pulled down by that of the pixel on the second row. Subsequently, when a negative source signal voltage is written on a pixel on the fourth row that is downwardly adjacent to the third row, the voltage held by the pixel on the fourth row also changes its polarities from positive into negative. As a result, the voltage at the pixel on the third row is also pulled down (as indicated by the arrow AW6 in FIG. 30). In this case, only the second subpixel SP-2 of the pixel on the third row has its voltage pulled down.

In this manner, the pixel on the third row as a whole has its voltage pulled down twice a frame but only the first subpixel SP-1 is subjected to the first voltage pull-down and only the second subpixel SP-2 is subjected to the second voltage pull-down. That is why if the variation in the voltage (which will manifest itself as a luminance variation) is considered to be an area average, the outcome is the same as a situation where one pixel has been subjected to a voltage pull-down only once. Consequently, by adopting the multi-pixel structure, the variation in voltage due to the coupling between two pixels that are adjacent to each other in the column direction (i.e., along the source bus lines) can be reduced. As a result, the variation in the luminance of the overall pixel can be reduced significantly and the luminance unevenness described above can be minimized.

In the multi-pixel structure shown in FIG. 31, if the CS bus lines 13a and 13b are electrically independent of each other, the viewing angle dependence of the γ characteristic can be reduced as already described for the liquid crystal display device of the preferred embodiments of the present invention. However, in order to reduce the luminance unevenness to be produced by the block inversion drive, the CS bus lines 13a and 13b do not have to be electrically independent of each other but the subpixel electrodes 11a and 11b have only to be connected to a source bus line 14 by way of mutually independent TFTs 16a and 16b. That is why the liquid crystal display device may also be designed such that the subpixels SP-1 and SP-2 display the same luminance. Also, by arranging the CS bus lines 13a and 13b between two pixels that are adjacent to each other along the source bus lines, the coupling between the pixels can be reduced.

To reduce the coupling between two pixels that are adjacent to each other along the source bus lines, an auxiliary line, of which the potential is controlled to a predetermined value, may be arranged in place of the CS bus lines 13a and 13b. The voltage supplied to the auxiliary line is preferably the same as the voltage Vcom applied to the counter electrode. Optionally, the CS bus lines 13a and 13b (or auxiliary line) may be omitted as well.

Alternatively, the multi-pixel structure shown in FIG. 32 may also be adopted. The pixel shown in FIG. 32 also includes first and second subpixels SP-1 and SP-2 but the second subpixel electrode 11b is interposed in the column direction between the upper and lower portions of the first subpixel electrode 11a, which further has a portion that couples together those upper and lower portions located over and under the second subpixel electrode 11b and which has a U-shape as a whole. The TFTs 16a and 16b that are connected to the first and second subpixel electrodes 11a and 11b have their ON and OFF states controlled by independent gate bus lines 12a and 12b, respectively.

If the multi-pixel structure shown in FIG. 32 is adopted, only the first subpixel SP-1 produces coupling with pixels that are adjacent to it in the column direction. That is why only the first subpixel SP-1 has its voltage pulled up or down by the adjacent pixels and the second subpixel SP-2 is never affected. Consequently, the variation in the luminance of the overall pixel can be further reduced and therefore the luminance unevenness can be prevented even more effectively. Naturally, even if such a multi-pixel structure is adopted, the same effects as the ones already described for the preferred embodiments of the present invention can also be achieved by getting mutually different luminances displayed by the first and second subpixels SP-1 and SP-2.

Hereinafter, another preferred embodiment of the present invention will be described as being applied to a situation where the block inversion drive is applied to a liquid crystal display device with a multi-pixel structure that is designed so that the respective subpixels can exhibit mutually different luminances. It will be described how the phase of a CS voltage changes according to the timing to turn a TFT OFF (specifically, how CS trunks and CS bus lines are connected together). In this example, the connection pattern of CS trunks as disclosed in Patent Document No. 3, which can extend one oscillation period of the CS voltage, is adopted. In the following description, one period of connection between the CS trunks and CS bus lines to produce the oscillating waveform of the CS voltage (which typically has a duty ratio of one to one) is represented by $2 \times K \times L \times H$ (where K is a positive integer, L is the number of electrically independent CS trunks and H is one horizontal scanning period) after Patent Document No. 3. One period of the oscillating waveform of the CS voltage can be at most as long as $2 \times K \times L \times H$.

According to the connection pattern of CS trunks shown in FIG. 33, L=12, K=1 and there are 24 CS trunks and bus lines.

As shown in FIG. 33, each CS bus line is connected to any of the twelve CS trunks CS1 through CS12 and is associated in common with two subpixels that belong to two different pixels and that are adjacent to each other in the column direction. That is to say, each CS bus line is connected to the respective storage capacitor counter electrodes of its associated two subpixels that belong to two different pixels and that are adjacent to each other in the column direction.

Specifically, a CS bus line, to which the storage capacitor counter electrode of the upper subpixel SP-1 of a pixel on the first row is connected, is connected to the CS trunk CS1, while a CS bus line, to which the storage capacitor counter electrode of the lower subpixel SP-2 of the pixel on the first row is connected, is connected to the CS trunk CS2. A CS bus line, to which the storage capacitor counter electrode of the upper subpixel SP-1 of a pixel on the second row is connected, is the same as the CS bus line to which the storage capacitor counter electrode of the lower subpixel SP-2 of the pixel on the first row is connected. A CS bus line, to which the storage capacitor counter electrode of the lower subpixel SP-2 of the pixel on the second row is connected, is connected to the CS trunk CS3, so is the CS bus line to which the storage capacitor counter electrode of the upper subpixel SP-1 of the pixel on the third row is connected. The same relation will be maintained from the CS trunk C4 on until the CS trunk CS12 is associated with the upper subpixel SP-1 of a pixel on the twelfth row. The CS bus line associated with the lower subpixel SP-2 of the pixel on the twelfth row is connected to the CS trunk CS2 and is also associated with the upper subpixel SP-1 of a pixel on the thirteenth row. The CS bus line associated with the lower subpixel SP-2 of the pixel on the thirteenth row is connected to the CS trunk CS1. Pixels on the twenty-fifth through forty-eighth rows and so on periodically repeat the same connection pattern as the pixels on the first through twenty-fourth rows. That is to say, the connection pattern of the CS bus lines is a periodic one in which 24 CS bus lines form one period.

The following Table 5 summarizes such a connection pattern. In Table 5, CS bus lines connected to the CS trunk CS1 are identified by CSBL(n−1)B, (n)A and CSBL(n+12)B, (n+13)A. In this case, CSBL(n−1)B, (n)A denotes a CS bus line associated with subpixel B (i.e., the lower subpixel) of a pixel on the $(n-1)^{th}$ row and subpixel A (i.e., the upper subpixel) of a pixel on the $n^{th}$ row. In the same way, CSBL(n+12)B, (n+13)A denotes a CS bus line associated with subpixel B (i.e., the lower subpixel) of a pixel on the $(n+12)^{th}$ row and subpixel A (i.e., the upper subpixel) of a pixel on the $(n+13)^{th}$ row. In this example, n=1, 25, 49, and so on. And a situation where n=1 is illustrated in FIG. 33.

TABLE 5

| CS trunk | CS bus lines connected to the CS trunk |
|---|---|
| CS1 | CSBL__(n − 1)B, (n)A |
|  | CSBL__(n + 12)B, (n + 13)A |
| CS2 | CSBL__(n)B, (n + 1)A |
|  | CSBL__(n + 11)B, (n + 12)A |
| CS3 | CSBL__(n + 1)B, (n + 2)A |
|  | CSBL__(n + 14)B, (n + 15)A |
| CS4 | CSBL__(n + 2)B, (n + 3)A |
|  | CSBL__(n + 13)B, (n + 14)A |
| CS5 | CSBL__(n + 3)B, (n + 4)A |
|  | CSBL__(n + 16)B, (n + 17)A |
| CS6 | CSBL__(n + 4)B, (n + 5)A |
|  | CSBL__(n + 15)B, (n + 16)A |
| CS7 | CSBL__(n + 5)B, (n + 6)A |
|  | CSBL__(n + 18)B, (n + 19)A |

TABLE 5-continued

| CS trunk | CS bus lines connected to the CS trunk |
|---|---|
| CS8 | CSBL__(n + 6)B, (n + 7)A |
|  | CSBL__(n + 17)B, (n + 18)A |
| CS9 | CSBL__(n + 7)B, (n + 6)A |
|  | CSBL__(n + 20)B, (n + 21)A |
| CS10 | CSBL__(n + 8)B, (n + 7)A |
|  | CSBL__(n + 19)B, (n + 20)A |
| CS11 | CSBL__(n + 9)B, (n + 10)A |
|  | CSBL__(n + 22)B, (n + 23)A |
| CS12 | CSBL__(n + 10)B, (n + 11)A |
|  | CSBL__(n + 21)B, (n + 22)A |

L = 12, K = 1
where n = 1, 25, 49, etc.

As can be seen from Table 5, according to this connection pattern of CS bus lines shown in FIG. 33, either
CSBL_(p)B, (p+1)A and
CSBL_(p+13)B, (p+14)A
or
CSBL_(p+1)B, (p+2)A and
CSBL_(p+12)B, (p+13)A
(where p=1, 3, 5, ... or p=0, 2, 4, ...)
form a pair of electrically equivalent CS bus lines.

If this relation is represented with the parameters L and K described above, it can be seen that for an arbitrary p, one of the following two pairs of CS bus lines:
CSBL_(p+2×(K−1))B, (p+2×(K−1)+1)A and
CSBL_(p+2×(K−1)+K×L+1))B, (p+2×(K−1)+K×L+2)A
or
CSBL_(p+2×(K−1)+1)B, (p+2×(K−1)+2)A and
CSBL_(p+2×(K−1)+K×L)B, (p+2×(K−1)+K×L+1)A
needs to be a pair of electrically equivalent CS bus lines. In this case, p=1, 3, 5, ... or p=0, 2, 4, ....

If a liquid crystal display device with the CS trunk connection pattern shown in FIG. 33 is driven by the dot inversion drive, then the phase of CS voltages (in this case, the number of electrically independent CS trunks is 12) and the timings to turn a TFT OFF (which will be referred to herein as "to turn the gate OFF") satisfy the relation shown in FIG. 34, where the timing to turn a TFT OFF is indicated by the fall of a gate ON pulse Pw. In this example, each CS voltage includes a rectangular wave consisting of just High and Low levels (with a duty ratio of one to one). When the dot inversion drive is carried out, one period of the oscillating waveform of the CS voltage (with a duty ratio of one to one) is represented by 2×K×L×H. In the example illustrated in FIG. 34, if L=12 and K=1, then one oscillation period is 24H. Supposing the potential Vcom at the counter electrode is a reference level, the High and Low levels of the CS voltage are typically positive and negative, respectively. Thus, the CS voltage level variation of this example involves a change of the polarities of the CS voltage.

If the dot inversion drive is carried out, then the gates are sequentially turned ON as shown in FIG. 34. That is to say, gate ON pulses Pw are sequentially applied one after another at regular intervals of 1H. For example, the storage capacitor of the first subpixel SP-1 of a pixel on the first row, of which the timing to write is controlled with Pw1 supplied through a gate bus line G1, is supplied with a CS voltage CS1 (which refers to a CS voltage supplied through the CS trunk CS1 shown in FIG. 33 and the other CS voltages will be identified in the same way). On the other hand, the storage capacitor of the subpixel SP-2 is supplied with a CS voltage CS2. Also, the storage capacitor of the first subpixel SP-1 of a pixel on the second row, of which the timing to write is controlled with Pw2 supplied through a gate bus line G2, is supplied with a CS voltage CS2. On the other hand, the storage capacitor of the subpixel SP-2 is supplied with a CS voltage CS3. In this case, the interval between the fall of Pw1 and the rise of the oscillating waveform of CS1 is identified herein by t1, the interval between the fall of Pw2 and the rise of the oscillating waveform of CS2 by t2, and the interval between the fall of Pw2 and the rise of the oscillating waveform of CS3 by t3.

On the other hand, if a liquid crystal display device with the CS trunk connection pattern shown in FIG. 33 is driven by the block inversion drive, then the phase of CS voltages (in this case, the number of electrically independent CS trunks is 12) and the timings to turn a TFT OFF satisfy the relation shown in FIG. 35. When the block inversion drive is carried out, one period of the oscillating waveform of the CS voltage (with a duty ratio of one to one) is represented by K×L×H (where K is a positive integer, L is the number of electrically independent CS trunks, and H is one horizontal scanning period). In the example illustrated in FIG. 35, if L=12 and K=1, then one oscillation period is 12H. That is to say, if the block inversion drive is carried out, either odd lines or even lines are scanned first with the rest skipped. As a result, the interval between the timing to turn a TFT OFF (i.e., a point in time when Pw falls) and the timing to change the CS voltage levels shortens.

For example, suppose the interval between the fall of Pw2 and the rise of the oscillating waveform of CS2 is identified herein by t4 and the interval between the fall of Pw2 and the rise of the oscillating waveform of CS3 is t5 in FIG. 35. Comparing FIGS. 34 and 35 to each other, it can be seen that the length of the interval between the turn-OFF of a TFT and the first change of the CS voltage level is different at most by 2H (t3-t2) according to the dot inversion drive (see FIG. 34) but at most by 1H (t5-t4) according to the block inversion drive (see FIG. 35). That is to say, the block inversion drive results in a maximum difference that is smaller by 1H than that of the dot inversion drive. Thus, according to the block inversion drive, in that interval between a point in time when the gate signal voltage falls from high to low and the first change of the CS voltage level, the biggest difference between pixel rows becomes smaller than a situation where the dot inversion drive is adopted. Since the difference can be reduced by adopting the block inversion drive, the difference in the effective value of a pixel voltage, which has been either pulled up or down due to a variation in the level of the CS voltage, over one frame period (1F) can be reduced between respective rows. As a result, the luminance unevenness can be eliminated.

Also, if the block inversion drive is carried out, one period of the oscillating waveform of the CS voltage decreases to a half of the situation where the dot inversion drive is carried out. Thus, to extend one oscillation period of the CS voltage without increasing the number of CS trunks (i.e., the types of CS voltages), a CS trunk connection pattern such as the one shown in FIG. 36 may be adopted.

According to the CS trunk connection pattern shown in FIG. 36, L=12, K=2, and the respective CS trunks and CS bus lines are connected together at a rate of 48 lines per period.

As shown in FIG. 36, each CS bus line is connected to any of the twelve CS trunks CS1 through CS12 and is associated in common with two subpixels that belong to two different pixels and that are adjacent to each other in the column direction. That is to say, each CS bus line is connected to the respective storage capacitor counter electrodes of its associated two subpixels that belong to two different pixels and that are adjacent to each other in the column direction.

Specifically, a CS bus line, to which the storage capacitor counter electrode of the upper subpixel SP-1 of a pixel on the first row is connected, is connected to the CS trunk CS1, while a CS bus line, to which the storage capacitor counter electrode of the lower subpixel SP-2 of the pixel on the first row is connected, is connected to the CS trunk CS2. A CS bus line, to which the storage capacitor counter electrode of the upper subpixel SP-1 of a pixel on the second row is connected, is the same as the CS bus line to which the storage capacitor counter electrode of the lower subpixel SP-2 of the pixel on the first row is connected. A CS bus line, to which the storage capacitor counter electrode of the lower subpixel SP-2 of the pixel on the second row is connected, is connected to the CS trunk CS1, so is the CS bus line to which the storage capacitor counter electrode of the upper subpixel SP-1 of the pixel on the third row is connected. A CS bus line, to which the storage capacitor counter electrode of the upper subpixel SP-1 of a pixel on the fourth row is connected, is the same as the CS bus line to which the storage capacitor counter electrode of the lower subpixel SP-2 of the pixel on the third row is connected. A CS bus line, to which the storage capacitor counter electrode of the lower subpixel SP-2 of the pixel on the fourth row is connected, is connected to the CS trunk CS3, so is the CS bus line to which the storage capacitor counter electrode of the upper subpixel SP-1 of the pixel on the fifth row is connected. That is to say, the CS trunks to which the CS bus lines are connected are in the order of CS1, CS2, CS1, CS2, CS3, CS4, CS3, CS4, CS5, and so on.

After that, a CS bus line, to which the storage capacitor counter electrode of the upper subpixel SP-1 of a pixel on the $25^{th}$ row is connected, is connected to the CS trunk CS2, while a CS bus line, to which the storage capacitor counter electrode of the lower subpixel SP-2 of the pixel on the $25^{th}$ row is connected, is connected to the CS trunk CS1 (not shown from the $25^{th}$ row on). A CS bus line, to which the storage capacitor counter electrode of the upper subpixel SP-1 of a pixel on the $26^{th}$ row is connected, is the same as the CS bus line to which the storage capacitor counter electrode of the lower subpixel SP-2 of the pixel on the $25^{th}$ row is connected. A CS bus line, to which the storage capacitor counter electrode of the lower subpixel SP-2 of the pixel on the $26^{th}$ row is connected, is connected to the CS trunk CS2, so is the CS bus line to which the storage capacitor counter electrode of the upper subpixel SP-1 of the pixel on the $27^{th}$ row is connected. A CS bus line, to which the storage capacitor counter electrode of the upper subpixel SP-1 of a pixel on the $28^{th}$ row is connected, is the same as the CS bus line to which the storage capacitor counter electrode of the lower subpixel SP-2 of the pixel on the $27^{th}$ row is connected. A CS bus line, to which the storage capacitor counter electrode of the lower subpixel SP-2 of the pixel on the $28^{th}$ row is connected, is connected to the CS trunk CS4, so is the CS bus line to which the storage capacitor counter electrode of the upper subpixel SP-1 of the pixel on the $29^{th}$ row is connected. That is to say, the CS trunks to which the CS bus lines are connected are in the order of CS2, CS1, CS2, CS1, CS4, CS3, CS4, CS3, CS6, and so on.

That is to say, the connection pattern of the CS bus lines is a periodic one in which 48 CS bus lines form one period. The following Table 6 summarizes such a connection pattern. In Table 6, CS bus lines connected to the CS trunk CS1 are identified by CSBL(n-1)B, (n)A and CSBL(n+12)B, (n+13)A. In this case, CSBL(n-1)B, (n)A denotes a CS bus line associated with subpixel B (i.e., the lower subpixel) of a pixel on the $(n-1)^{th}$ row and subpixel A (i.e., the upper subpixel) of a pixel on the $n^{th}$ row. In the same way, CSBL(n+12)B, (n+13)A denotes a CS bus line associated with subpixel B (i.e., the lower subpixel) of a pixel on the $(n+12)^{th}$ row and subpixel A (i.e., the upper subpixel) of a pixel on the $(n+13)^{th}$ row. In this example, n=1, 49, 97, and so on. And the first 25 CS bus lines in a situation where n=1 are illustrated in FIG. 36.

TABLE 6

| CS trunk | CS bus lines connected to the CS trunk |
|---|---|
| CS1 | CSBL_(n − 1)B, (n)A |
|  | CSBL_(n + 1)B, (n + 2)A |
|  | CSBL_(n + 24)B, (n + 25)A |
|  | CSBL_(n + 26)B, (n + 27)A |
| CS2 | CSBL_(n)B, (n + 1)A |
|  | CSBL_(n + 2)B, (n + 3)A |
|  | CSBL_(n + 23)B, (n + 24)A |
|  | CSBL_(n + 25)B, (n + 26)A |
| CS3 | CSBL_(n + 3)B, (n + 4)A |
|  | CSBL_(n + 5)B, (n + 6)A |
|  | CSBL_(n + 28)B, (n + 29)A |
|  | CSBL_(n + 30)B, (n + 31)A |
| CS4 | CSBL_(n + 4)B, (n + 5)A |
|  | CSBL_(n + 6)B, (n + 7)A |
|  | CSBL_(n + 27)B, (n + 28)A |
|  | CSBL_(n + 29)B, (n + 30)A |
| CS5 | CSBL_(n + 7)B, (n + 8)A |
|  | CSBL_(n + 9)B, (n + 10)A |
|  | CSBL_(n + 32)B, (n + 33)A |
|  | CSBL_(n + 34)B, (n + 35)A |
| CS6 | CSBL_(n + 8)B, (n + 9)A |
|  | CSBL_(n + 10)B, (n + 11)A |
|  | CSBL_(n + 31)B, (n + 32)A |
|  | CSBL_(n + 33)B, (n + 34)A |
| CS7 | CSBL_(n + 11)B, (n + 12)A |
|  | CSBL_(n + 13)B, (n + 14)A |
|  | CSBL_(n + 36)B, (n + 37)A |
|  | CSBL_(n + 38)B, (n + 39)A |
| CS8 | CSBL_(n + 12)B, (n + 13)A |
|  | CSBL_(n + 14)B, (n + 15)A |
|  | CSBL_(n + 35)B, (n + 36)A |
|  | CSBL_(n + 37)B, (n + 38)A |
| CS9 | CSBL_(n + 15)B, (n + 16)A |
|  | CSBL_(n + 17)B, (n + 18)A |
|  | CSBL_(n + 40)B, (n + 41)A |
|  | CSBL_(n + 42)B, (n + 43)A |
| CS10 | CSBL_(n + 16)B, (n + 17)A |
|  | CSBL_(n + 18)B, (n + 19)A |
|  | CSBL_(n + 39)B, (n + 40)A |
|  | CSBL_(n + 41)B, (n + 42)A |
| CS11 | CSBL_(n + 19)B, (n + 20)A |
|  | CSBL_(n + 21)B, (n + 22)A |
|  | CSBL_(n + 44)B, (n + 45)A |
|  | CSBL_(n + 46)B, (n + 46)A |
| CS12 | CSBL_(n + 20)B, (n + 21)A |
|  | CSBL_(n + 22)B, (n + 23)A |
|  | CSBL_(n + 43)B, (n + 44)A |
|  | CSBL_(n + 45)B, (n + 46)A |

L = 12, K = 2
n = 1, 49, 97, etc.

As can be seen from Table 6, according to this connection pattern of CS bus lines shown in FIG. 36, either CSBL_(p)B, (p+1)A
CSBL_(p+2)B, (p+3)A
and
CSBL_(p+25)B, (p+26)A
CSBL_(p+27)B, (p+28)A
or
CSBL_(p+1)B, (p+2)A
CSBL_(p+3)B, (p+4)A
and
CSBL_(p+24)B, (p+25)A
CSBL_(p+26)B, (p+27)A
(where p=1, 3, 5, . . . or p=0, 2, 4, . . . )
form a set of electrically equivalent CS bus lines.

If this relation is represented with the parameters L and K described above, it can be seen that for an arbitrary p, one of the following two sets of CS bus lines:

CSBL_(p+2×(1−1))B, (p+2×(1−1)+1)A
CSBL_(p+2×(K−1))B, ((K−1)+1)A,
and
CSBL_(p+2×(1−1)+K×L+1)B, (p+2×(1−1)+K×L+2)A,
CSBL_(p+2×(K−1)+K×L+1)B, (p+2×(K−1)+K×L+2)A
or
CSBL_(p+2×(1−1)+1)B, (p+2×(1−1)+2)A,
CSBL_(p+2×(K−1)+1)B, (p+2×(K−1)+2)A
and
CSBL_(p+2×(1−1)+K×L)B, (p+2×(1−1)+K×L+1)A,
CSBL_(p+2×(K−1)+K×L)B, (p+2×(K−1)+K×L+1)A needs to be a set of electrically equivalent CS bus lines. In this case, p=1, 3, 5, . . . or p=0, 2, 4, . . . .

In the examples described above, the parameters K and L are supposed to satisfy K=1 and L=12 or K=2 and L=12. However, the present invention is not necessarily applied to these CS bus line patterns. Rather K just needs to be a positive integer (i.e., K=1, 2, 3, 4, 5, 6, 7, 8, 9 and so on), L just needs to be an even number (i.e., L=2, 4, 6, 8, 10, 12, 14, 16, 18 and so on), and K and L may be defined within these ranges independently of each other.

In that case, the CS trunks and CS bus lines just need to be connected together following the rules described above.

Specifically, if the parameters K and L described above are K and L, respectively (i.e., K=K and L=L), then the CS bus lines connected to the same trunk (i.e., electrically equivalent CS bus lines) may be $$CSBL\_(p + 2 \times (1 - 1))B, (p + 2 \times (1 - 1) + 1)A,$$
$$CSBL\_(p + 2 \times (2 - 1))B, (p + 2 \times (2 - 1) + 1)A,$$
$$CSBL\_(p + 2 \times (3 - 1))B, (p + 2 \times (3 - 1) + 1)A,$$
$$...$$
$$CSBL\_(p + 2 \times (K - 1))B, (p + 2 \times (K - 1) + 1)A$$

and $$CSBL\_(p + 2 \times (1 - 1) + K \times L + 1)B, (p + 2 \times (1 - 1) + K \times L + 2)A,$$
$$CSBL\_(p + 2 \times (2 - 1) + K \times L + 1)B, (p + 2 \times (2 - 1) + K \times L + 2)A,$$
$$CSBL\_(p + 2 \times (3 - 1) + K \times L + 1)B, (p + 2 \times (3 - 1) + K \times L + 2)A,$$
$$...$$
$$CSBL\_(p + 2 \times (K - 1) + K \times L + 1)B, (p + 2 \times (K - 1) + K \times L + 2)A$$

or $$CSBL\_(p + 2 \times (1 - 1) + 1)B, (p + 2 \times (1 - 1) + 2)A,$$
$$CSBL\_(p + 2 \times (2 - 1) + 1)B, (p + 2 \times (2 - 1) + 2)A,$$
$$CSBL\_(p + 2 \times (3 - 1) + 1)B, (p + 2 \times (3 - 1) + 2)A,$$
$$...$$
$$CSBL\_(p + 2 \times (K - 1) + 1)B, (p + 2 \times (K - 1) + 2)A$$

and $$CSBL\_(p + 2 \times (1 - 1) + K \times L)B, (p + 2 \times (1 - 1) + K \times L + 1)A,$$

$$CSBL\_(p + 2 \times (2 - 1) + K \times L)B, (p + 2 \times (2 - 1) + K \times L + 1)A,$$

$$CSBL\_(p + 2 \times (3 - 1) + K \times L)B, (p + 2 \times (3 - 1) + K \times L + 1)A,$$

...

$$CSBL\_(p + 2 \times (K - 1) + K \times L)B, (p + 2 \times (K - 1) + K \times L + 1)A$$

In this case, p=1, 3, 5, . . . or p=0, 2, 4, . . . .

Furthermore, if the parameters K and L described above are K and L, respectively (i.e., K=K and L=L), one oscillation period of the oscillating voltage applied to the CS bus lines may be 2×K×L, times as long as one horizontal scanning period.

If the CS bus lines are connected to the CS trunks as shown in FIG. 36, the timings to turn TFTs OFF and the phases of the CS voltages will satisfy the relation shown in FIG. 37 when a dot inversion drive is carried out. Comparing FIG. 37 to FIG. 34, it can be seen easily that even when the dot inversion drive is carried out, one period of the oscillating waveform of the CS voltage can be extended by adopting the connection pattern shown in FIG. 36. In that case, however, the interval between the turn-OFF of a TFT and the first change of the CS voltage level will be at most 4H (t'5-t'4).

Such a time lag of more than 2H will result in a difference between the effective values of the voltages applied to respective subpixels and eventually in a difference in luminance. FIG. 39 schematically illustrates the display state of a certain frame when a grayscale tone is displayed over the screen by driving a liquid crystal display device with the CS trunk connection pattern shown in FIG. 36 by the dot inversion drive. As shown in FIG. 39, horizontal stripes with gradations will be seen on the screen to have a width of four lines each. Specifically, if the interval between the turn-OFF of a TFT and the first change of the CS voltage level varies one subpixel row after another, then the ratio of the sum of H level periods to that of L level periods during one frame period of the oscillating waveform of the CS voltage will deviate from one to one. In that case, the influence of the voltage pull-up or pull-down on the voltages applied to the subpixels will produce different effective values. Hereinafter, the reason will be described briefly with reference to portions (a) through (d) of FIG. 40.

FIG. 40 schematically illustrates relations between the gate ON pulse and the oscillating waveform of a CS voltage in a situation where the interval between the turn-OFF of a TFT and the first change of the CS voltage level varies. Specifically, portion (a) of FIG. 40 illustrates a situation where the CS voltage level changes right after the TFT has been turned OFF. Portion (b) of FIG. 40 illustrates a situation where there is an interval of 1H after the TFT has been turned OFF and before the CS voltage level changes for the first time. Portion (c) of FIG. 40 illustrates a situation where there is an interval of 2H after the TFT has been turned OFF and before the CS voltage level changes for the first time. And portion (d) of FIG. 40 illustrates a situation where there is an interval of 3H after the TFT has been turned OFF and before the CS voltage level changes for the first time.

Comparing portions (a) and (b) to each other, it can be seen that the L level period of the CS signal has increased by 1H as indicated by the forward slashes a2 shown in portion (b) and that the H level period of the CS signal has decreased by 1H as indicated by the backward slashes b2. In the same way, comparing portions (a) and (c) to each other, it can be seen that the L level period of the CS signal has increased by 2H at a3 shown in portion (c) and that the H level period thereof has decreased by 2H at b3. And comparing portions (a) and (d) to each other, it can be seen that the L level period of the CS signal has increased by 3H at a4 and that the H level period thereof has decreased by 3H at b4.

That is why the rate of increase of the effective value of the CS voltage in one frame period (1F) is represented by (increase of L level period+decrease of H level period)/(1F period). Specifically, if one frame is 1,125H (=Nv-total), then (1H+1H)/1,125H=0.0018 in portion (b) of FIG. 40, (2H+2H)/1,125H=0.0036 in portion (c), and (3H+3H)/1,125H=0.0053 in portion (d).

Since the effective value of the CS voltage varies in this manner during one frame period, the effective value of the voltage applied to each pixel will also vary during one frame period. As a result, horizontal stripes with gradations appear as shown in FIG. 39.

On the other hand, if the block inversion drive is carried out, one period of the oscillating waveform of the CS voltage as shown in FIG. 38 becomes shorter than in FIG. 37 but longer than in FIG. 35. In the block inversion drive scheme, one period of the oscillating waveform of the CS voltage (with a duty ratio of one to one) is represented by K×L×H (where K is a positive integer, L is the number of electrically independent CS trunks, and H is one horizontal scanning period). In the example illustrated in FIG. 38, if L=12 and K=2, then one oscillation period is 24H. Also, the longest interval after the TFT has been turned OFF and before the CS voltage level changes for the first time is 2H (t'8-t'7). And no luminance unevenness should be sensible according to the ratings described above.

As can be seen, if the CS trunk connection pattern shown in FIG. 36 is combined with the block inversion drive, one period of the oscillating waveform of the CS voltage can be extended without increasing the number of CS trunks. On top of that, since the interval after the gate has been turned OFF and before the voltage level of the CS signal changes for the first time will vary to a lesser degree, the luminance unevenness due to a difference in the highest level the CS voltage can reach or a difference in the effective value of the CS signal can be minimized. For these reasons, such a combination can be used effectively to realize a liquid crystal display device that needs to be driven at high frequencies or with high resolution. If only a small number of horizontal scanning periods (Nv-total) are included in one frame period, the luminance unevenness could still be sensible even when the interval is 2H. In that case, the block inversion drive may be carried out as already described with reference to FIG. 35 by adopting the CS trunk connection pattern shown in FIG. 33.

In the preferred embodiments described above, the slits of a pixel electrode and the slits of a counter electrode are used in combination as domain regulating means. However, the present invention is in no way limited to those specific preferred embodiments. The present invention can be used in not only such a liquid crystal display device that uses slits of a pixel electrode and those, of a counter electrode in combination (such a device is sometimes called a "patterned vertical alignment (PVA) mode" LCD) but also any other VA mode LCD such as a CPA (continuous pinwheel alignment) mode LCD.

Also, in the preferred embodiments described above, the source bus lines are supposed to run in the column direction (i.e., vertically on the display screen) and the gate bus lines are supposed to run in the row direction (i.e., horizontally on the display screen). However, the present invention is in no way limited to those specific preferred embodiments. For example, a liquid crystal display device, of which the display screen has been rotated 90 degrees, also falls within the scope of the present invention.

INDUSTRIAL APPLICABILITY

A liquid crystal display device and its driving method according to the present invention can be used effectively in an LCD TV set or any other device that should carry out a display operation of quality.

The invention claimed is:

1. A liquid crystal display device comprising:
a number of pixels that are arranged in columns and rows to form a matrix pattern, each said pixel including first and second subpixels that are able to exhibit mutually different luminances at least at a certain grayscale;
a plurality of source bus lines, each of which is connected with one of the columns of pixels;
a plurality of gate bus lines, each of which is connected with one of the rows of pixels;
a gate driver configured to supply gate signal voltages to the gate bus lines, respectively;
a source driver configured to supply source signal voltages to the source bus lines, respectively;
a controller;
a plurality of thin film transistors (TFTs), each of which is connected with one of the first and second subpixels of a connected one of the pixels; and
a plurality of storage capacitor (CS) bus lines, each of which is connected with either the respective first subpixels or the respective second subpixels of one of the rows of pixels, and
wherein each of the first and second subpixels includes a liquid crystal capacitor and a storage capacitor,
the liquid crystal capacitor of the first subpixel includes a first subpixel electrode and a counter electrode,
the liquid crystal capacitor of the second subpixel includes a second subpixel electrode and a counter electrode,
the counter electrode of the first liquid crystal capacitor and the counter electrode of the second liquid crystal capacitor are provided in common between the first subpixel and the second subpixel, and
a common voltage of the counter electrode does not substantially change its polarity within at least one vertical scanning period,
the CS bus lines connected to the respective storage capacitors of the first and second subpixels are electrically independent of each other,
the gate driver is configured to scan the pixels by supplying the gate signal voltages to the respective gate bus,
the controller is configured to supply a CS voltage to each said CS bus line such that each CS voltage has a waveform, of which the polarity changes at least once a vertical scanning period,
the gate driver is configured to supply the gate signal voltages such that each said vertical scanning period has multiple vertical scanning sub-periods including a first vertical scanning sub-period for sequentially scanning a series of odd or even rows of pixels and a second vertical scanning sub-period, which is continuous with the first vertical scanning sub-period, for sequentially scanning even or odd rows of pixels that have been skipped during the first vertical scanning sub-period,
the source driver is configured to supply the source signal voltages such that the polarity of the source signal voltage supplied to each said source bus line changes in a sequence which includes two vertical scanning periods or sub-periods, each of the two vertical scanning periods or sub-periods being defined by an opposite polarity of the source signal voltage, and
the controller is configured to supply the CS voltages such that the CS voltage to each CS bus line has a waveform that alternately performs the function of increasing or decreasing the effective voltage of one of two subpixels, which is connected with a CS bus line supplied with the CS voltage, in each of pixels that are connected to a jth gate bus line to be selected during the first vertical scanning sub-period, and the function of increasing or decreasing the effective voltage of one of two subpixels, which is connected with a CS bus line supplied with the CS voltage, in each of pixels that are connected to a (j+1)th gate bus line to be selected during the second vertical scanning sub-period, wherein the source driver is configured to supply the source signal voltages such that the sequence of the source signal voltage to each source bus line includes a series of two vertical scanning periods in which the source signal voltage has mutually opposite polarities, the source signal voltage keeping the same polarity through the first and second vertical scanning sub-periods of the same vertical scanning period, and
wherein the controller is configured to supply the CS voltages such that the CS voltage to each CS bus line inverts its polarity an odd number of times since a gate signal voltage supplied to the jth gate bus line has changed from high into low during the first vertical scanning sub-period and until a gate signal voltage supplied to the (j+1)th gate bus line changes from high into low during the second vertical scanning sub-period.

2. A liquid crystal display device comprising:
a number of pixels that are arranged in columns and rows to form a matrix pattern, each said pixel including first and second subpixels that are able to exhibit mutually different luminances at least at a certain grayscale;
a plurality of source bus lines, each of which is connected with one of the columns of pixels;
a plurality of gate bus lines, each of which is connected with one of the rows of pixels;
a gate driver configured to supply gate signal voltages to the gate bus lines, respectively;
a source driver configured to supply source signal voltages to the source bus lines, respectively;
a controller;
a plurality of thin film transistors (TFTs), each of which is connected with one of the first and second subpixels of a connected one of the pixels; and
a plurality of storage capacitor (CS) bus lines, each of which is connected with either the respective first subpixels or the respective second subpixels of one of the rows of pixels, and
wherein each of the first and second subpixels includes a liquid crystal capacitor and a storage capacitor,
the liquid crystal capacitor of the first subpixel includes a first subpixel electrode and a counter electrode,
the liquid crystal capacitor of the second subpixel includes a second subpixel electrode and a counter electrode,
the counter electrode of the first liquid crystal capacitor and the counter electrode of the second liquid crystal capacitor are provided in common between the first subpixel and the second subpixel, and
a common voltage of the counter electrode does not substantially change its polarity within at least one vertical scanning period, the CS bus lines connected to the respective storage capacitors of the first and second subpixels are electrically independent of each other, the gate driver is configured to scan the pixels by supplying the gate signal voltages to the respective gate bus, the controller is configured to supply a CS voltage to each said CS bus line such that each CS voltage has a waveform, of which the polarity changes at least once a vertical scanning period, the gate driver is configured to supply the gate signal voltages such that each said vertical scanning period has multiple vertical scanning sub-periods including a first vertical scanning sub-period for sequentially scanning a series of odd or even rows of pixels and a second vertical scanning sub-period, which is continuous with the first vertical scanning sub-period, for sequentially scanning even or odd rows of pixels that have been skipped during the first vertical scanning sub-period, the source driver is configured to supply the source signal voltages such that the polarity of the source signal voltage supplied to each said source bus line changes in a sequence which includes two vertical scanning periods or sub-periods, each of the two vertical scanning periods or sub-periods being defined by an opposite polarity of the source signal voltage, and the controller is configured to supply the CS voltages such that the CS voltage to each CS bus line has a waveform that alternately performs the function of increasing or decreasing the effective voltage of one of two subpixels, which is connected with a CS bus line supplied with the CS voltage, in each of pixels that are connected to a jth gate bus line to be selected during the first vertical scanning sub-period, and the function of increasing or decreasing the effective voltage of one of two subpixels, which is connected with a CS bus line supplied with the CS voltage, in each of pixels that are connected to a (j+1)th gate bus line to be selected during the second vertical scanning sub-period, wherein the source driver is configured to supply the source signal voltages such that the sequence of the source signal voltage to each source bus line includes a series of two vertical scanning sub-periods in which the source signal voltage has mutually opposite polarities, the source signal voltage having mutually opposite polarities in the first and second vertical scanning sub-periods of the same vertical scanning period, and wherein the controller is configured to supply the CS voltages such that the CS voltage to each CS bus line inverts its polarity an even number of times since a gate signal voltage supplied to the jth gate bus line has changed from high into low during the first vertical scanning sub-period and until a gate signal voltage supplied to the (j+1)th gate bus line changes from high into low during the second vertical scanning sub-period.

3. The liquid crystal display device of claim 2, wherein the controller is configured to supply the CS voltages such that the CS voltage to each CS bus line inverts its polarity an even number of times, which is at least twice, since the gate signal voltage supplied to the jth gate bus line has changed from high into low during the first vertical scanning sub-period and until the gate signal voltage supplied to the (j+1)th gate bus line changes from high into low during the second vertical scanning sub-period, and wherein once a voltage has been applied to the (j+1)th row of pixels, the CS voltage level stays at the center level thereof.

4. The liquid crystal display device of claim 2, wherein the gate driver is configured to supply the gate signal voltages such that every odd or even row of pixels are scanned during the first vertical scanning sub-period and the rest of the odd or even rows of pixels that have not been scanned yet are scanned during the second vertical scanning sub-period.

5. The liquid crystal display device of claim 2, wherein the CS bus lines include at least one CS bus line that is connected in common with two subpixels that belong to two different pixels and that are adjacent to each other in the column direction.

6. The liquid crystal display device of claim 2, wherein the controller is configured to supply the CS voltages such that the CS voltage to each CS bus line has a waveform, a part of which oscillates in a period that is a positive integral number of times as long as one horizontal scanning period, and wherein the gate driver is configured to supply the gate signal voltages such that each said vertical scanning sub-period is a period for scanning a series of Nsv ($=\alpha/2$) odd or even rows of pixels, a being a positive integral and a multiple of M, and wherein if one period of the CS voltage is represented by M×H where H is one horizontal scanning period and M is a positive integer, Nsv is a positive integral number of times as large as M/2.

7. The liquid crystal display device of claim 6, wherein the gate driver is configured to supply the gate signal voltages such that each said vertical scanning period includes not only the first and second vertical scanning sub-periods but also third and fourth vertical scanning sub-periods that are continuous with the second and third vertical scanning sub-periods, respectively, and wherein the third vertical scanning sub-period is a period for sequentially scanning a series of Nsv odd or even rows of pixels, beginning with an odd or even row continuously with the last odd or even row that has been scanned during the second vertical scanning sub-period, while the fourth vertical scanning sub-period is a period for sequentially scanning even or odd rows of pixels that have been skipped during the third vertical scanning sub-period, and wherein the sequence includes a sequence in which the source signal voltage has different polarities between the first and second vertical scanning sub-periods, the same polarity between the second and third vertical scanning sub-periods, and different polarities again between the third and fourth vertical scanning sub-periods.

8. The liquid crystal display device of claim 6, wherein the CS bus lines include at least one CS bus line that is connected in common with two subpixels that belong to two different pixels and that are adjacent to each other in the column direction, and wherein the controller is configured to supply the CS voltages such that if one period of the CS voltage to each CS bus line is represented by M×H where H is one horizontal scanning period and M is a positive integer, Nsv is a positive integral number of times as large as M.

9. The liquid crystal display device of claim 6, wherein Nsv×H (where H is one horizontal scanning period) is equal to or shorter than 1.2 ms.

10. The liquid crystal display device of claim 6, wherein the gate driver is configured to supply the gate signal voltages the number of horizontal scanning periods included in one vertical scanning period is Nv-total and (Nsv/Nv-total)×one vertical scanning period is equal to or shorter than 1.2 ms.

11. The liquid crystal display device of claim 6, wherein the gate driver is configured to supply the gate signal voltages such that if the number of horizontal scanning periods included in one effective display period is Nv-Disp, then Nv-Disp is an integral number of times as large as Nsv×2.

12. The liquid crystal display device of claim 2, wherein the source driver is configured to supply the source signal voltages such that in an arbitrary vertical scanning period, source signal voltages supplied to two source bus lines that are connected with mutually adjacent columns of pixels have opposite polarities.

13. The liquid crystal display device of claim 2, wherein one vertical scanning sub-period is equal or shorter than $\frac{1}{120}$ second.

14. A TV receiver comprising:
   the liquid crystal display device of claim 2; and
   a tuner, which receives a TV broadcast and outputs a video signal to the liquid crystal display device.

* * * * *